US008803420B2

(12) United States Patent
Kawamura et al.

(10) Patent No.: US 8,803,420 B2
(45) Date of Patent: Aug. 12, 2014

(54) ORGANIC ELECTROLUMINESCENCE DEVICE

(75) Inventors: Yuichiro Kawamura, Sodegaura (JP); Masahiro Kawamura, Sodegaura (JP); Hitoshi Kuma, Sodegaura (JP); Hirokatsu Ito, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 107 days.

(21) Appl. No.: 13/388,389

(22) PCT Filed: Jan. 14, 2011

(86) PCT No.: PCT/JP2011/000174
§ 371 (c)(1),
(2), (4) Date: Feb. 1, 2012

(87) PCT Pub. No.: WO2011/086941
PCT Pub. Date: Jul. 21, 2011

(65) Prior Publication Data
US 2012/0153268 A1   Jun. 21, 2012

(30) Foreign Application Priority Data

Jan. 15, 2010 (JP) .................................. 2010-007483
Jan. 25, 2010 (JP) .................................. 2010-013369

(51) Int. Cl.
*H01L 51/54* (2006.01)
(52) U.S. Cl.
USPC ........... 313/506; 313/504; 428/690; 428/917; 257/40
(58) Field of Classification Search
None
See application file for complete search history.

(56) References Cited

U.S. PATENT DOCUMENTS

| 6,010,796 | A | 1/2000 | Kijima |
| 6,097,147 | A | 8/2000 | Baldo et al. |
| 6,660,411 | B2 | 12/2003 | Sato et al. |
| 6,830,828 | B2 | 12/2004 | Thompson et al. |
| 6,902,830 | B2 | 6/2005 | Thompson et al. |
| 7,001,536 | B2 | 2/2006 | Thompson et al. |

(Continued)

FOREIGN PATENT DOCUMENTS

| EP | 2434559 A1 | 3/2012 |
| JP | 10-79297 | 3/1998 |

(Continued)

OTHER PUBLICATIONS

International Search Report issued Mar. 22, 2011 in Application No. PCT/JP2011/000174.

(Continued)

*Primary Examiner* — Marie R. Yamnitzky
(74) *Attorney, Agent, or Firm* — Oblon, Spivak, McClelland, Maier & Neustadt, L.L.P.

(57) ABSTRACT

An organic electroluminescence device includes an anode, an emitting layer, an electron-transporting region, and a cathode, the anode, the emitting layer, the electron-transporting region, and the cathode being stacked in this order, the emitting layer including a host material, and a dopant material that emits fluorescence having a main peak wavelength of 550 nm or less, the electron-transporting region including a barrier layer that is adjacent to the emitting layer, and the barrier layer including a barrier material that includes an electron-transporting structural part, and a triplet barrier structural part that includes a fused polycyclic aromatic hydrocarbon compound, and satisfies the relationship "$E^T_b > E^T_h$" (where, $E^T_h$ is the triplet energy of the host material, and $E^T_b$ is the triplet energy of the barrier material).

16 Claims, 5 Drawing Sheets

(56) References Cited

U.S. PATENT DOCUMENTS

| | | | |
|---|---|---|---|
| 7,018,723 | B2 | 3/2006 | Thompson et al. |
| 7,034,454 | B2 | 4/2006 | Kawai et al. |
| 7,291,406 | B2 | 11/2007 | Thompson et al. |
| 7,537,844 | B2 | 5/2009 | Thompson et al. |
| 7,851,071 | B2 | 12/2010 | Yamamoto et al. |
| 7,883,787 | B2 | 2/2011 | Thompson et al. |
| 8,476,823 | B2 * | 7/2013 | Kuma et al. .................. 313/504 |
| 2006/0158102 | A1 | 7/2006 | Kawamura et al. |
| 2007/0087220 | A1 | 4/2007 | Alvarado et al. |
| 2007/0087222 | A1 | 4/2007 | Kim et al. |
| 2008/0103279 | A1 | 5/2008 | Heun et al. |
| 2009/0174313 | A1 | 7/2009 | Nishimura et al. |
| 2009/0191427 | A1 | 7/2009 | Liao et al. |
| 2010/0193773 | A1 | 8/2010 | Yamamoto et al. |
| 2010/0295027 | A1 | 11/2010 | Kawamura et al. |
| 2010/0295444 | A1 | 11/2010 | Kuma et al. |
| 2010/0295445 | A1 | 11/2010 | Kuma et al. |
| 2010/0301318 | A1 | 12/2010 | Kuma et al. |
| 2010/0301319 | A1 | 12/2010 | Kuma et al. |
| 2010/0314644 | A1 | 12/2010 | Nishimura et al. |
| 2011/0049483 | A1 | 3/2011 | Nishimura et al. |
| 2011/0112296 | A1 | 5/2011 | Thompson et al. |
| 2011/0285280 | A1 | 11/2011 | Thompson et al. |
| 2012/0126205 | A1 * | 5/2012 | Kawamura et al. ............. 257/40 |
| 2012/0126208 | A1 * | 5/2012 | Kawamura et al. ............. 257/40 |
| 2012/0126209 | A1 * | 5/2012 | Kawamura et al. ............. 257/40 |
| 2013/0270539 | A1 * | 10/2013 | KUMA et al. ................. 257/40 |

FOREIGN PATENT DOCUMENTS

| | | |
|---|---|---|
| JP | 2001-357972 | 12/2001 |
| JP | 2002-100478 | 4/2002 |
| JP | 2002-525808 | 8/2002 |
| JP | 2004-214180 | 7/2004 |
| JP | 2005-353288 | 12/2005 |
| JP | 2007-59903 | 3/2007 |
| JP | 2007-180277 | 7/2007 |
| JP | 2008-506798 | 3/2008 |
| KR | 10-2007-0091280 | 9/2007 |
| WO | WO 2004/080975 A1 | 9/2004 |
| WO | WO 2010/134350 A1 | 11/2010 |

OTHER PUBLICATIONS

Chimed Ganzorig, et al., "A possible mechanism for enhanced electrofluorescence emission through triplet-triplet annihilation in organic electroluminescent devices", Applied Physics Letters, vol. 81, No. 17, Oct. 21, 2002, pp. 3137-3139.

D. Y. Kondakov, "Characterization of triplet-triplet annihilation in organic light-emitting diodes based on anthracene derivatives", Journal of Applied Physics, vol. 102, 2007, pp. 114504-1 to 114504-5.

D. Y. Kondakov, et al., "Triplet annihilation exceeding spin statistical limit in highly efficient fluorescent organic light-emitting diodes", Journal of Applied Physics, vol. 106, 2009, pp. 124510-1 to 124510-7.

Bernhard Nickel, et al., "Delayed Fluorescence from the Lowest $^1B^+_{3u}$ State of Anthracene, due to Hetero-Triplet-Triplet Annihilation of $^3$Anthracene* and $^3$Xanthone*", Chemical Physics, vol. 66, No. 3, 1982, pp. 365-376.

Shizuo Tokito, "Yuki El Device no Ko Koritsuka" (Improvement of emission efficiency in organic light-emitting devices), The Chemical Times, No. 2 (whole No. 216), Apr. 1, 2010, 8 pages.

Masakazu Funahashi, et al., "Highly Efficient Fluorescent Deep Blue Dopant for 'Super Top Emission' Device", Society for Information Display 2008 International Symposium Digest of Technical Papers, vol. XXXIX, Book II, 2008, pp. 709-711.

Supplementary European Search Report issued Aug. 29, 2013 in patent application No. 11732813.8-1555/2525425.

* cited by examiner

ORGANIC ELECTROLUMINESCENCE DEVICE

TECHNICAL FIELD

The invention relates to an organic electroluminescence (EL) device, particularly, to a highly efficient organic EL device.

BACKGROUND ART

When a voltage is applied to an organic EL device, holes are injected from an anode, and electrons are injected from a cathode, and holes and electrons recombine in an emitting layer to form excitons. According to the electron spin statistics theory, singlet excitons and triplet excitons are formed at an amount ratio of 25%:75%. In a fluorescent EL device which uses emission caused by singlet excitons, the limited value of the internal quantum efficiency is believed to be 25%. Technology for prolonging the lifetime of a fluorescent EL device utilizing a fluorescent material has been recently improved. This technology is being applied to a full-color display of portable phones, TVs, or the like. However, a fluorescent EL device is required to be improved in efficiency.

In association with the technology of improving the efficiency of a fluorescent EL device, several technologies are disclosed in which emission is obtained from triplet excitons, which have heretofore been not utilized effectively. For example, in Non-Patent Document 1, a non-doped device in which an anthracene-based compound is used as a host material is analyzed. A mechanism is found that singlet excitons are formed by collision and fusion of two triplet excitons, whereby fluorescent emission is increased. However, Non-Patent Document 1 discloses only that fluorescent emission is increased by collision and fusion of triplet excitons in a non-doped device in which only a host material is used. In this technology, an increase in efficiency by triplet excitons is as low as 3 to 6%.

Non-Patent Document 2 reports that a blue fluorescent device exhibits an internal quantum efficiency of 28.5%, which exceeds 25%, which is the conventional theoretical limit value. However, no technical means for attaining an efficiency exceeding 25% is disclosed. In respect of putting a full-color organic EL TV into practical use, a further increase in efficiency has been required.

In Patent Document 1, another example is disclosed in which triplet excitons are used in a fluorescent device. In normal organic molecules, the lowest excited triplet state (T1) is lower than the lowest excited singlet state (S1). However, in some organic molecules, the triplet excited state (T2), is higher than S1. In such a case, it is believed that due to the occurrence of transition from T2 to S1, emission from the singlet excited state can be obtained. However, actually, the external quantum efficiency is about 6% (the internal quantum efficiency is 24% when the outcoupling efficiency is taken as 25%), which does not exceed the value of 25% which has conventionally been believed to be the limit value. The mechanism disclosed in this document is that emission is obtained due to the intersystem crossing from the triplet excited state to the singlet excited state in a single molecule. Generation of singlet excitons by collision of two triplet excitons as disclosed in Non-Patent Document 1 is not occurred in this mechanism.

Patent Documents 2 and 3 each disclose a technology in which a phenanthroline derivative such as BCP (bathocuproin) and BPhen is used in a hole-blocking layer in a fluorescent device to increase the density of holes at the interface between a hole-blocking layer and an emitting layer, enabling recombination to occur efficiently. However, a phenanthroline derivative such as BCP (bathocuproin) and BPhen is vulnerable to holes and poor in resistance to oxidation, and the performance thereof is insufficient in respect of prolonging the lifetime of a device.

Moreover, since the hole barrier layer is provided between the emitting layer and the electron-transporting layer, the number of layers of the stacked structure of the organic EL device increases. An increase in the number of layers of the stacked structure may complicate the production process of the organic EL device, or may result in an increase in drive voltage.

In Patent Document 4, a fluorescent device is disclosed in which an aromatic compound such as an anthracene derivative is used as a material for an electron-transporting layer which is in contact with an emitting layer. However, this is a device which is designed based on the mechanism that generated singlet excitons emit fluorescence within a short period of time. Therefore, no consideration is made on the relationship with the triplet energy of an electron-transporting layer which is normally designed in a phosphorescent device. Actually, since the triplet energy of an electron-transporting layer is smaller than the triplet energy of an emitting layer, triplet excitons generated in an emitting layer are diffused to an electron-transporting layer, and then, thermally deactivated. Therefore, it is difficult to exceed the theoretical limit value of 25% of the conventional fluorescent device.

On the other hand, a phosphorescent device directly utilizes emission from triplet excitons. Since the singlet exciton energy is converted to triplet excitons by the spin conversion within an emitting molecule, it is expected that an internal quantum efficiency of nearly 100% can be attained, in principle. For the above-mentioned reason, since a phosphorescent device using an Ir complex was reported by Forrest et al. in 2000, a phosphorescent device has attracted attention as a technology of improving efficiency of an organic EL device. Although a red phosphorescent device has reached the level of practical use, green and blue phosphorescent devices have a lifetime shorter than that of a fluorescent device. In particular, as for a blue phosphorescent device, there still remains a problem that not only lifetime is short but also color purity or luminous efficiency is insufficient. For these reasons, phosphorescent devices have not yet been put into practical use.

RELATED-ART DOCUMENT

Patent Document

Patent Document 1: JP-A-2004-214180
Patent Document 2: JP-A-H10-79297
Patent Document 3: JP-A-2002-100478
Patent Document 4: WO2004/080975
Patent Document 5: JP-T-2002-525808
Patent Document 6: U.S. Pat. No. 7,018,723

Non-Patent Document

Non-patent Document 1: Journal of Applied Physics, 102, 114504 (2007)
Non-patent Document 2: SID 2008 DIGEST, 709 (2008)

SUMMARY OF THE INVENTION

The inventors of the invention focused on the phenomenon (i.e., singlet excitons are formed due to collision and fusion between two triplet excitons (hereinafter referred to as Triplet-Triplet Fusion (TTF) phenomenon) disclosed in Non-Patent Document 1, and conducted studies in order to improve the efficiency of a fluorescent device by causing the TTF phenomenon to efficiently occur. Specifically, the inventors conducted studies on a combination of a host material and a fluorescent dopant material that may be used for a fluorescent device, and found that triplet excitons are confined within the emitting layer, and the TTF phenomenon efficiently occurs when the triplet energy of the host material and the triplet energy of the dopant material satisfy a specific relationship, and a material having a large triplet energy is used as a material for a layer that is adjacent to the cathode-side interface of the emitting layer. It was found that an improvement in the efficiency and the lifetime of a fluorescent device can thus be implemented.

The inventors found that a highly efficient organic EL device that has a long lifetime can be implemented without increasing the number of layers of the stacked structure of the organic EL device by thus confining triplet excitons within the emitting layer so that the TTF phenomenon efficiently occurs.

The invention provides the following organic EL device.
1. An Organic Electroluminescence Device Including:
an anode, an emitting layer, an electron-transporting region, and a cathode, sequentially,
the emitting layer including a host material, and a dopant material that emits fluorescence having a main peak wavelength of 550 nm or less,
the electron-transporting region including a barrier layer that is adjacent to the emitting layer, and
the barrier layer including a barrier material that includes an electron-transporting structural part, and a triplet barrier structural part that includes a fused polycyclic aromatic hydrocarbon compound, and satisfies the following expression (1), $$E^T_b > E^T_h \qquad (1)$$

where, $E^T_h$ is the triplet energy of the host material, and $E^T_b$ is the triplet energy of the barrier material.
2. The organic electroluminescence device according to 1, wherein the host material and the dopant material satisfy the following expression (2), $$E^T_d > E^T_h \qquad (2)$$

where, $E^T_d$ is the triplet energy of the dopant material.
3. The organic electroluminescence device according to 1 or 2, wherein an affinity $Af_h$ of the host material and an affinity $Af_b$ of the barrier material satisfy the following expression (3), $$Af_h - Af_b > 0 \text{ eV} \qquad (3).$$

4. The organic electroluminescence device according to any one of 1 to 3, wherein an ionization potential $Ip_h$ of the host material and an ionization potential $Ip_d$ of the dopant material satisfy the following expression (4), $$Ip_d - Ip_h < 0.2 \text{ eV} \qquad (4).$$

5. The organic electroluminescence device according to any one of 1 to 4, wherein the barrier material has an electron mobility of $10^{-6}$ cm$^2$/Vs or more.
6. The organic electroluminescence device according to any one of 1 to 5, wherein the barrier layer includes a donor that can reduce the barrier material.
7. The organic electroluminescence device according to any one of 1 to 6, wherein luminous intensity due to singlet excitons that are formed due to collision between triplet excitons within the emitting layer accounts for 30% or more of total luminous intensity.

8. The organic electroluminescence device according to any one of 1 to 7, wherein the electron-transporting structural part includes one or more partial structures shown by the following formula,

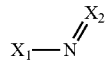

wherein $X_1$ and $X_2$ independently represent a carbon atom or a nitrogen atom.

9. The organic electroluminescence device according to any one of 1 to 7, wherein the electron-transporting structural part includes one or more rings selected from rings shown by the following formulas,

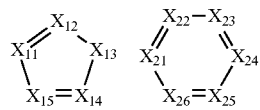

wherein $X_{11}$ to $X_{15}$ and $X_{21}$ to $X_{26}$ independently represent a carbon atom or a nitrogen atom, provided that at least one of $X_{11}$ to $X_{15}$ and at least one of $X_{21}$ to $X_{26}$ represent a nitrogen atom.

10. The organic electroluminescence device according to any one of 1 to 7, wherein the electron-transporting structural part includes one or more rings selected from rings shown by the following formulas,

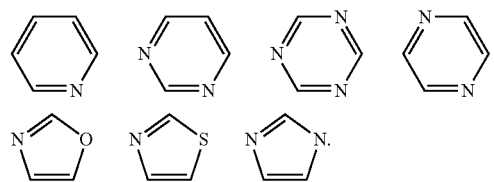

11. The organic electroluminescence device according to any one of 1 to 7, wherein the electron-transporting structural part includes one or more rings selected from rings shown by the following formulas,

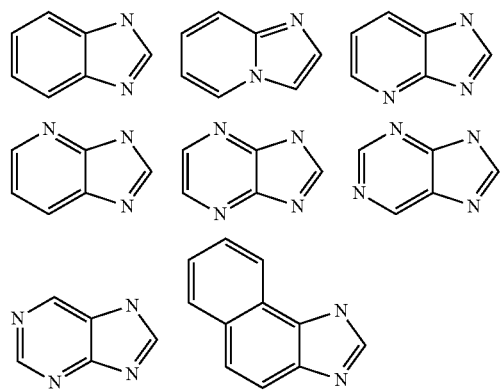

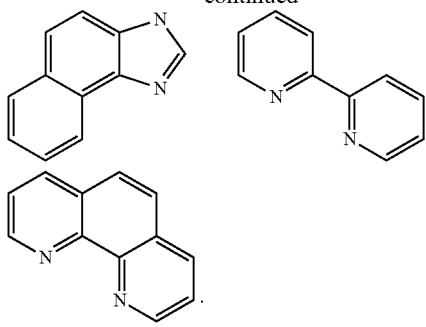
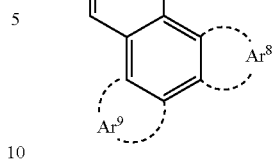

12. The organic electroluminescence device according to any one of 1 to 11, wherein the triplet barrier structural part is selected from rings shown by the following formulas, (1)
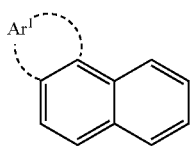

(2)
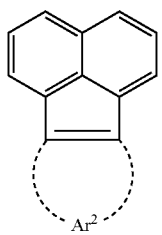

(3)
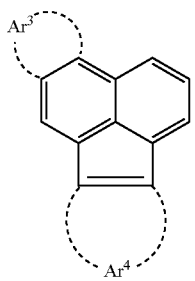

(4)
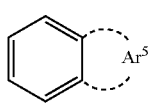

(5)
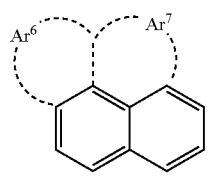

(6)

[structure with Ar$^8$ and Ar$^9$]

wherein Ar$^1$ to Ar$^9$ represent a fused ring structure having 4 to 16 carbon atoms that form a ring (hereinafter referred to as "ring carbon atoms").

13. The organic electroluminescence device according to any one of 1 to 12, including at least two emitting layers between the anode and the cathode, and further including a carrier-generating layer between two emitting layers among the at least two emitting layers.

14. An organic electroluminescence device including:
an anode, a plurality of emitting layers, an electron-transporting region, and a cathode, sequentially,
the organic electroluminescence device further including a carrier barrier layer between two emitting layers among the plurality of emitting layers,
an emitting layer among the plurality of emitting layers that is adjacent to the electron-transporting region including a host material, and a dopant material that emits fluorescence having a main peak wavelength of 550 nm or less,
the electron-transporting region including a barrier layer that is adjacent to the emitting layer, and
the barrier layer including a barrier material that includes an electron-transporting structural part, and a triplet barrier structural part that includes a fused polycyclic aromatic hydrocarbon compound, and satisfies the following expression (1), $$E^T_b > E^T_h \tag{1}$$

where, $E^T_h$ is the triplet energy of the host material, and $E^T_b$ is the triplet energy of the barrier material.

15. The organic electroluminescence device according to 14, wherein the host material and the dopant material satisfy the following expression (2), $$E^T_d > E^T_h \tag{2}$$

where, $E^T_d$ is the triplet energy of the dopant material.

The invention can realize a highly efficient device which can, by efficiently inducing the TTF phenomenon within an emitting layer, exhibit an internal quantum efficiency which largely exceeds 25%, which is believed to be the limit value of conventional fluorescent devices.

MODE FOR CARRYING OUT THE INVENTION

First Embodiment

The invention utilizes the TTF phenomenon. First, an explanation is made of the TTF phenomenon.

Holes and electrons injected from an anode and a cathode are recombined with in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with each other with an increase in the density thereof, whereby a reaction shown by the following formula occurs. In the formula, $^1A$ represents the ground state and $^1A^*$ represents the lowest excited singlet excitons.

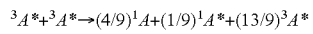

That is, $5\,^3A^* \rightarrow 4\,^1A + ^1A^*$, and it is expected that, among 75% of triplet excitons initially generated, one fifth thereof, that is, 20%, is changed to singlet excitons. Therefore, the amount of singlet excitons which contribute to emission is 40%, which is a value obtained by adding 15% ((75%×(1/5)= 15%) to 25%, which is the amount ratio of initially generated singlet excitons. At this time, the ratio of luminous intensity derived from TTF (TTF ratio) relative to the total luminous intensity is 15/40, that is, 37.5%. Assuming that singlet excitons are generated by collision of 75% of initially-generated triplet excitons (that is, one siglet exciton is generated from two triplet excitons), a significantly high internal quantum efficiency of 62.5% is obtained which is a value obtained by adding 37.5% ((75%×(1/2)=37.5%) to 25%, which is the amount ratio of initially generated singlet excitons. At this time, the TTF ratio is 60% (37.5/62.5).

Figure 1:
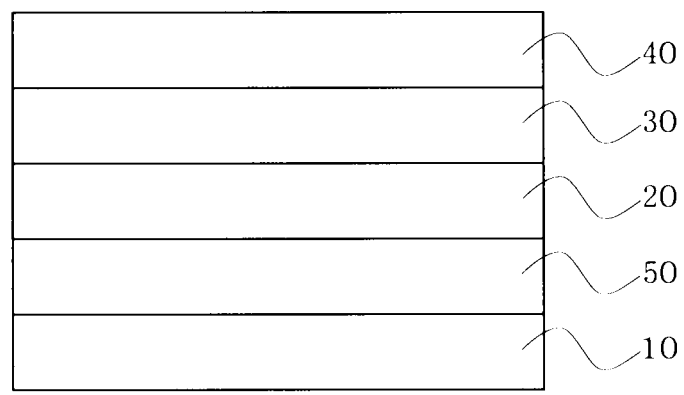
FIG. 1 is a view showing an example of an organic EL device according to a first embodiment.
Figure 2A:
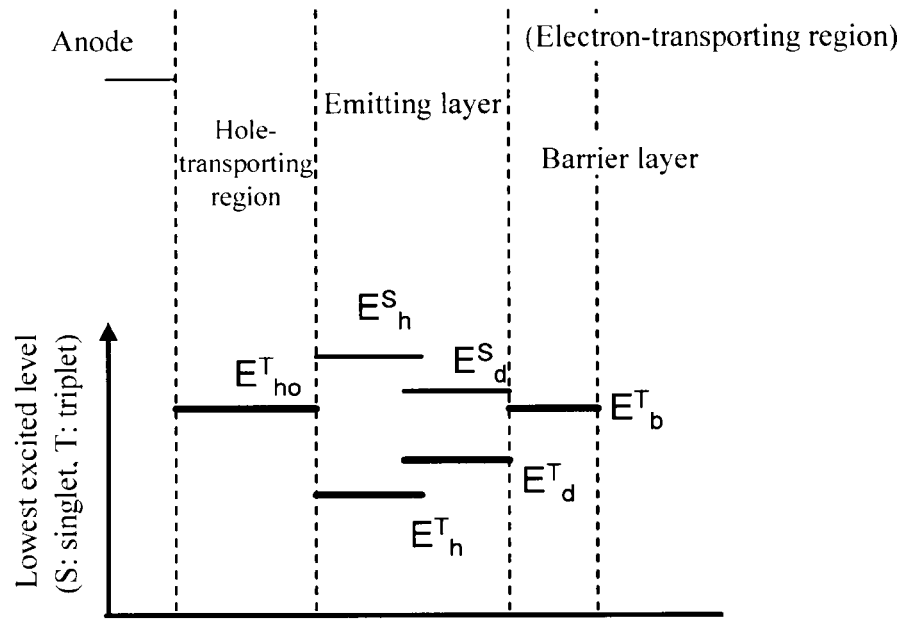
FIG. 2A is a view showing the relationship between the energy gaps of respective layers.

FIG. 1 is a schematic view of an organic EL device showing one example of the first embodiment of the invention. FIG. 2A diagrammatically shows the lowest excited singlet energy level and the lowest excited triplet energy level. In the invention, the triplet energy is referred to as a difference between energy in the lowest triplet exited state and energy in the ground state. The singlet energy (often referred to as an energy gap) is referred to as a difference between energy in the lowest singlet excited state and energy in the ground state. In the organic EL device shown in FIG. 1, a hole-transporting region 50, an emitting layer 20, an electron-transporting region 30 and a cathode 40 are stacked in sequential order from an anode 10. It is preferred that a hole-transporting region 50 be provided between an anode 10 and an emitting layer 20. FIG. 2A shows an example in which the electron-transporting region includes only a barrier layer. Note that in the embodiment having only the barrier layer the electron-transporting region may also include an electron-injecting layer that has a higher electron injection capability. The electron-injecting layer may be formed using a compound that has been generally used to form the electron-injecting layer. It is preferable to form the electron-injecting layer using a heteroring-containing compound. The simple term "blocking layer" in the invention means a layer having a triplet energy blocking function different from the function of a hole-blocking layer or a carrier-blocking layer.

Figure 2B:
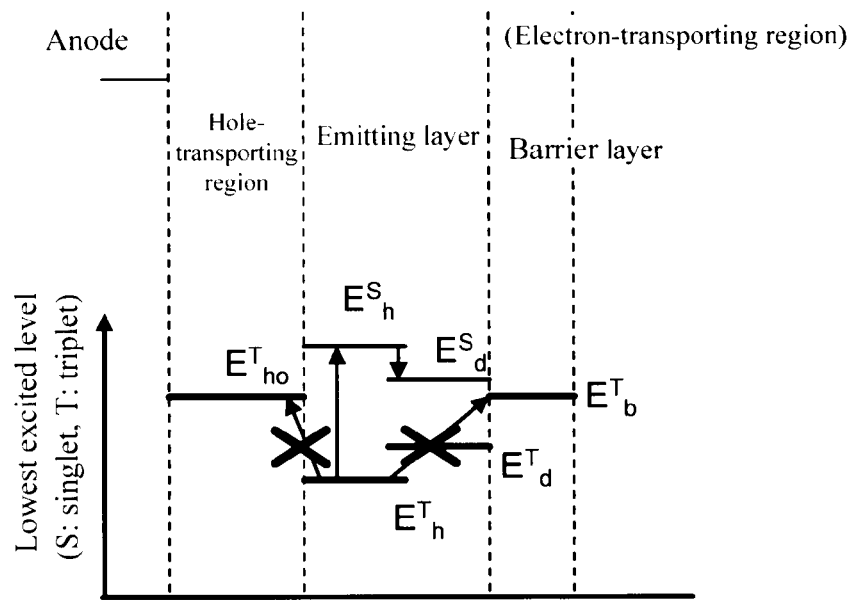
FIG. 2B is a view showing an effect based on the relationship between the energy gaps of respective layers.

The emitting layer is formed of a host material and a dopant material which gives fluorescent emission of which the main peak wavelength is 550 nm or less (hereinafter often referred to as a fluorescent dopant material having a main peak wavelength of 550 nm or less). (The main peak wavelength in the invention means the peak wavelength of the emission spectrum of which the emission intensity becomes maximum in an emission spectrum measured in a toluene solution with a concentration of $10^{-5}$ to $10^{-6}$ mol/l) The main peak wavelength of 550 nm almost corresponds to green emission. In this wavelength region, improvement in luminous efficiency of a fluorescent device utilizing a TTF phenomenon is expected. In a fluorescent emitting device giving a blue emission of 480 nm or less, a further improvement in luminous efficiency can be expected. For a red emission with a wavelength of 550 nm or higher, since a phosphorescent emitting device with a high internal quantum efficiency has already been on the practically-usable level, no improvement in luminous efficiency is desired for a fluorescent emitting device. In FIG. 2A, holes injected from an anode are then injected to an emitting layer through a hole-transporting region. Electrons injected from a cathode are then injected to an emitting layer through an electron-transporting region. Thereafter, holes and electrons are recombined in an emitting layer, whereby singlet excitons and triplet excitons are generated. There are two manners as for the occurrence of recombination. Specifically, recombination may occur either on host material molecules or on dopant material molecules. In this embodiment, as shown in FIG. 2A, if the triplet energy of a host material and that of a dopant material are taken as $E^T_h$ and $E^T_d$, respectively, the relationship $E^T_h < E^T_d$ is satisfied. When this relationship is satisfied, triplet excitons generated by recombination on a host material do not transfer to a dopant material which has higher triplet energy as shown in FIG. 2B. Triplet excitons generated by recombination on dopant material molecules quickly energy-transfer to host material molecules. That is, triplet excitons on a host material do not transfer to a dopant material and collide with each other efficiently on the host material to generate singlet excitons by the TTF phenomenon. Further, since the singlet energy $E^s_d$ of a dopant material is smaller than the singlet energy $E^s_h$ of a host material, singlet excitons generated by the TTF phenomenon energy-transfer from a host material to a dopant material, thereby contributing fluorescent emission of a dopant material. In dopant materials which are usually used in a fluorescent device, transition from the excited triplet state to the ground state should be inhibited. In such a transition, triplet excitons are not optically energy-deactivated, but are thermally energy-deactivated. By causing the triplet energy of a host material and the triplet energy of a dopant material to satisfy the above-mentioned relationship, singlet excitons are generated efficiently due to the collision of triplet excitons before they are thermally deactivated, whereby luminous efficiency is improved.

In the invention, the electron-transporting region has a blocking layer in an area adjacent to the emitting layer. As mentioned later, the blocking layer serves to prevent diffusion of triplet excitons generated in the emitting layer to the electron-transporting region, allow triplet excitons to be confined within the emitting layer to increase the density of triplet excitons therein, causing the TTF phenomenon to occur efficiently. In order to suppress triplet excitons from being diffused, as shown in FIGS. 2A and 2B, it is preferred that the triplet energy of the blocking layer $E^T_b$ be larger than $E^T_h$. It is further preferred that $E^T_b$ be larger than $E^T_d$. Since the blocking layer prevents triplet excitons from being diffused to the electron-transporting region, in the emitting layer, triplet excitons of a host material become singlet excitons efficiently, and the singlet excitons transfer to a dopant material, and are optically energy-deactivated.

The barrier layer includes a nitrogen-containing compound (e.g., benzimidazole compound) as a partial structure in order to improve the electron injection capability from the cathode or the like.

The conditions under which the TTF phenomenon efficiently occurs are described below while focusing on the relationship between the affinity and the ionization potential of the host material and the dopant material. The affinity of the host material and the affinity of the dopant material are hereinafter respectively referred to as $Af_h$ and $Af_d$, and the ionization potential of the host material and the ionization potential of the dopant material are hereinafter respectively referred to as $Ip_h$ and $Ip_d$.

Figure 3A:
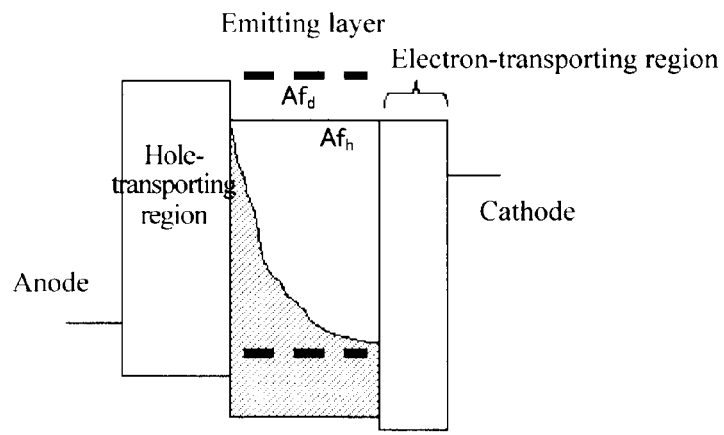
FIG. 3A is an energy band diagram when $Af_d - Af_h \leq -0.2$ eV.

(1) FIG. 3A is an energy band diagram when $Af_d-Af_h \leq -0.2$ eV. The dotted line drawn within the emitting layer indicates the energy level of the dopant material. When $Af_d-Af_h<0$ eV, the difference between the ionization potential $Ip_h$ of the host material and the ionization potential $Ip_d$ of the dopant material is small as compared with the difference between the affinity $Af_h$ of the host material and the affinity $Af_d$ of the dopant material (see FIG. 3A). This phenomenon occurs due to the difference in energy gap between the host material and the dopant material. Therefore, since $Ip_d-Ip_h \leq -0.2$ eV when $Af_d-Af_h \leq -0.2$ eV, the dopant material exhibits a significant hole-trapping capability. Regarding the hole-trapping probability distribution within the emitting layer, recombination is likely to occur at the interface between the emitting layer and the hole-transporting layer (see FIG. 3A). Specifically, recombination is likely to occur after holes are trapped by the dopant material, and electrons transfer from the host material to the dopant material. When the relationship "$E^T_h<E^T_d$" is satisfied, triplet excitons formed directly on the dopant material transfer to the host material via Dexter energy transfer, so that the TTF phenomenon efficiently occurs. Since the triplet energy of a hole-transporting material is normally large, a high triplet exciton confinement effect is obtained, so that the TTF phenomenon efficiently occurs within the emitting layer. Since the triplet energy $E^T_b$ of the barrier layer is set to be larger than the triplet energy $E^T_h$ of the host material, a situation in which triplet excitons present in an area adjacent to the barrier layer are diffused into the electron-transporting region is prevented, so that the TTF phenomenon efficiently occurs within the emitting layer.

Figure 3B:
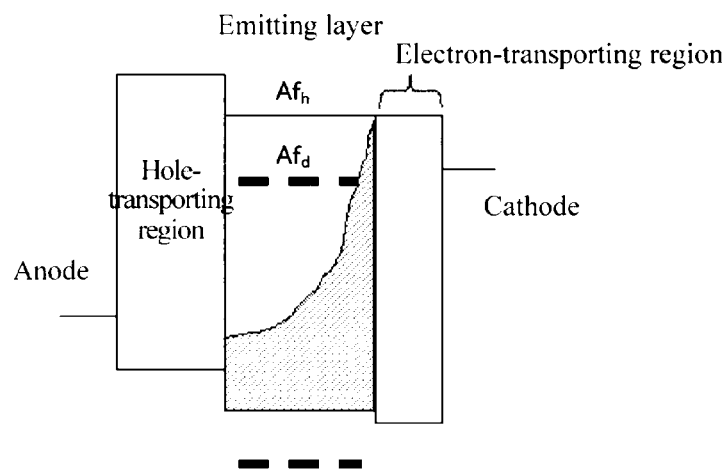
FIG. 3B is an energy band diagram when $IP_d - IP_h \geq 0.2$ eV.

(2) FIG. 3B is an energy band diagram when $IP_d-IP_h \geq 4.2$ eV. The dotted line drawn within the emitting layer indicates the energy level of the dopant material. When $IP_d-IP_h>0$ eV, the difference between the affinity $Af_h$ of the host material and the affinity $Af_d$ of the dopant material is large as compared with the difference between the ionization potential $Ip_h$ of the host material and the ionization potential $Ip_d$ of the dopant material (see FIG. 3B). This phenomenon occurs due to the difference in energy gap between the host material and the dopant material. Therefore, since $Af_d-Af_h>0.2$ eV when $Ip_d-Ip_h \geq 4.2$ eV, the dopant material exhibits a significant electron-trapping capability. Regarding the electron-trapping probability distribution within the emitting layer, recombination is likely to occur around the interface between the emitting layer and the barrier layer (see FIG. 3B). Therefore, triplet excitons are also likely to be formed around the interface between the emitting layer and the barrier layer. When $Ip_d-Ip_h \geq 0.2$ eV, it is considered that holes slowly transfer from the host material to the dopant material. This phenomenon occurs due to the HOMO level energy barrier between the host material and the dopant material. Therefore, the host material is kept in a radical cation state for a long time. Since radical cations of the host material cause triplet excitons to be quenched, quenching of the excited state easily occurs between triplet excitons on the host material and holes on the host material that have been injected from the anode at the interface between the emitting layer and the barrier layer at which the density of triplet excitons is high. Therefore, the TTF phenomenon may not efficiently occur when $Ip_d-Ip_h \geq 2$ eV depending on the relationship between the electron-hole recombination region and the hole-transporting capability of the host material, even if the barrier layer exhibits a high triplet exciton barrier capability. Therefore, it is preferable that $IP_d-IP_h<0.2$ eV.

Figure 3C:
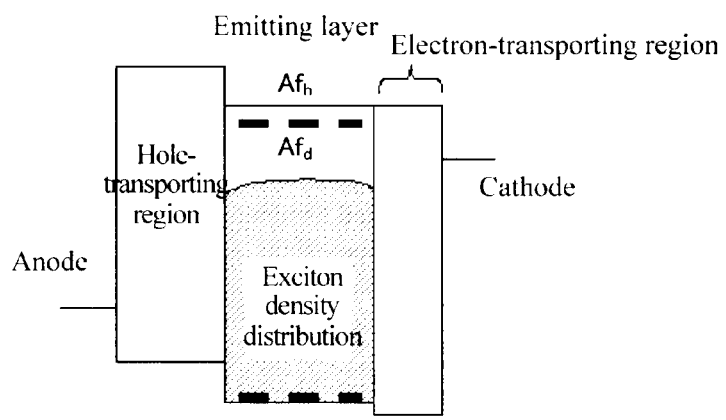
FIG. 3C is an energy band diagram when $Af_d - Af_h > -0.2$ eV and $IP_d - IP_h < 0.2$ eV.

(3) Finally, a case where $Af_d-Af_h>-0.2$ eV and $IP_d-IP_h<0.2$ eV, which is excluded from the cases (1) and (2), is discussed below. FIG. 3C is an energy band diagram when $Af_d-Af_h>-0.2$ eV and $IP_d-IP_h<0.2$ eV. The dotted line drawn within the emitting layer indicates the energy level of the dopant material. The condition wherein $Af_d-Af_h>-0.2$ eV is set since the LUMO level of an organic material generally broadens within a range higher than the found affinity level by about 0.2 eV. Likewise, the HOMO level of an organic material generally broadens within a range higher than the ionization potential by about 0.2 eV. When the host material and the dopant material have the relationship shown in FIG. 3C, the LUMO level of the dopant material is not included within the range of the LUMO level of the host material. Therefore, electrons that transfer within the emitting layer are rarely trapped by the dopant material (i.e., the dopant material rarely exhibits an electron-trapping capability). The dopant material also rarely exhibits a hole-trapping capability for the above reason.

The dopant material of this case does not exhibit significant trapping properties for both electrons and holes. In this case, as the slant-line portion of the emitting layer in FIG. 3C, electron-hole recombination occurs mainly on a host molecule in a broad range of the emitting layer, and 25% of singlet excitons and 75% of triplet excitons are formed mainly on a host molecule. The energy of singlet excitons which are generated on a host transfers to a dopant material by the Forster energy transfer, and contributes to fluorescence emission of dopant material molecules. The transfer direction of the energy of triplet excitons depends on the triplet energy relationship of a host material and a dopant material. If the relationship satisfies $E^T_h>E^T_d$, triplet excitons generated in a host transfer to a dopant material which exists in the vicinity by the Dexter energy transfer. In a fluorescent device, the concentration of a dopant material in the emitting layer is normally as low as several to 20 wt %. Therefore, triplet excitons which have transferred to the dopant material collide with each other less frequently, resulting in a less possibility of occurrence of the TTF phenomenon. On the other hand, if the relationship $E^T_h<E^T_d$ is satisfied, as the invention, since triplet excitons exist on host molecules, frequency of collision increases, and as a result, the TTF phenomenon easily occurs efficiently.

Examples of a combination of the host material and the dopant material that satisfy the condition (1) include a combination of an anthracene derivative or a pyrene derivative (host material) and an aromatic amine derivative (dopant material), and the like. The host material is preferably an anthracene derivative, and the dopant material is preferably a diaminochrysene derivative, a diaminopyrene derivative, a styrylamine derivative, an amino-substituted fused fluorene derivative, or a diaminoanthracene derivative. A combination of an anthracene derivative and a diaminopyrene derivative, a combination of an anthracene derivative and a diaminochrysene derivative, or a combination of an anthracene derivative and a styrylamine derivative is more preferable when producing a blue device.

A compound shown by the following formula is preferable as the anthracene derivative.

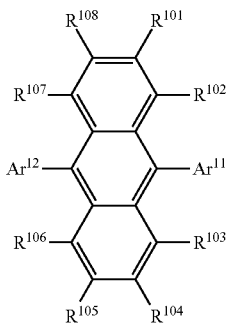

wherein $Ar^{11}$ and $Ar^{12}$ independently represent a substituted or unsubstituted aryl group having 6 to 50 ring carbon atoms, or a substituted or unsubstituted heterocyclic group having 5 to 50 atoms that form a ring (hereinafter referred to as "ring atoms"), and $R^{101}$ to $R^{108}$ independently represent a group selected from a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, and a hydroxyl group.

A compound shown by the following formula is preferable as the pyrene derivative.

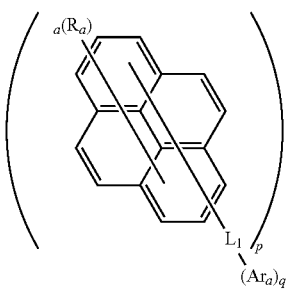

wherein $R_a$ represents (or independently represent) a hydrogen atom or a substituent, $Ar_a$ represents (or independently represent) a substituted or unsubstituted aromatic hydrocarbon group having 6 to 50 ring carbon atoms, or a substituted or unsubstituted heterocyclic group having 5 to 50 ring atoms, $L_1$ represents a single bond, a substituted or unsubstituted divalent aromatic hydrocarbon group having 6 to 30 ring carbon atoms, or a substituted or unsubstituted divalent aromatic hydrocarbon group having 5 to 30 ring atoms, a is an integer from 1 to 10, p is an integer from 1 to 6, and q is an integer from 0 to 10.

A compound shown by the following formula is preferable as the diaminopyrene derivative.

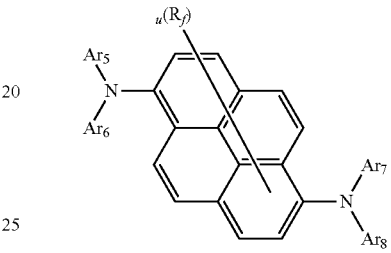

wherein $R_f$ represents (or independently represent) a hydrogen atom, a substituted or unsubstituted alkyl group having 1 to 20 carbon atoms, a substituted or unsubstituted alkenyl group having 2 to 50 carbon atoms, a substituted or unsubstituted alkynyl group having 2 to 50 carbon atoms, a substituted or unsubstituted aralkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted aryloxy group having 5 to 20 ring carbon atoms, a substituted or unsubstituted aryl group having 5 to 50 ring carbon atoms, a substituted or unsubstituted alkylsilyl group having 1 to 30 carbon atoms, a substituted or unsubstituted arylsilyl group having 6 to 50 ring carbon atoms, a substituted or unsubstituted alkylgermanium group having 1 to 50 carbon atoms, or a substituted or unsubstituted arylgermanium group having 6 to 50 ring carbon atoms, u is an integer from 1 to 8, and $Ar_5$ to $Ar_8$ independently represent a substituted or unsubstituted aryl group having 5 to 20 ring carbon atoms, or a substituted or unsubstituted heteroaryl group having 5 to 20 ring atoms.

A compound shown by the following formula is preferable as the diaminochrysene derivative.

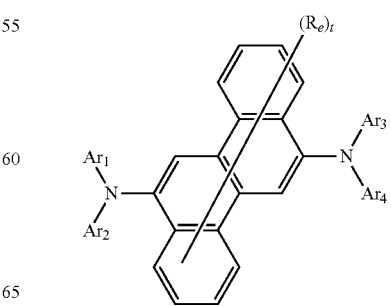

wherein $R_e$ represents (or independently represent) a hydrogen atom, a substituted or unsubstituted alkyl group having 1 to 20 carbon atoms, a substituted or unsubstituted alkenyl group having 2 to 50 carbon atoms, a substituted or unsubstituted alkynyl group having 2 to 50 carbon atoms, a substituted or unsubstituted aralkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted aryloxy group having 5 to 20 ring carbon atoms, a substituted or unsubstituted aryl group having 5 to 50 ring carbon atoms, a substituted or unsubstituted alkylsilyl group having 1 to 30 carbon atoms, a substituted or unsubstituted arylsilyl group having 6 to 50 ring carbon atoms, a substituted or unsubstituted alkylgermanium group having 1 to 50 carbon atoms, or a substituted or unsubstituted arylgermanium group having 6 to 50 ring carbon atoms, t is an integer from 1 to 10, and $Ar_1$ to $Ar_4$ independently represent a substituted or unsubstituted aryl group having 5 to 20 ring carbon atoms, or a substituted or unsubstituted heteroaryl group having 5 to 20 ring atoms.

Compounds shown by the following formulas (6) and (7) are preferable as a styrylamine compound and a styryldiamine compound.

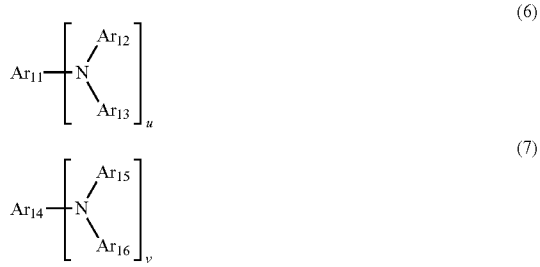

In the formula (6), $Ar_{11}$ represents a u-valent group that corresponds to a phenyl group, a naphthyl group, a biphenyl group, a terphenyl group, a stilbene group, a styrylaryl group, or a distyrylaryl group, and $Ar_{12}$ and $Ar_{13}$ independently represent an aromatic hydrocarbon group having 6 to 20 ring carbon atoms. $Ar_{11}$, $Ar_{12}$ and $Ar_{13}$ may be substituted. u is an integer from 1 to 4, and preferably 1 or 2. One of $Ar_{11}$ to $Ar_{13}$ represents a group that includes a styryl group. It is more preferable that at least one of $Ar_{12}$ and $Ar_{13}$ be substituted with a styryl group.

Examples of the aromatic hydrocarbon group having 6 to 20 ring carbon atoms include a phenyl group, a naphthyl group, an anthranyl group, a phenanthryl group, a terphenyl group, and the like.

In the formula (7), $Ar_{14}$ to $Ar_{16}$ represent a substituted or unsubstituted v-valent aromatic group having 6 to 40 ring carbon atoms. v is an integer from 1 to 4, and preferably 1 or 2.

Examples of a combination of the host material and the dopant material that satisfy the condition (2) include a combination of an anthracene derivative or a pyrene derivative (host material) and a compound that includes an electron-withdrawing group (dopant material). The host material is preferably an anthracene derivative, and the dopant material is preferably a boron-containing compound that is substituted with an electron-withdrawing group. The above compounds are preferable as the anthracene derivative and the pyrene derivative.

A compound shown by either of the following formulas is preferable as the boron-containing compound.

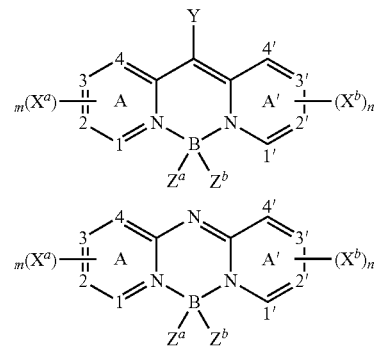

wherein A and A' independently represent an azine ring that corresponds to a 6-membered aromatic ring structure that includes at least one nitrogen atom, $X^a$ and $X^b$ independently represent a selected substituent, provided that two of $X^a$ or $X^b$ may bond to each other to form a ring that is fused with A or A', m and n are independently an integer from 0 to 4, Y represents a hydrogen atom or a substituent, $Z^a$ and $Z^b$ independently represent a selected substituent, and 1, 2, 3, 4, 1', 2', 3', and 4' independently represent a carbon atom or a nitrogen atom.

Examples of a combination of the host material and the dopant material that satisfy the condition (3) include a combination of an anthracene derivative or a pyrene derivative (host material) and a fused aromatic hydrocarbon derivative that includes three or more fused rings and does not include an amino group (dopant material), and the like. The host material is preferably an anthracene derivative, and the dopant material is preferably a fluorene derivative, a fused fluorene derivative, a fluoranthene derivative, a benzofluoranthene derivative, or a pyrene derivative that does not include an amino group. A combination of an anthracene derivative and a benzofluoranthene derivative is most preferable. The above compounds are preferable as the anthracene derivative or the pyrene derivative.

A compound shown by the following formula is preferable as the fluoranthene derivative.

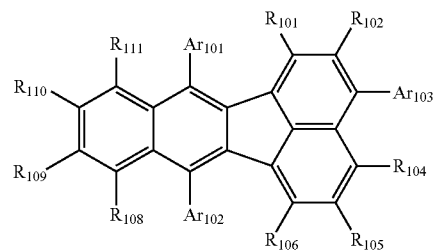

wherein $R_{101}$ to $R_{106}$ and $R_{108}$ to $R_{111}$ independently represent a hydrogen atom, a substituted or unsubstituted alkyl group, a substituted or unsubstituted cycloalkyl group, a substituted or unsubstituted alkoxy group, a substituted or unsubstituted silyl group, a substituted or unsubstituted aryl group, or a substituted or unsubstituted heteroaryl group, and $Ar_{101}$ to $Ar_{103}$ independently represent a substituted or unsubstituted aryl group or a substituted or unsubstituted heteroaryl group.

The host material that satisfies the conditions (1) to (3) is preferably a compound in which cyclic structures or atoms are bonded via a single bond (including a compound in which a cyclic structure and an atom are bonded via a single bond). A compound that includes a carbon-carbon double bond other than that of a cyclic structure is not preferable. This is because the energy of triplet excitons formed on the host material is used for a structural change in the double bond instead of the TTF phenomenon.

It is preferable that the barrier layer in the invention be formed of a barrier material that has high triplet energy as compared with the host material, and have a function of transporting electrons to the emitting layer instead of an electron-transporting layer. Specifically, the TTF phenomenon can be caused to efficiently occur without increasing the number of layers of the stacked structure of the organic EL device by utilizing a barrier material that has a triplet barrier function and an electron-transporting function. This makes it possible to implement a highly efficient organic EL device that has a long lifetime. Note that an electron-injecting layer that exhibits an excellent electron injection capability from the cathode may also be provided (stacked).

It is preferable that the affinity $Af_b$ of the barrier material and the affinity $Af_h$ of the host material satisfy the following expression.

$$Af_h - Af_b > 0 \text{ eV}$$

Specifically, the electron injection capability from the barrier layer to the emitting layer is improved by eliminating the LUMO level energy barrier between the barrier layer and the host material. As a result, triplet excitons are formed, and promote the TTF phenomenon.

The barrier layer in the invention includes a compound that includes a triplet barrier structural part and an electron-transporting structural part. The term "structural part" used herein refers to a cyclic structure (monocyclic structure or fused polycyclic structure excluding a substituent) included in the compound.

The term "triplet barrier structural part" used herein refers to a structural part included in the compound that has the lowest triplet energy. Specifically, the triplet barrier structural part mainly determines the triplet energy of the compound. The compound may include a plurality of triplet barrier structural parts. The triplet energy of the triplet barrier structural part refers to the triplet energy of an independent cyclic structure that is not substituted with a substituent and includes a hydrogen atom at each bonding position. The triplet barrier structural part must be a fused polycyclic aromatic hydrocarbon compound. The reason therefor is described below.

The transition state of a fused hydrocarbon ring is based on the π-π* transition in which the π electron cloud of the cyclic structure is involved. The π electron cloud has a narrow distribution, and has a small effect on the excited state of the emitting layer. When the structural part includes a lone pair of electrons, a strong interaction with triplet excitons formed in the emitting layer occurs due to the lone pair of electrons, and deactivation of triplet excitons formed in the host material is promoted. This makes it difficult to efficiently cause the TTF phenomenon to occur. Therefore, the triplet barrier structural part of the barrier material must be a fused hydrocarbon ring that mainly forms an excited triplet state based on the π-π* transition.

In the invention, the triplet energy of the barrier material is higher than the triplet energy of the host material included in the emitting layer.

The triplet barrier function of the barrier material is mainly determined by the triplet barrier structural part. The energy of triplet excitons formed in the emitting layer is normally transferred to a structural part included in the barrier material that has the lowest triplet energy. When the triplet barrier structural part that has the lowest triplet energy is a fused polycyclic aromatic hydrocarbon compound, the barrier material effectively exhibits the triplet barrier function. Therefore, when a structural part included in the compound that has the lowest triplet energy is not formed of carbon atoms and hydrogen atoms, the compound does not include the triplet barrier structural part.

The triplet barrier structural part is preferably selected from the group consisting of compounds shown by the following formulas (1) to (6). The triplet barrier structural part is particularly preferably a structural part that includes four or more rings. When the triplet barrier structural part is a fused ring of four or more rings, molecular stacking in a thin film is improved due to high planarity, so that the electron mobility increases. This makes it possible to promote injection of electrons into the emitting layer (i.e., increase the recombination efficiency in the emitting layer), so that the TTF phenomenon efficiently occurs.

(1)

(2)

(3)

(4)

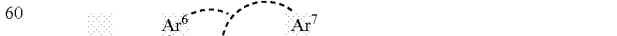

(5)

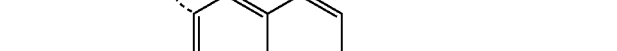
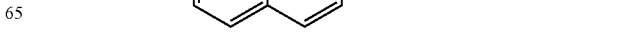

(6)

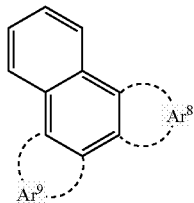

In the formulas (1) to (6), $Ar^1$ to $Ar^g$ represent a fused ring structure having 4 to 16 ring carbon atoms.

Examples of the skeleton of the compound shown by the formula (1) include the following skeletons.

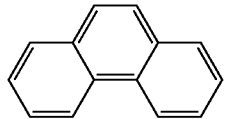
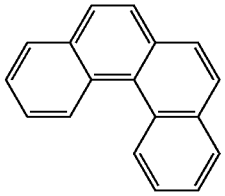

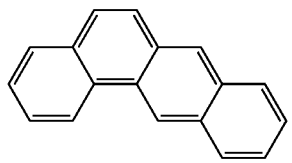

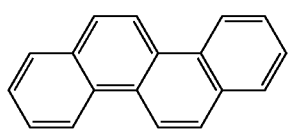

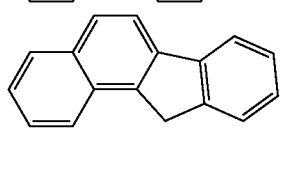

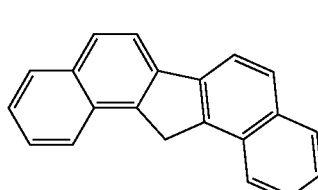

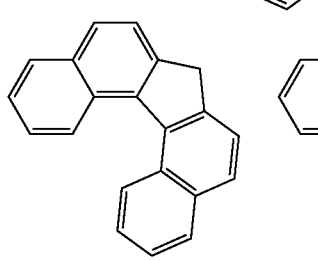

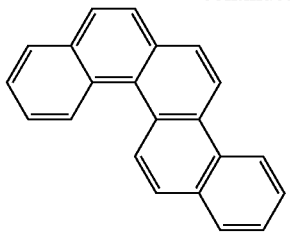

Examples of the skeleton of the compound shown by the formula (2) include the following skeletons.

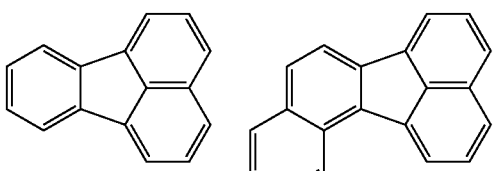

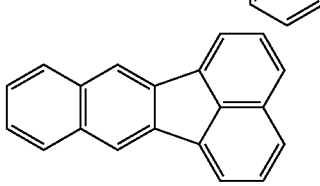

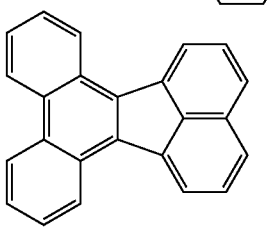

Examples of the skeleton of the compound shown by the formula (3) include the following skeletons.

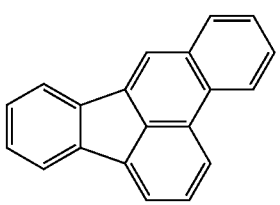

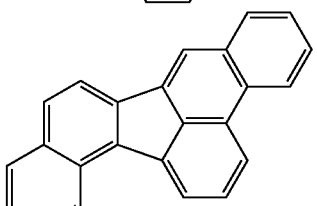

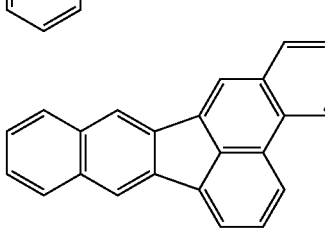

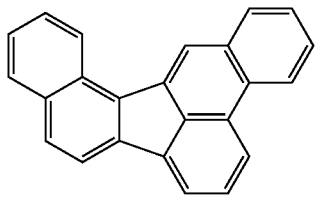

Examples of the skeleton of the compound shown by the formula (4) include the following skeletons in addition to the skeletons mentioned above in connection with the compound shown by the formula (1).

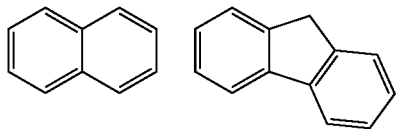

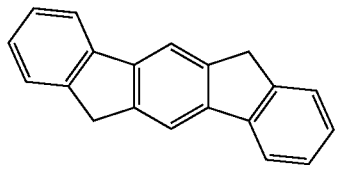

Examples of the skeleton of the compound shown by the formula (5) include the following skeletons.

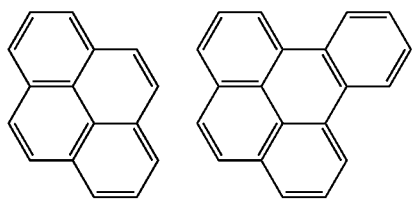

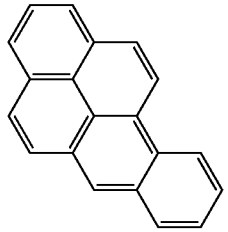

Examples of the skeleton of the compound shown by the formula (6) include the following skeletons.

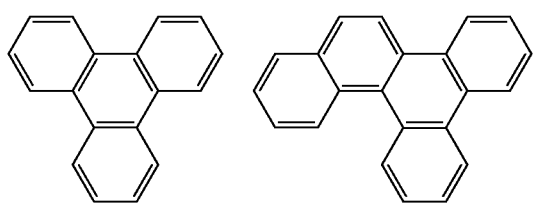

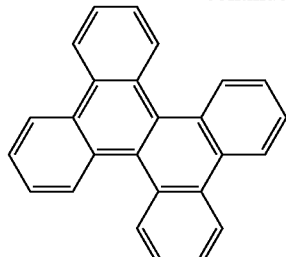

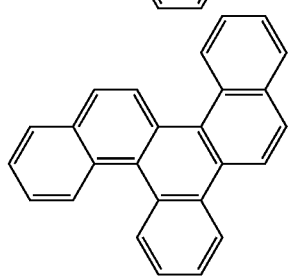 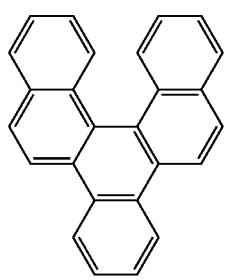

The term "electron-transporting structural part" used herein refers to a structural part that includes an atom that has one or more lone pairs of electrons. Examples of the atom that has a lone pair of electrons include a nitrogen atom, an oxygen atom, a sulfur atom, a phosphorus atom, and the like. The compound may include a plurality of electron-transporting structural parts. The electron-injecting/transporting function of the barrier material is determined by the electron-transporting structural part. The lone pair of electrons included in the electron-transporting structural part mediates reception of electrons from the adjacent layer. The electrons injected into the barrier material move to a structural part that more easily donates electrons (i.e., has a lower LUMO level) via the electron-transporting structural part, and contribute to injection of electrons into the emitting layer. The barrier material used in the invention thus exhibits the electron-injecting/transporting function due to the electron-transporting structural part, and makes it unnecessary to increase the number of layers of the electron-transporting region.

The electron-transporting structural part preferably includes one or more partial structures shown by the following formula.

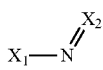

wherein $X_1$ and $X_2$ independently represent a carbon atom or a nitrogen atom.

Specific examples of the electron-transporting structural part include a monocyclic structure or a fused polycyclic structure that includes one or more rings selected from rings shown by the following formulas.

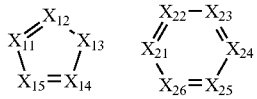

wherein $X_{11}$ to $X_{15}$ and $X_{21}$ to $X_{26}$ independently represent a carbon atom or a nitrogen atom, provided that at least one of $X_{11}$ to $X_{15}$ and at least one of $X_{21}$ to $X_{26}$ represent a nitrogen atom.

More specifically, the electron-transporting structural part includes one or more rings selected from the rings shown by the following formulas.

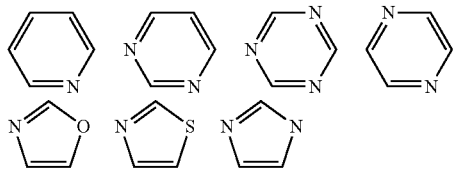

It is more preferable that the electron-transporting structural part include a ring selected from the heterocyclic rings shown by the following formulas.

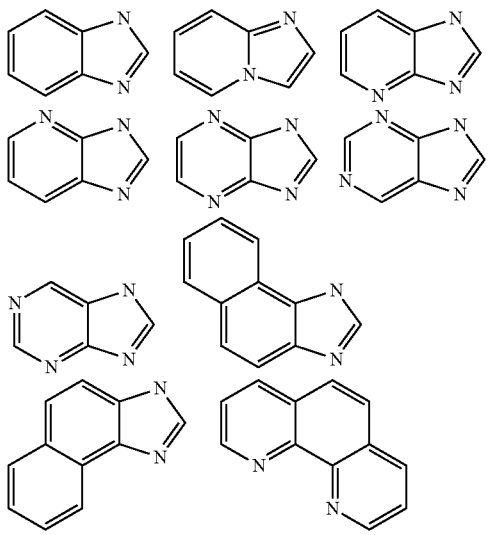

A plurality of electron-transporting structural parts may be bonded via a single bond.

For example, ETB1 used in the examples (described below) includes a benzochrysene ring, two benzene rings, and a benzimidazole ring as cyclic structures. The triplet energy of benzochrysene is 2.4 eV, the triplet energy of benzene is 3.7 eV, and the triplet energy of benzimidazole is 3.3 eV. Therefore, the triplet barrier structural part of ETB1 is benzochrysene. The electron-transporting structural part of ETB1 is benzimidazole that includes a nitrogen atom that has one or more lone pairs of electrons.

ET1 used in the examples includes three benzene rings and two phenanthroline rings as cyclic structures. The triplet energy of benzene is 3.7 eV, and the triplet energy of phenanthroline is 2.8 eV. Therefore, ET1 does not include the triplet barrier structural part since phenanthroline that has the lowest triplet energy is not a fused polycyclic aromatic hydrocarbon compound. The electron-transporting structural part of ET1 is phenanthroline that includes a nitrogen atom that has one or more lone pairs of electrons.

A polycyclic aromatic compound shown by the following formula is preferable as the barrier material.

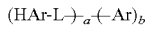

wherein Ar represents a substituted or unsubstituted fused polycyclic aromatic hydrocarbon group, L represents a single bond, one or more substituted or unsubstituted hydrocarbon rings having 6 to 30 ring carbon atoms, or a heterocyclic ring having 5 to 30 ring atoms, and HAr represents a substituted or unsubstituted heterocyclic ring that includes an atom that has a lone pair of electrons. Ar or L serves as a substituted or unsubstituted triplet barrier structural part, and HAr serves as a substituted or unsubstituted electron-transporting structural part when L represents a fused polycyclic aromatic hydrocarbon group. L also serves as an electron-transporting structural part when L represents a heterocyclic ring that includes an atom that has a lone pair of electrons. a and b are an integer from 1 to 4, provided that one of a and b is 1. a and b are preferably 1.

L in the above polycyclic aromatic compound preferably represents a phenylene group, a biphenylene group, a fluorenylene group, or a naphthylene group, and more preferably represents a phenylene group.

Examples of a substituent that may substitute each group (Ar, L, and HAr) include a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, and a carboxyl group. Examples of a preferable aromatic hydrocarbon group include benzene, naphthalene, phenanthrene, fluorene, chrysene, fluoranthene, and triphenylene. When each group is substituted with a plurality of substituents, the substituents may form a ring. Examples of a preferable substituent include an alkyl group, a phenyl group, and a naphthyl group.

Specific examples of the barrier material are shown below.

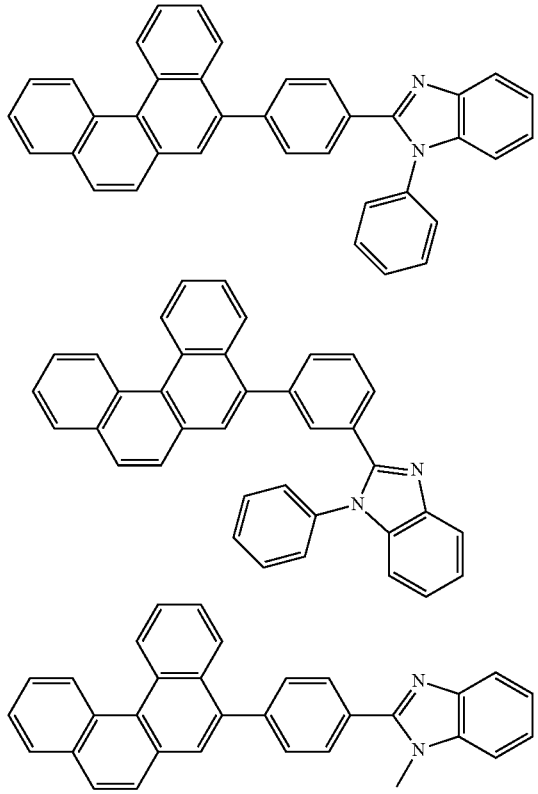

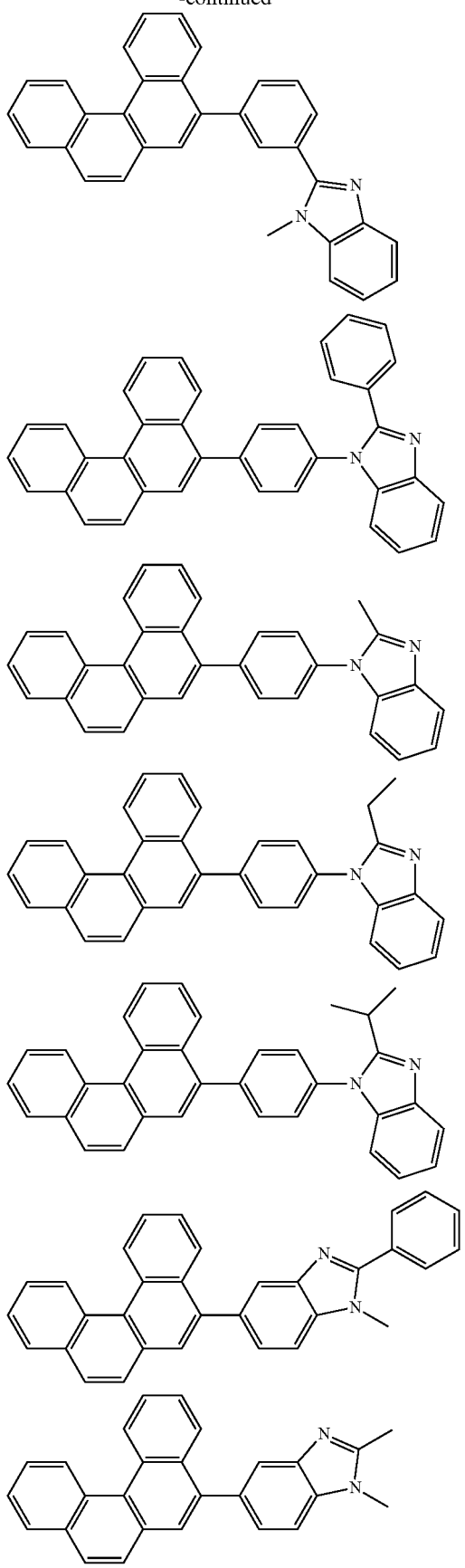
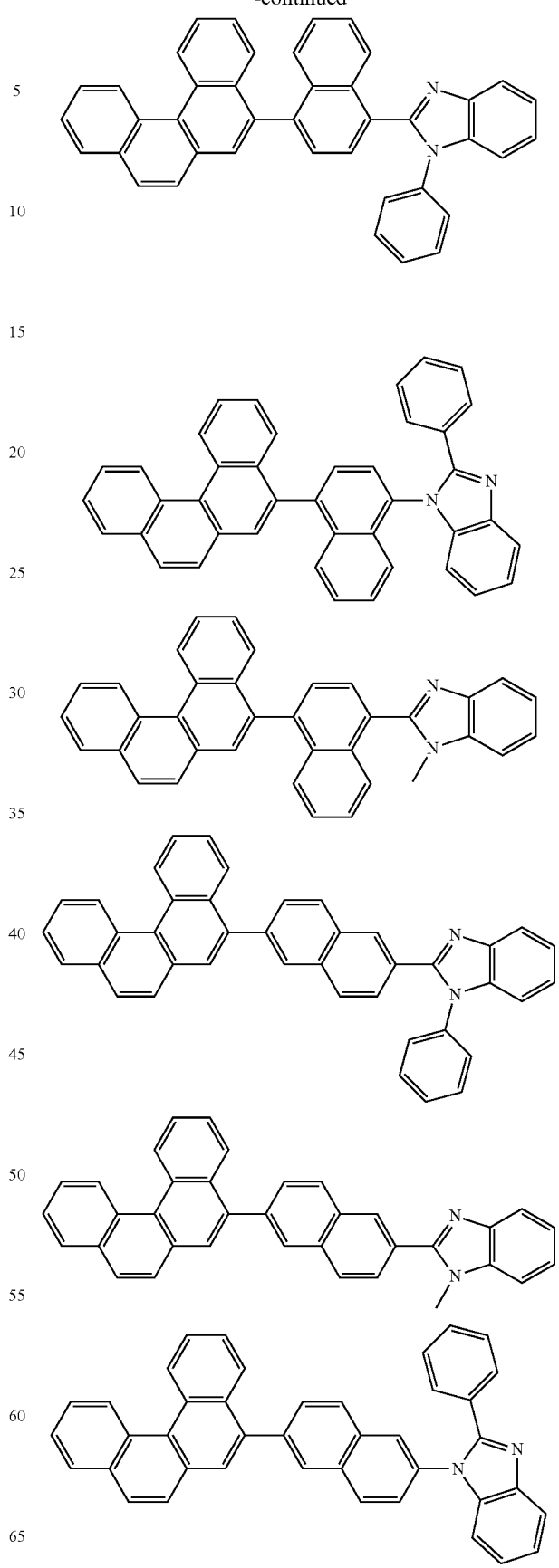

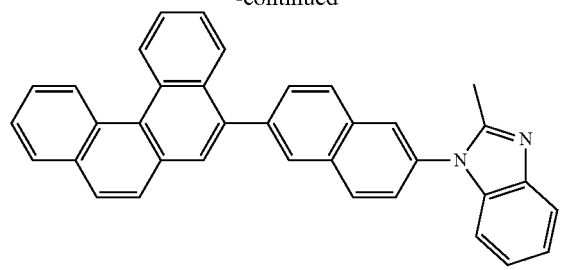
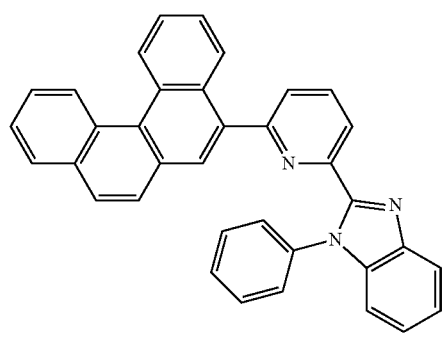
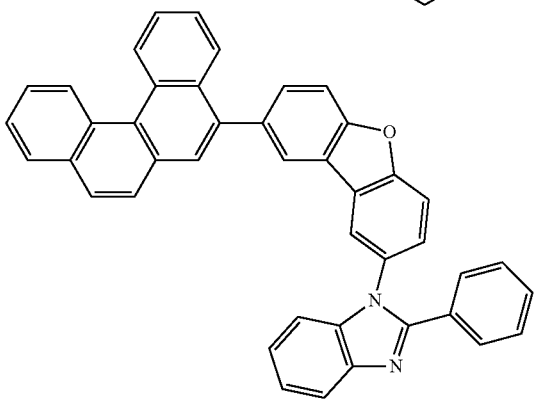
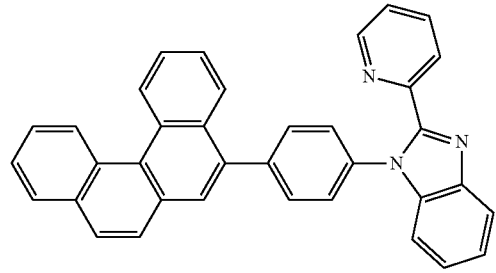
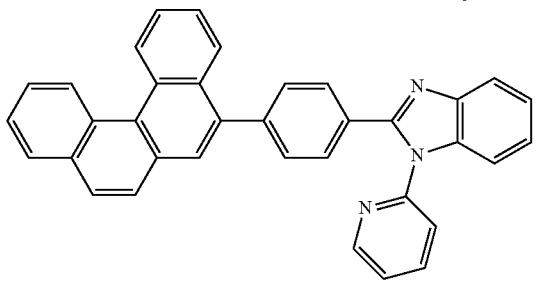
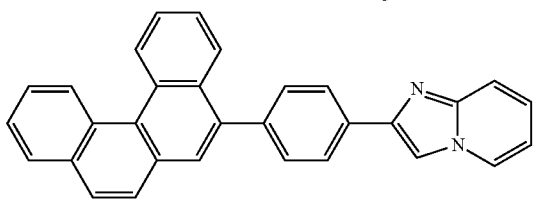
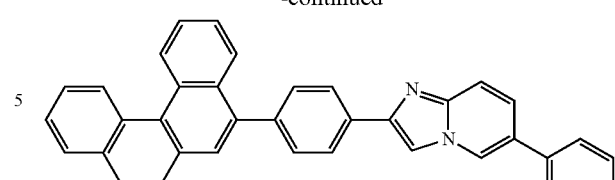
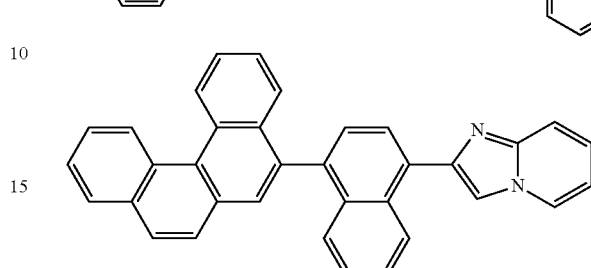
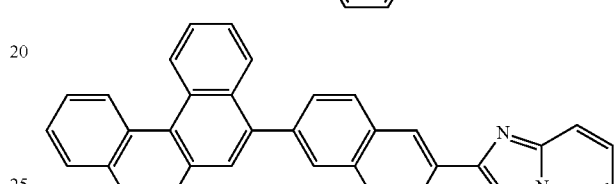
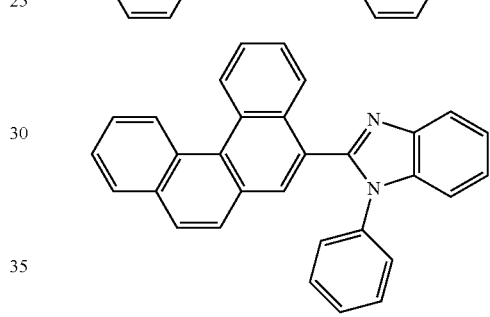
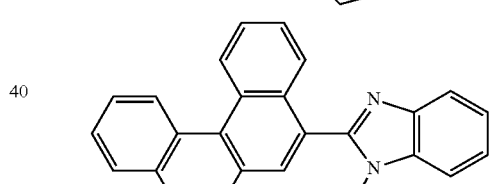
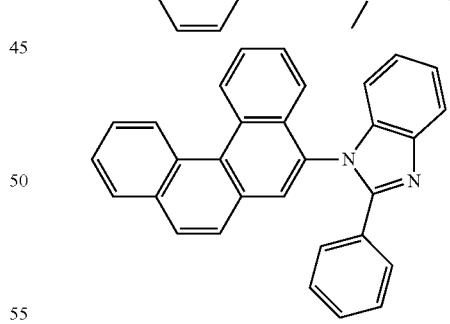
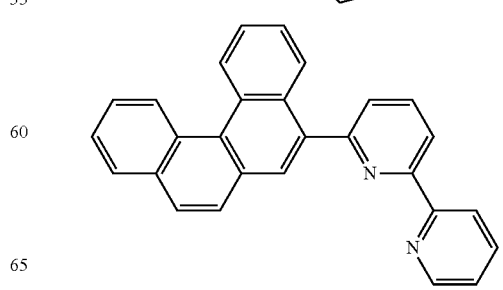

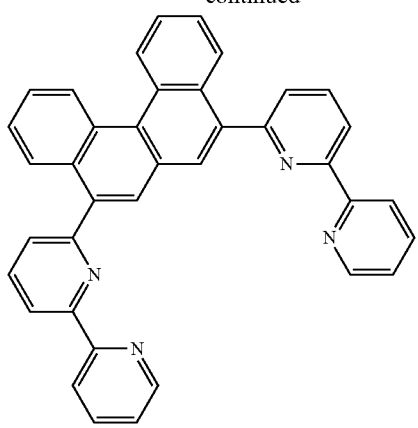
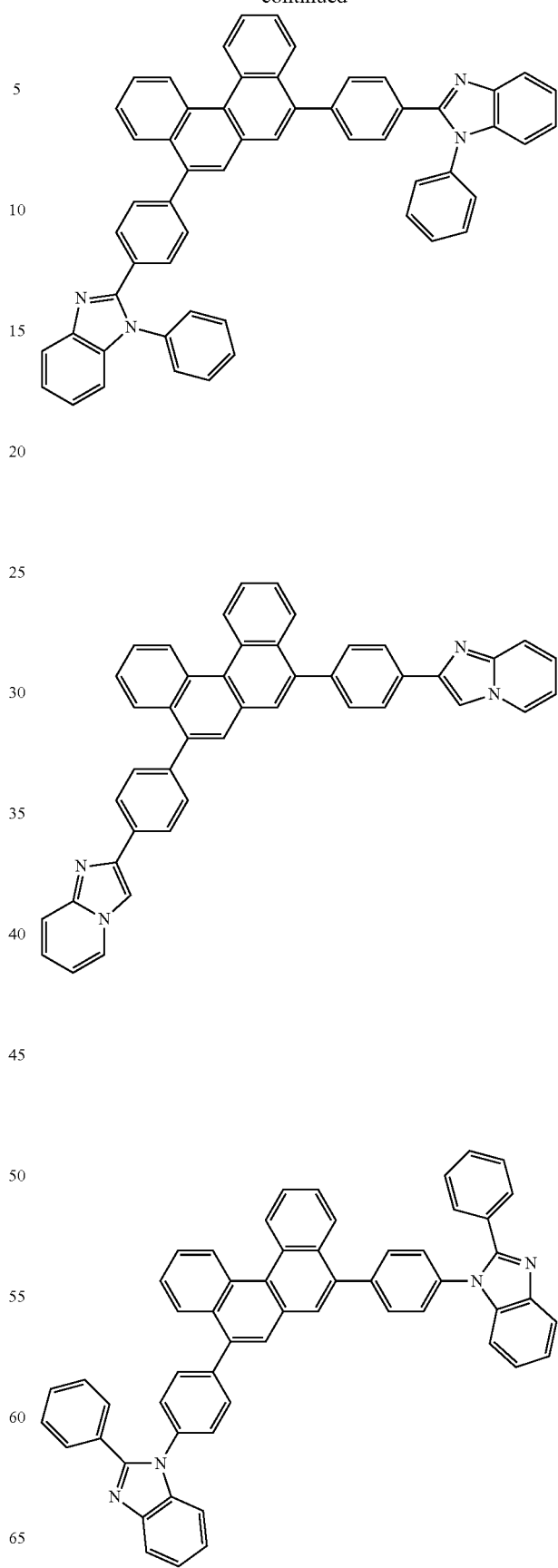

-continued
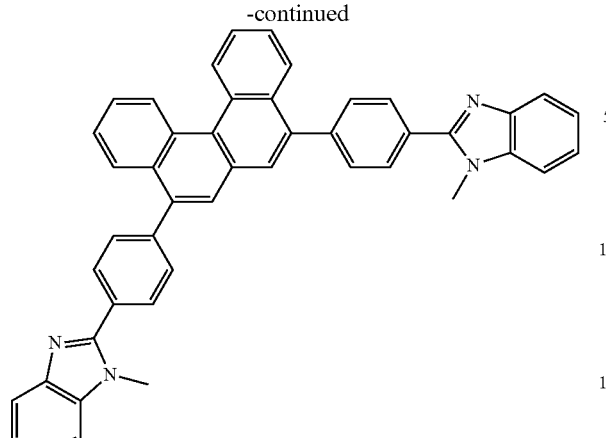
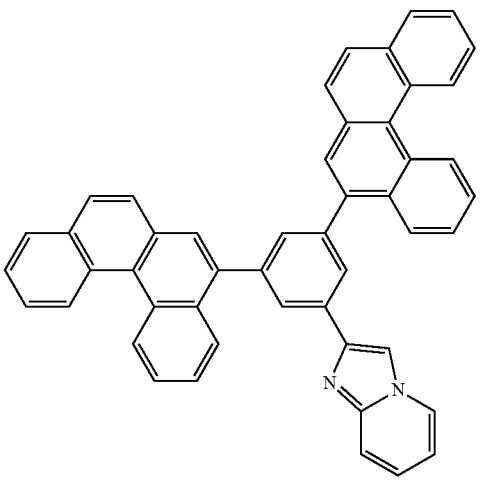
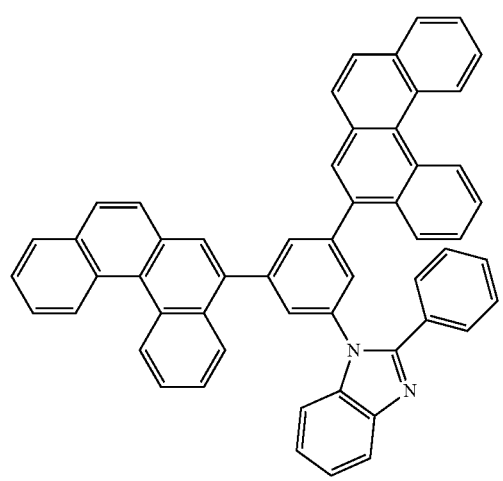
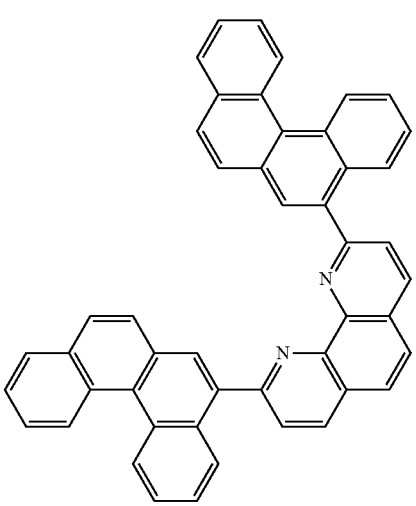
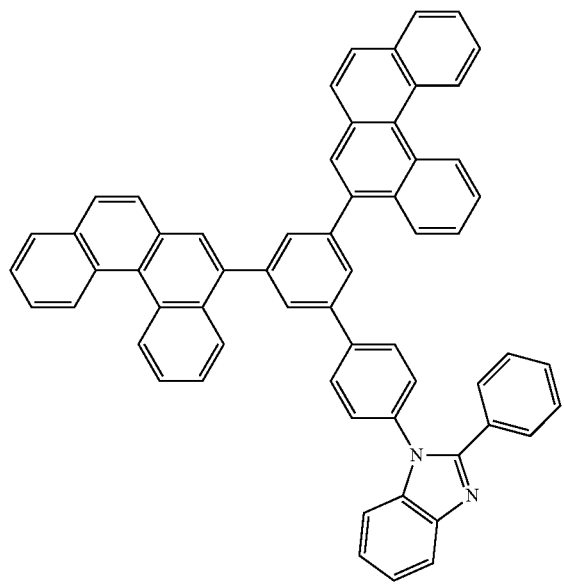
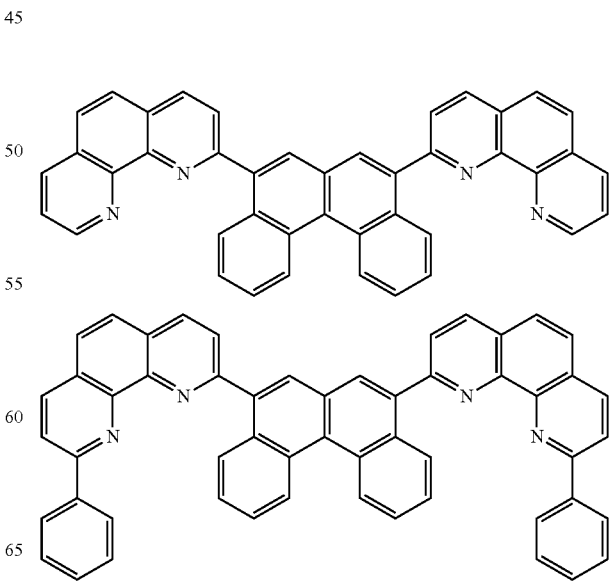

31
-continued
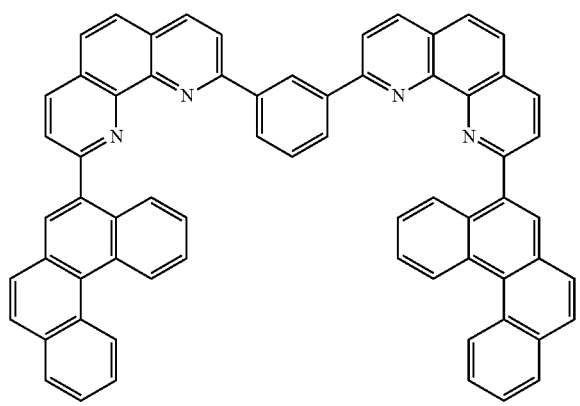 [SMILES: c1cc(-c2ccc3ccc4ccc(-c5cc6ccc7ccccc7c6c6ccccc56)nc4c3n2)cc(-c2ccc3ccc4ccc(-c5cc6ccc7ccccc7c6c6ccccc56)nc4c3n2)c1]
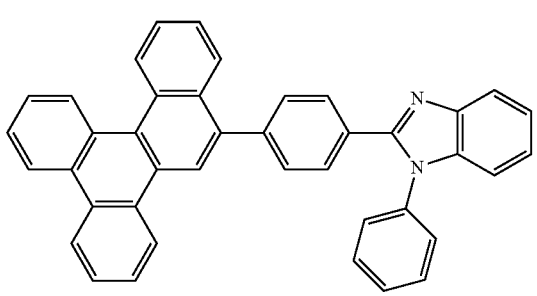
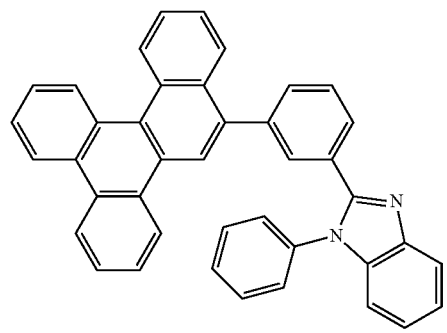
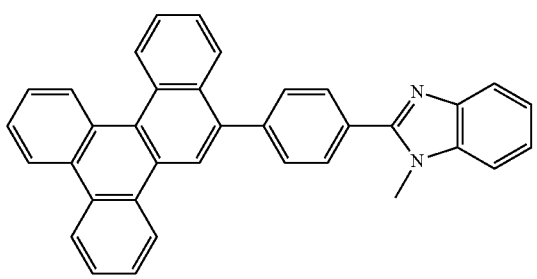
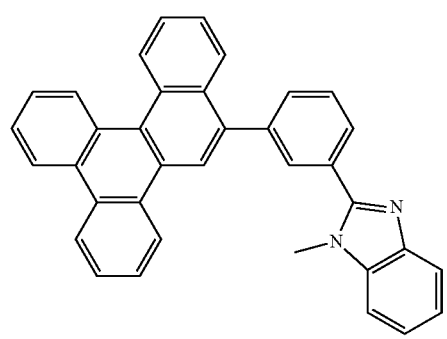
32
-continued
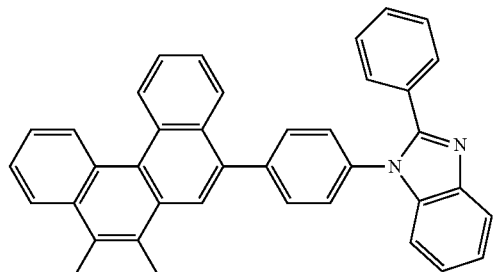
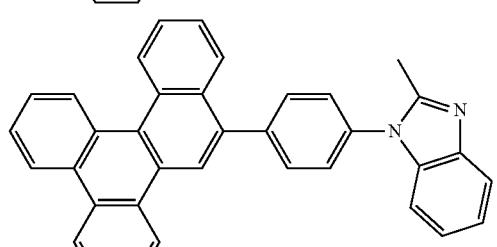
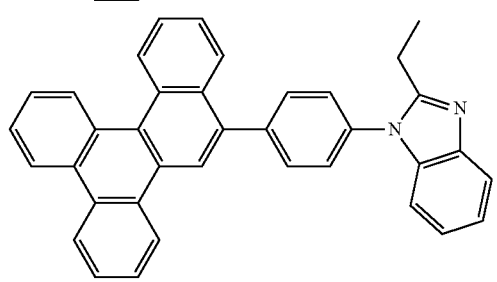
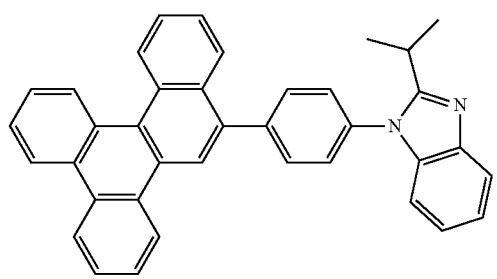
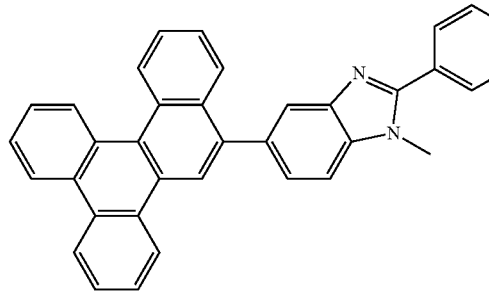
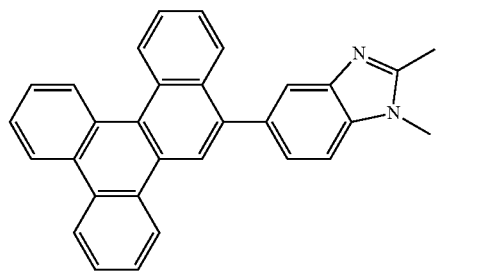

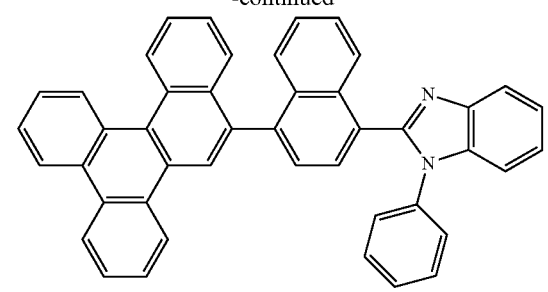
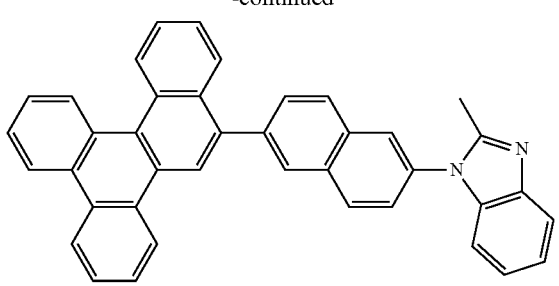

-continued
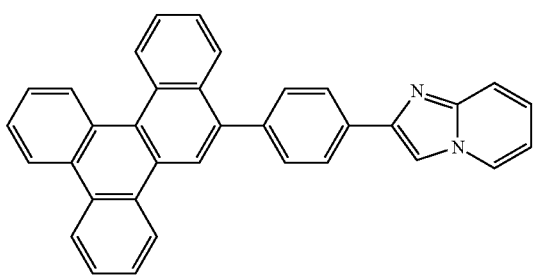
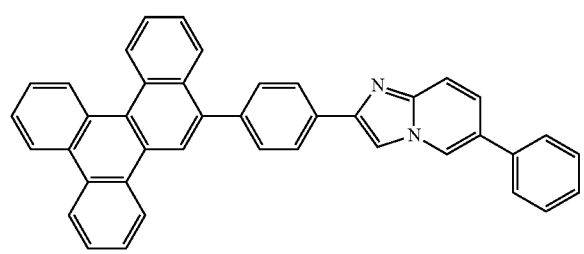
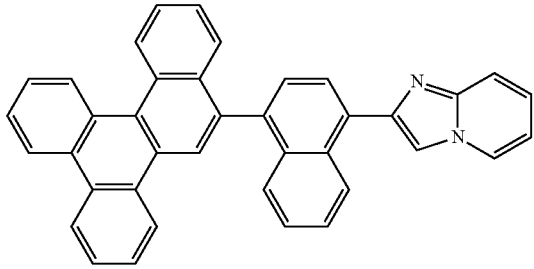
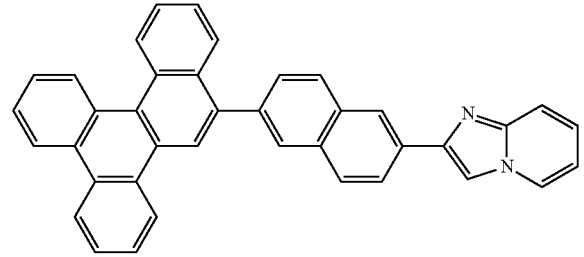
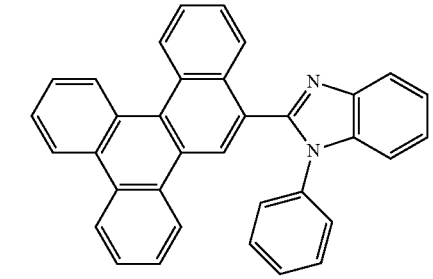
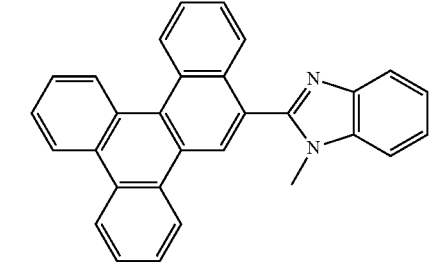
-continued
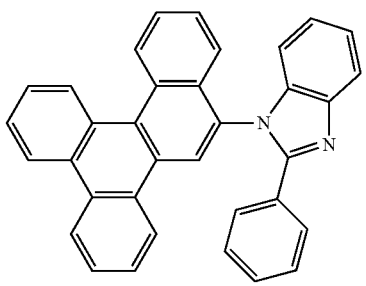
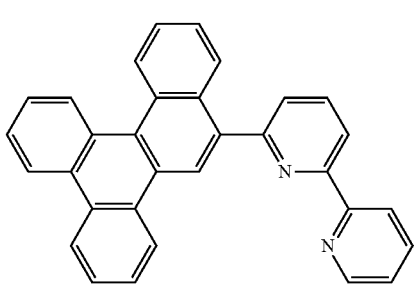
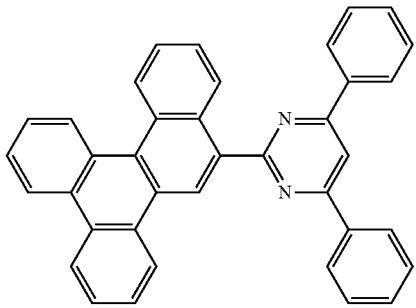
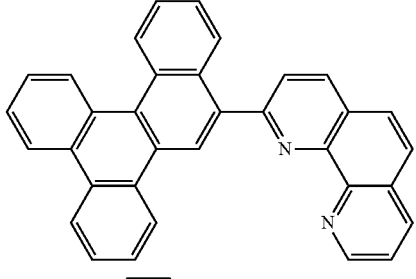
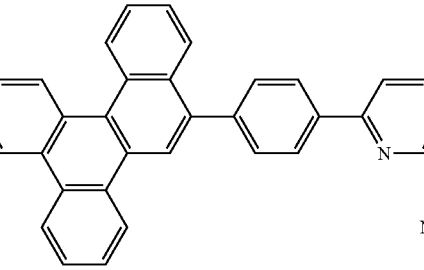

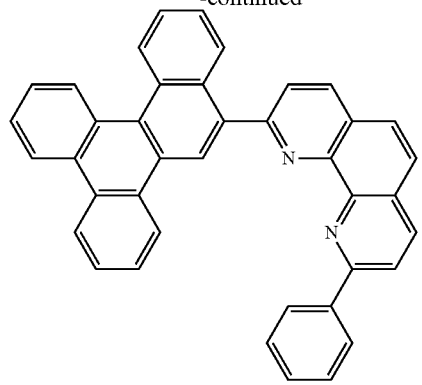
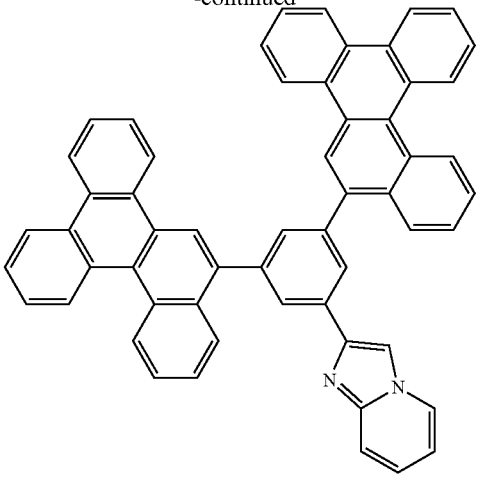
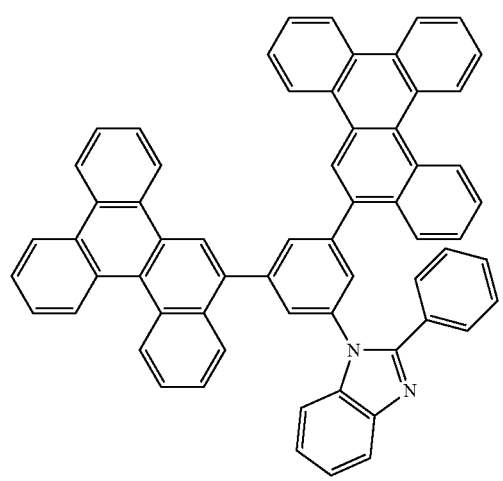
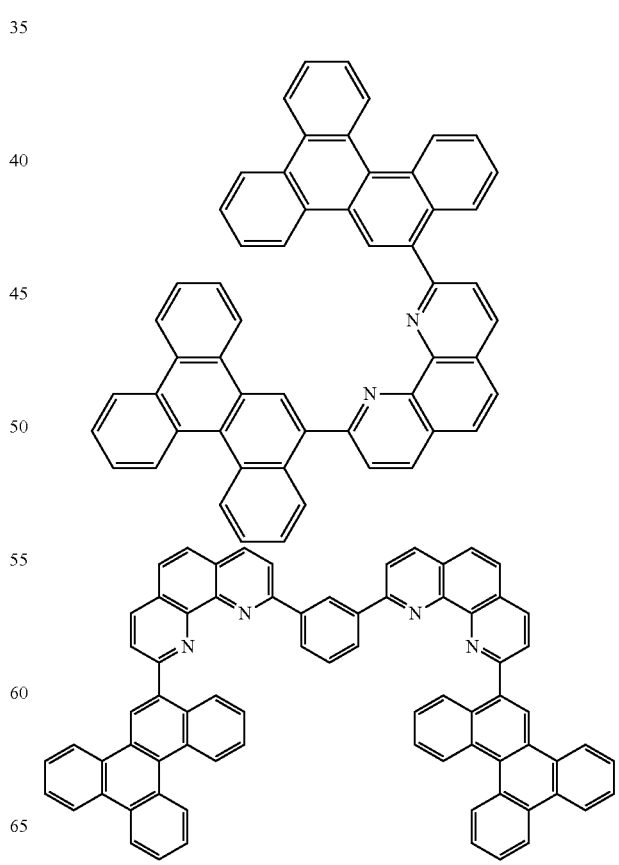

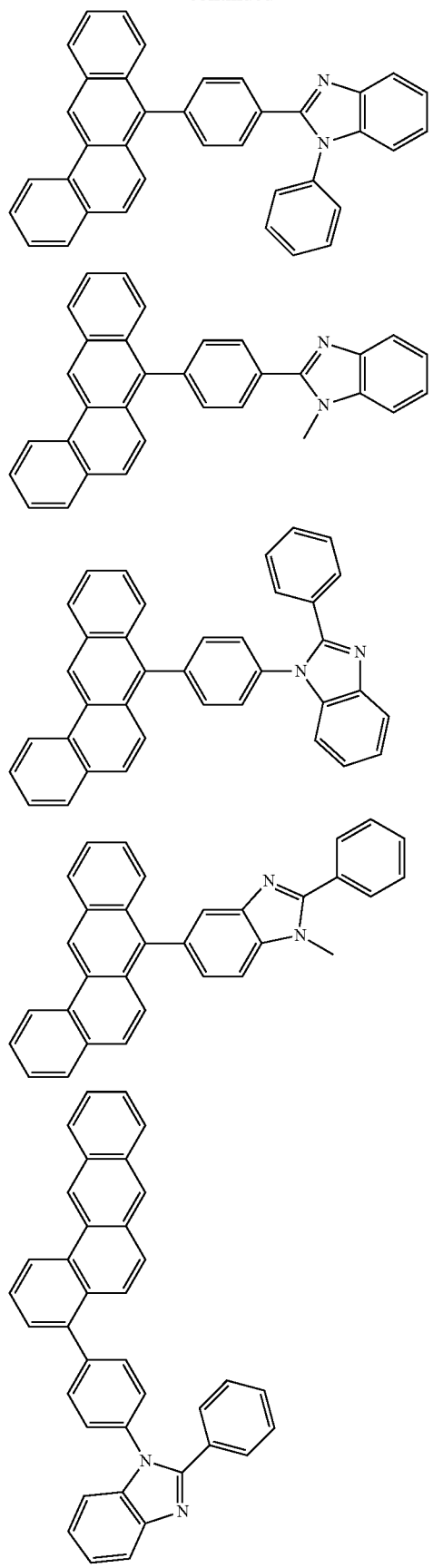
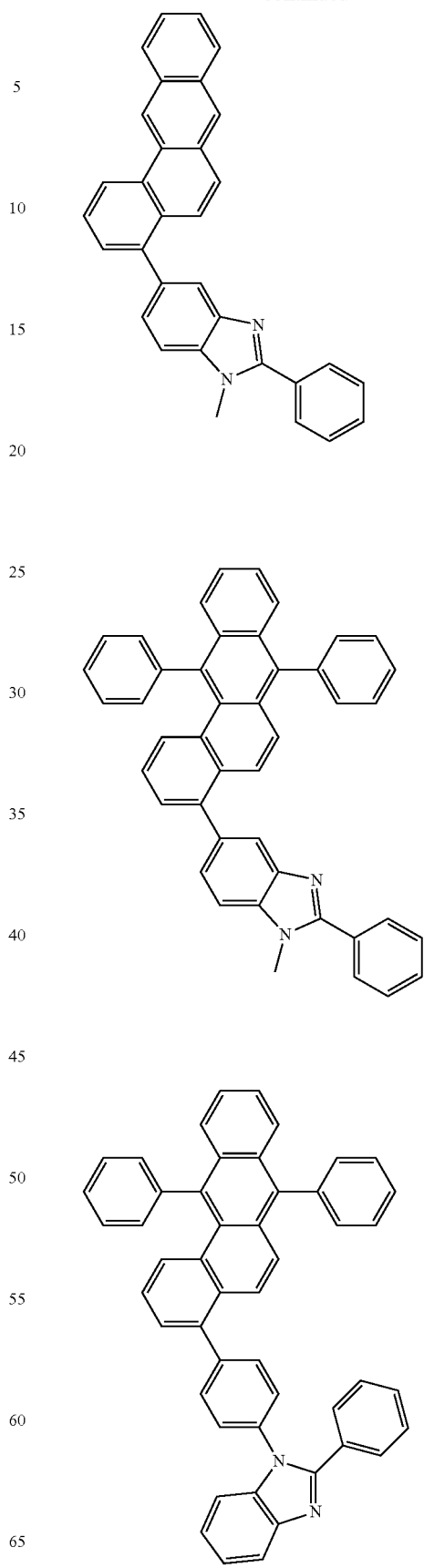

41
-continued
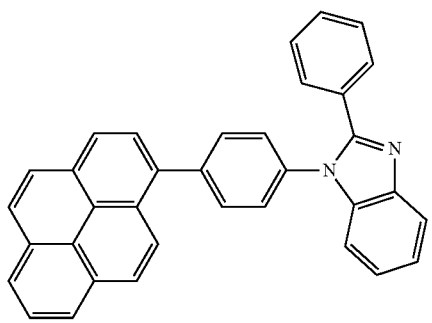
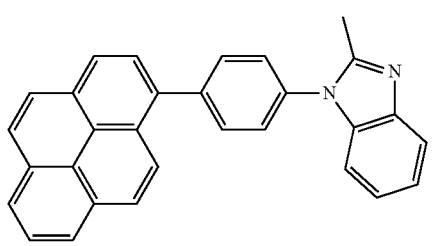
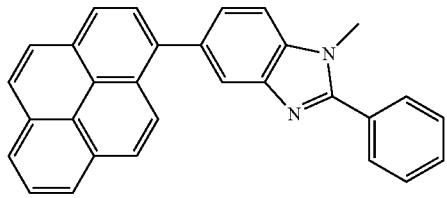
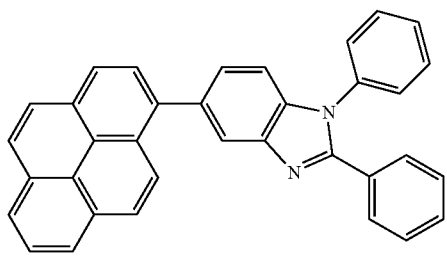
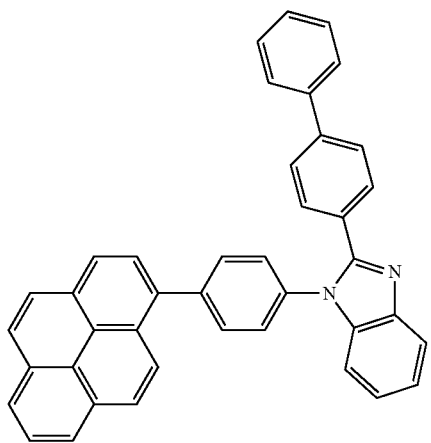
42
-continued
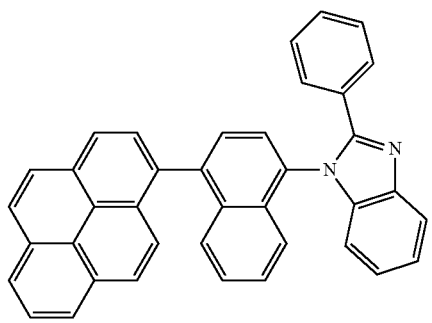
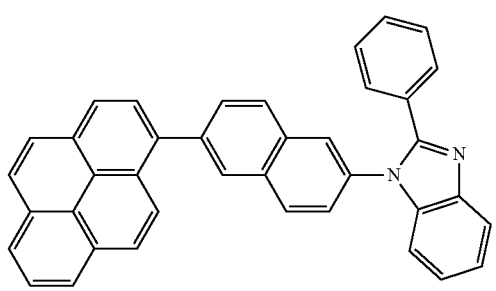
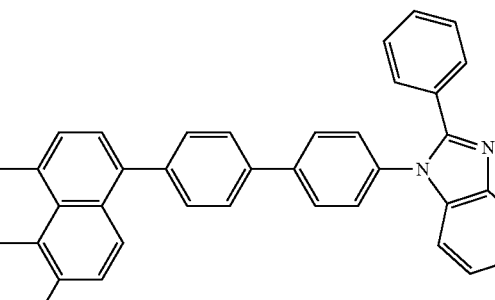
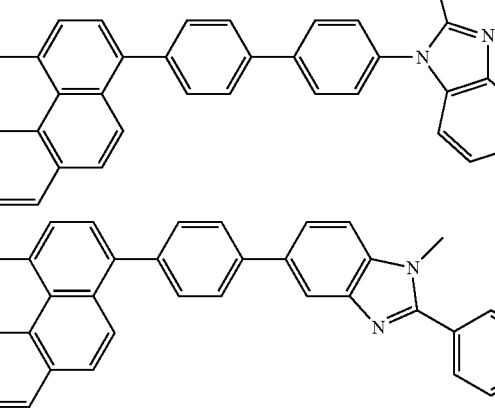
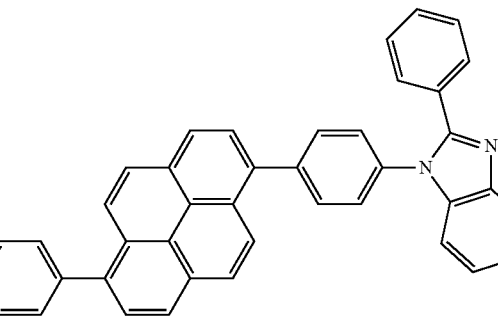

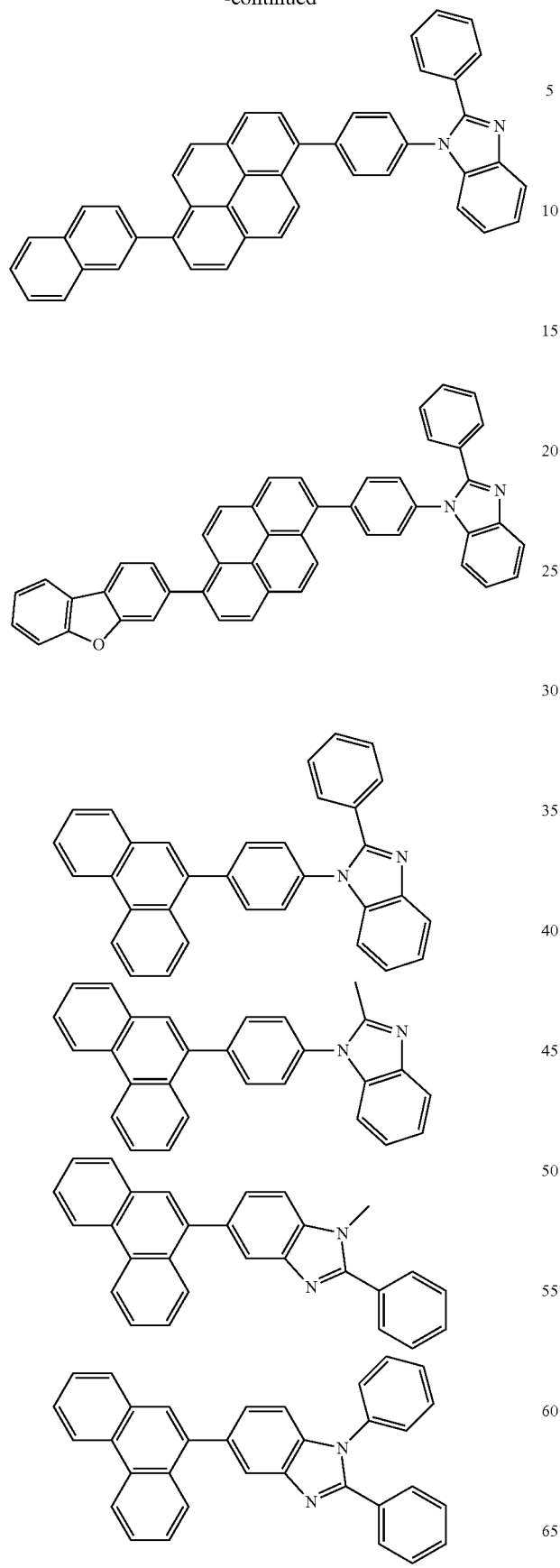
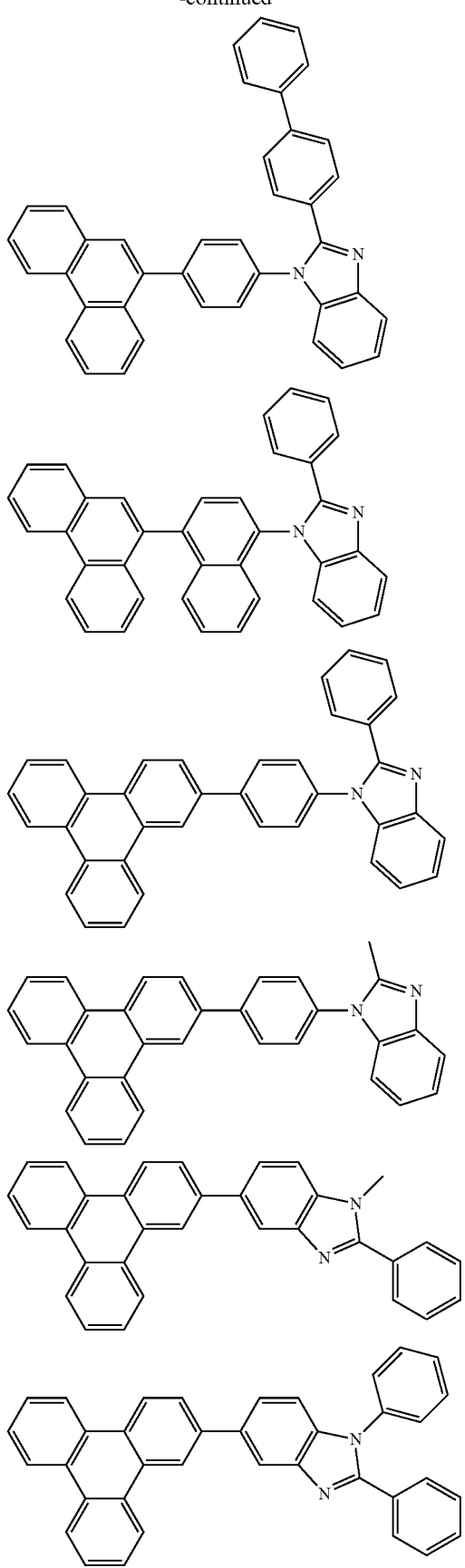

-continued
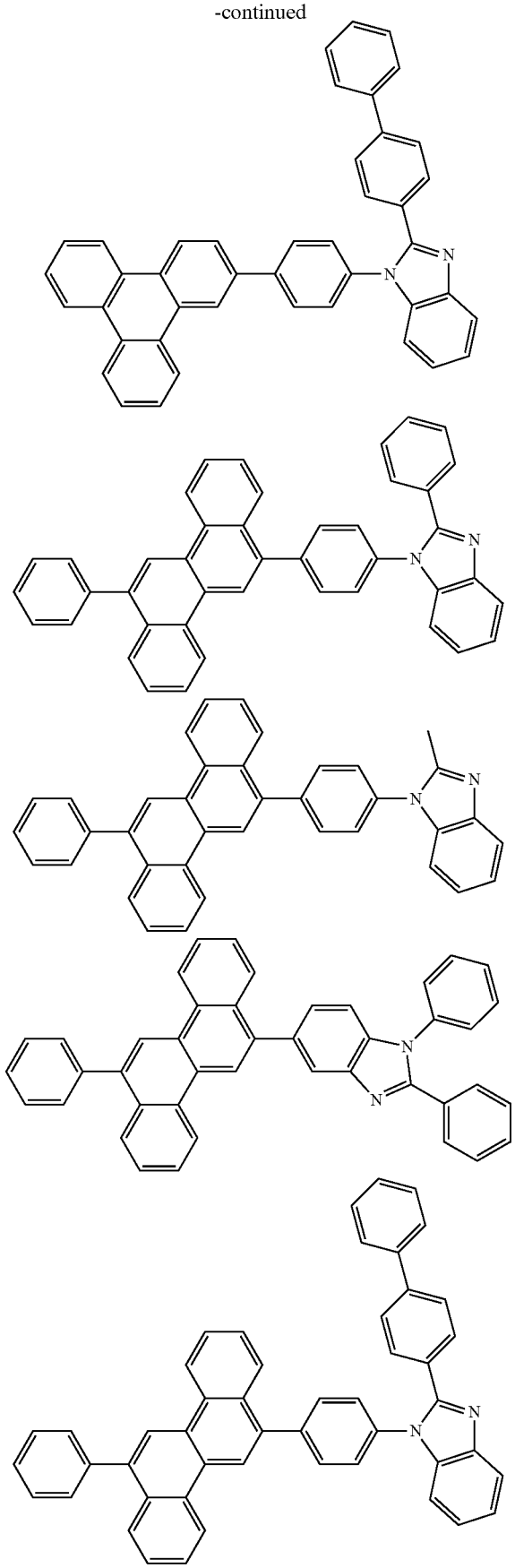
-continued
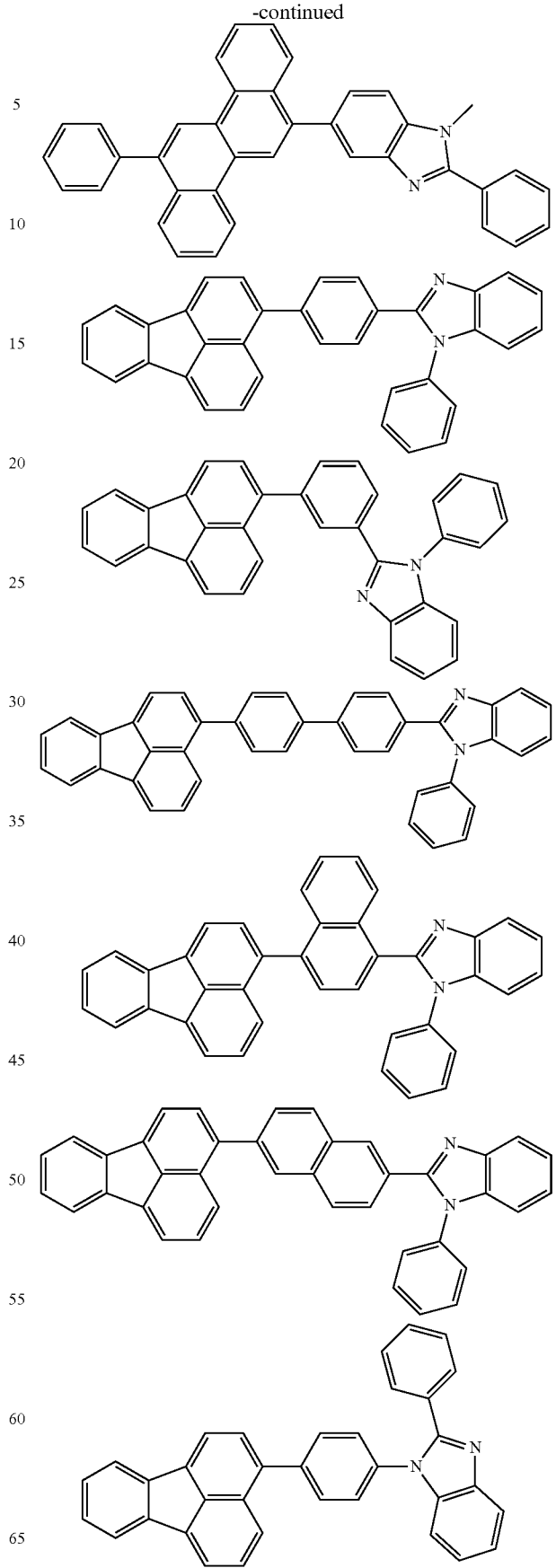

47
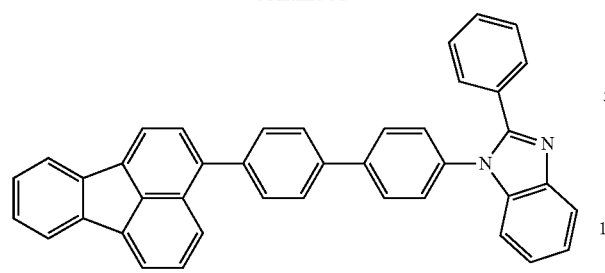
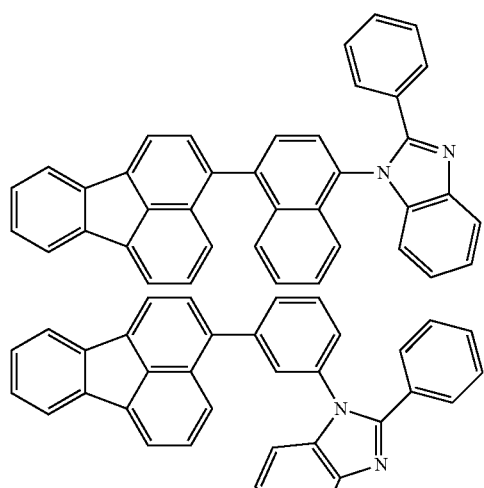
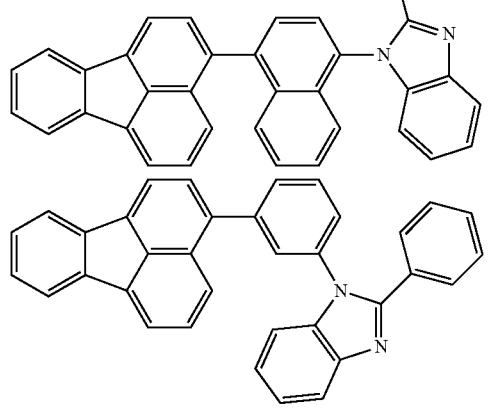
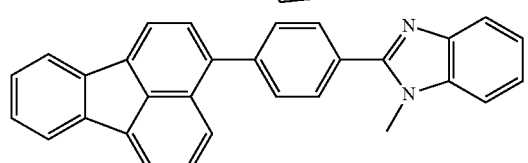
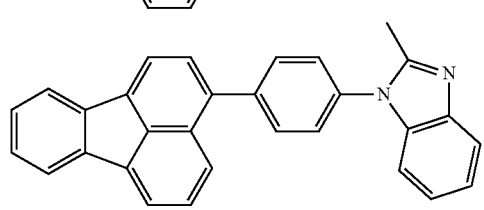
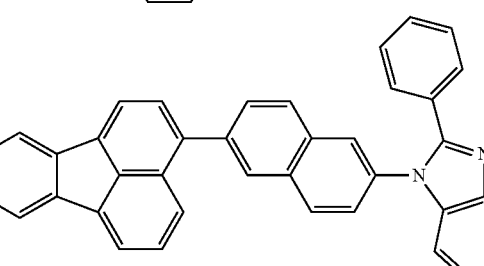
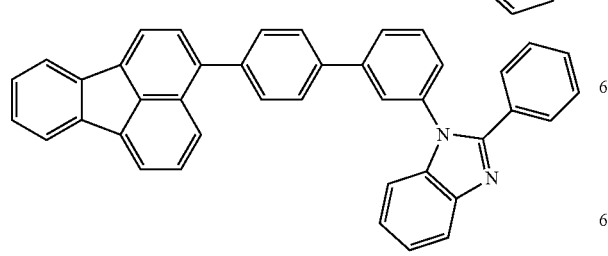
48
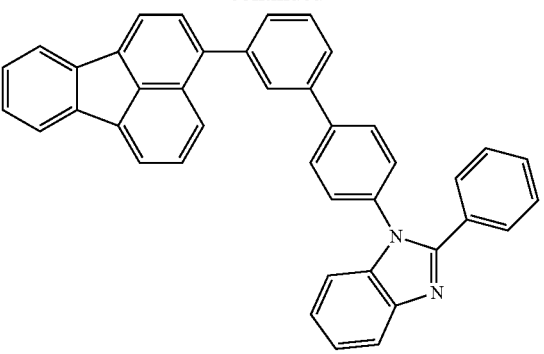
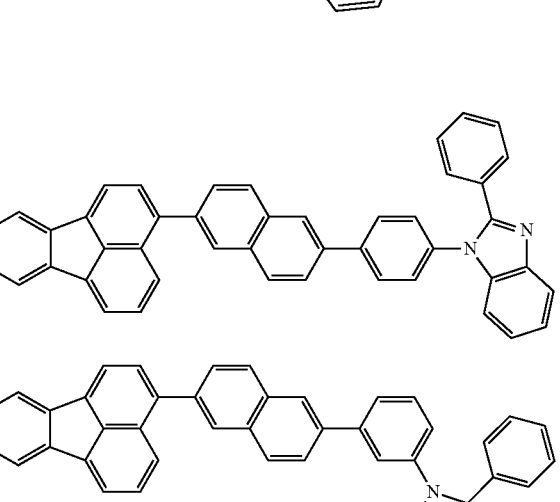
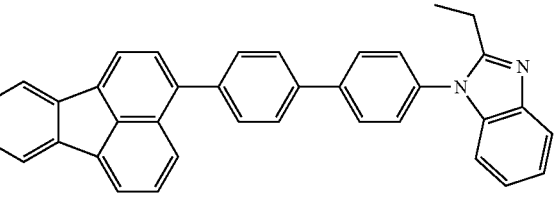
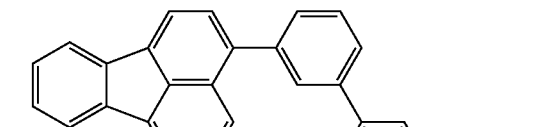
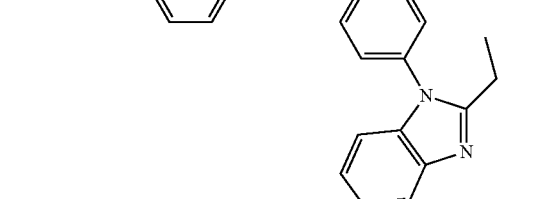
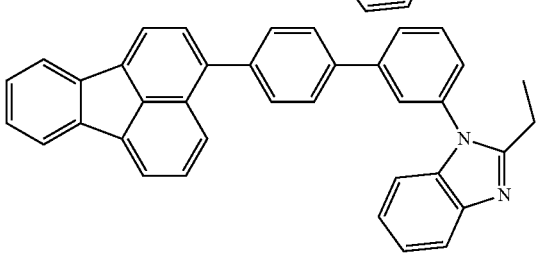

49
-continued
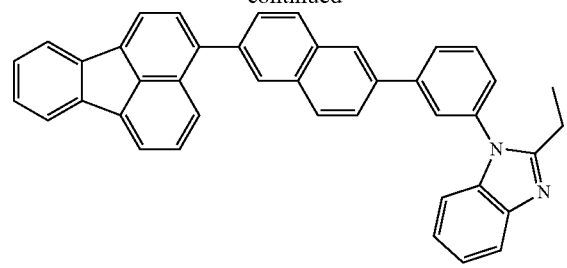
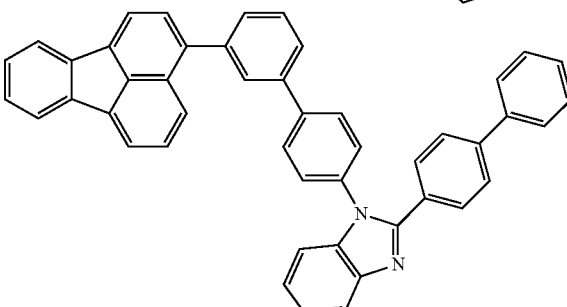
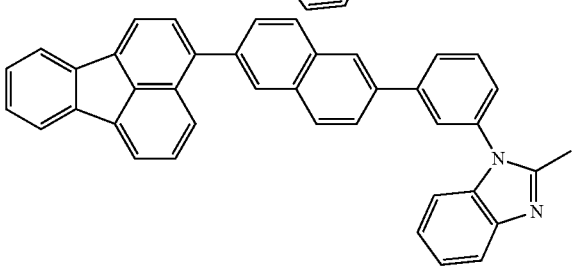
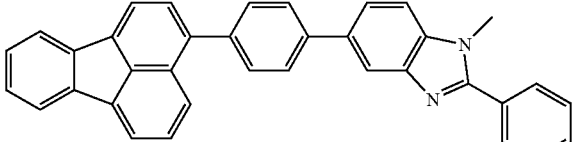
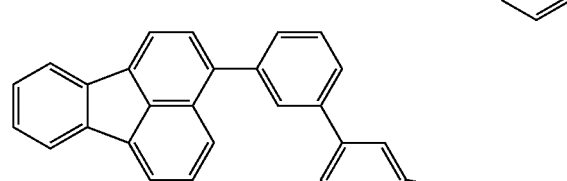
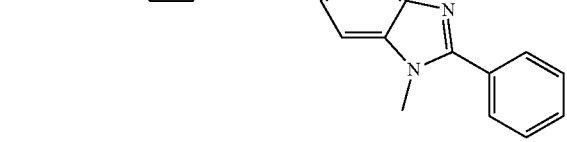
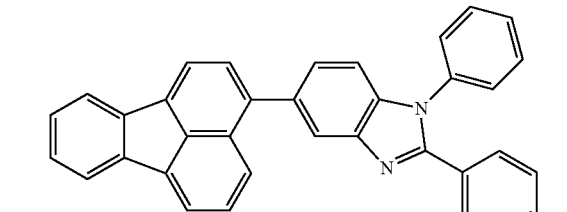
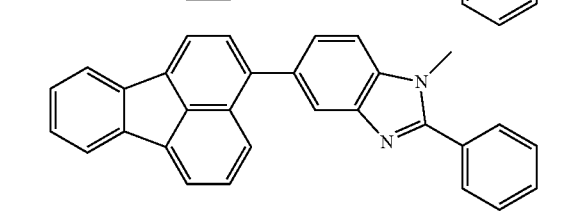
50
-continued
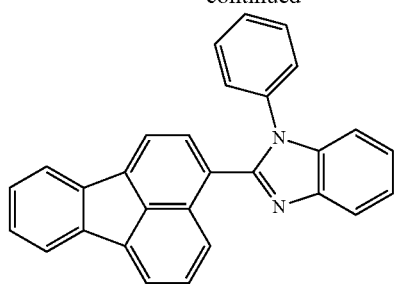
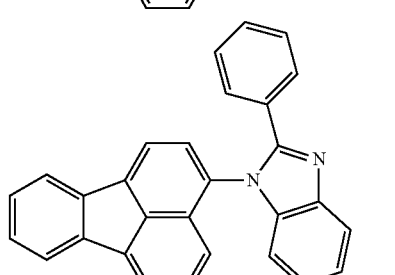
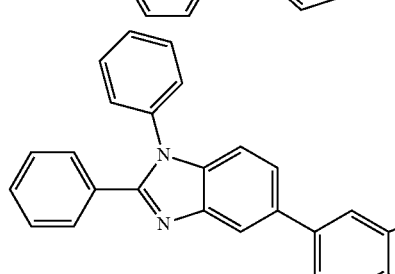
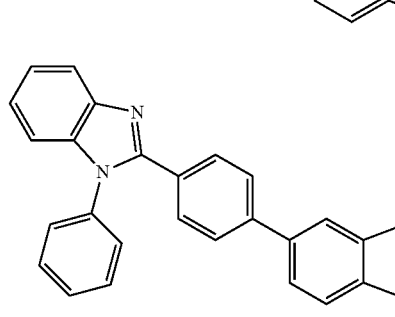
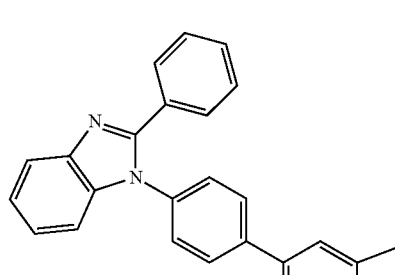
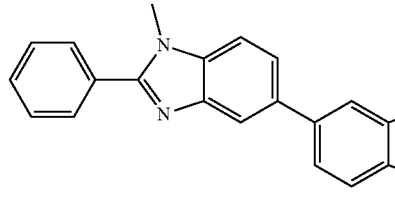

51
-continued
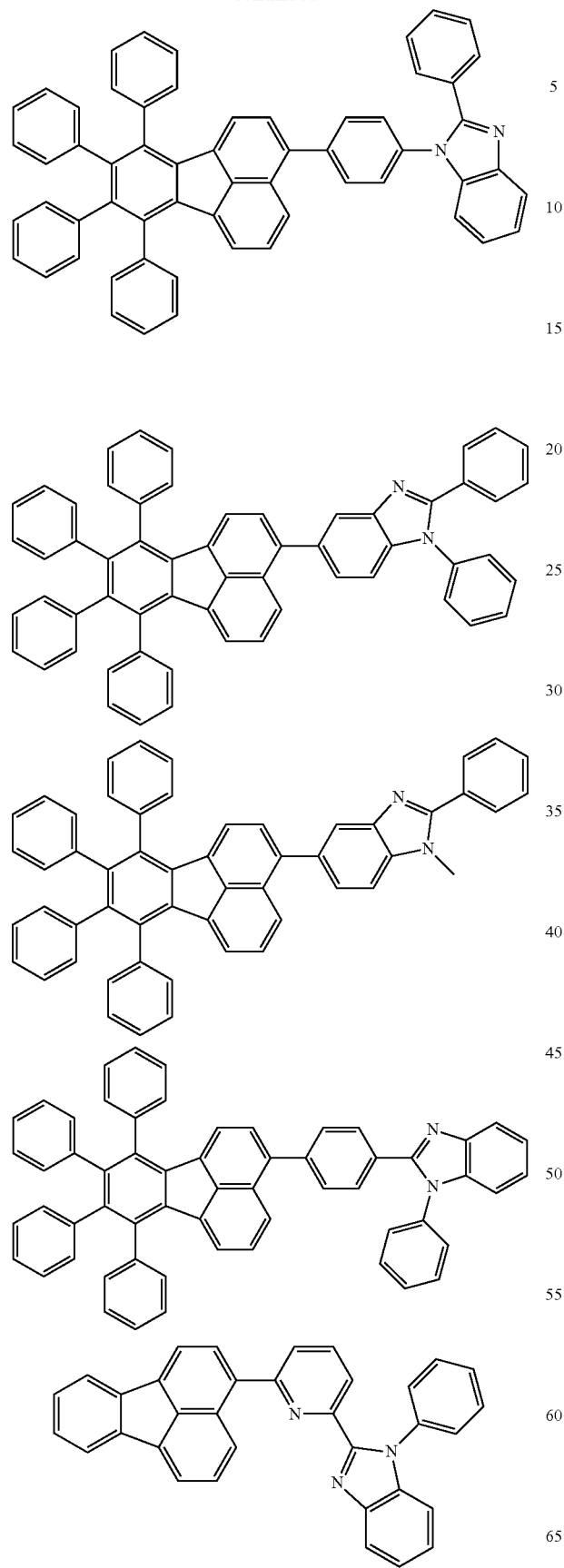
52
-continued
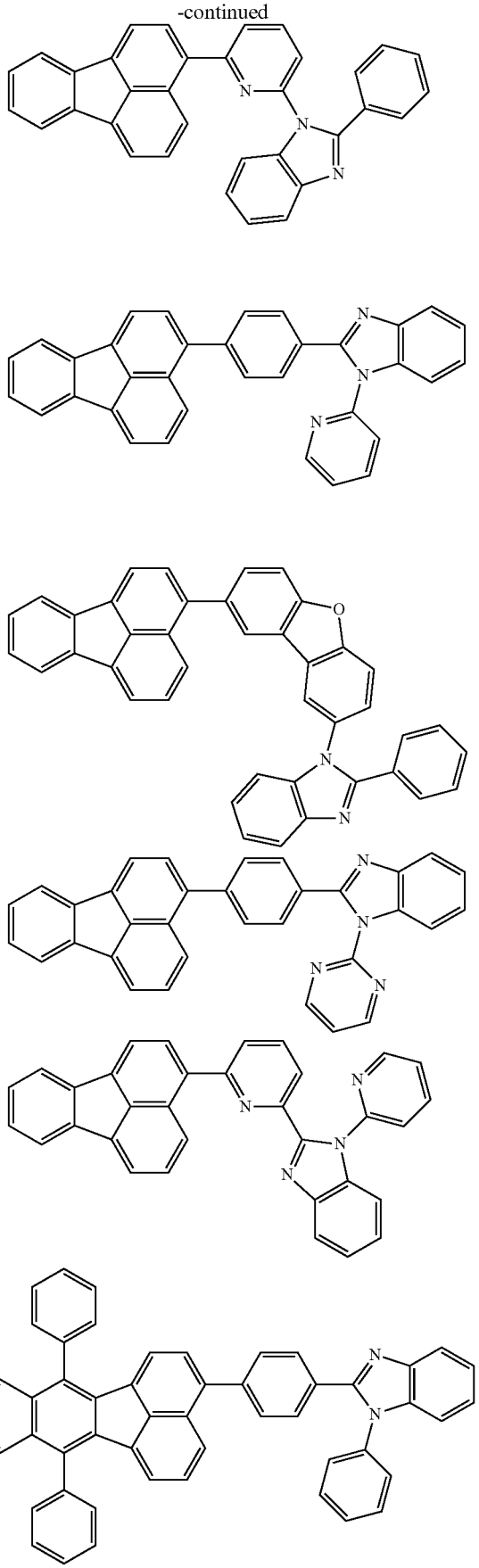

53
-continued
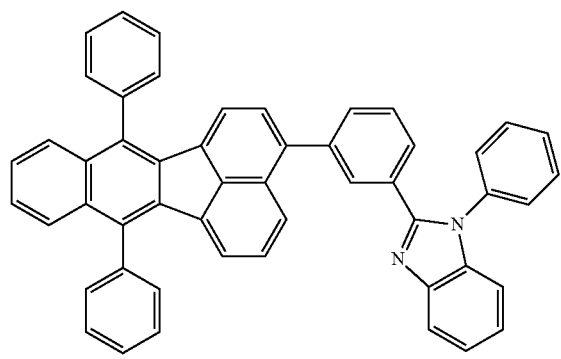
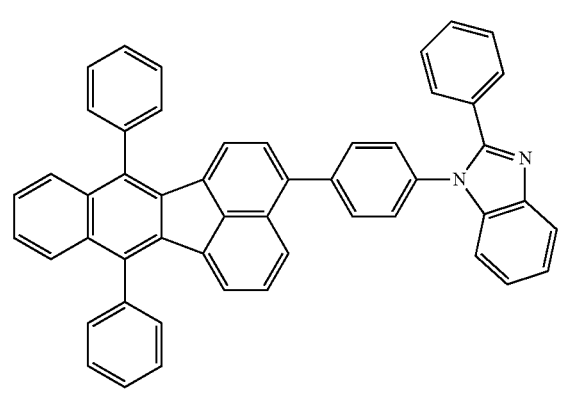
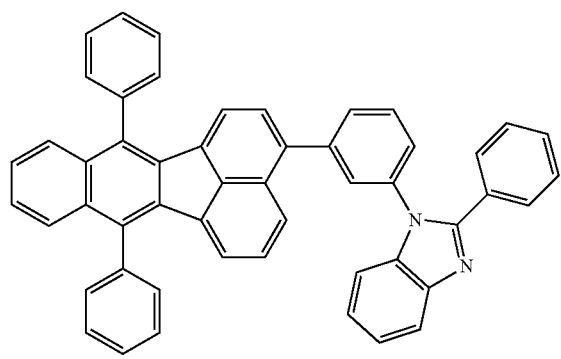
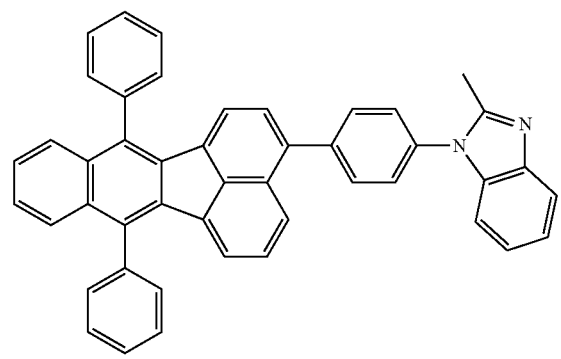
54
-continued
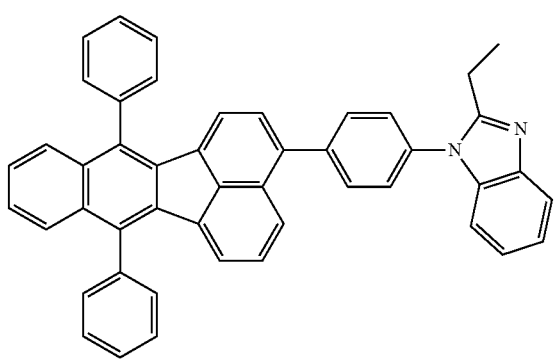
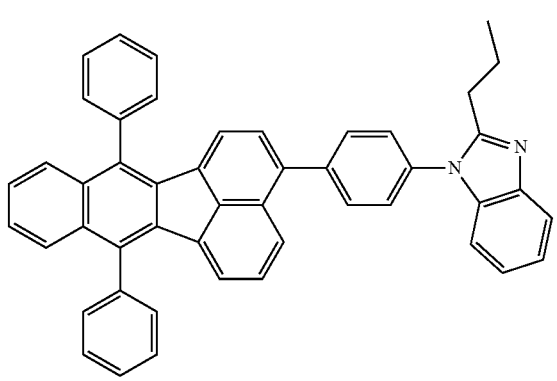
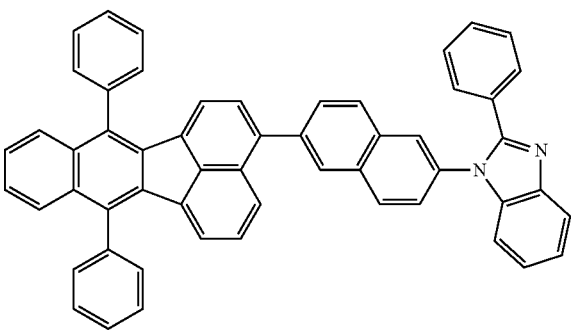
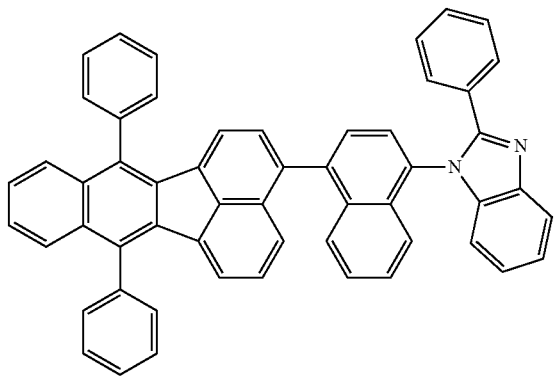

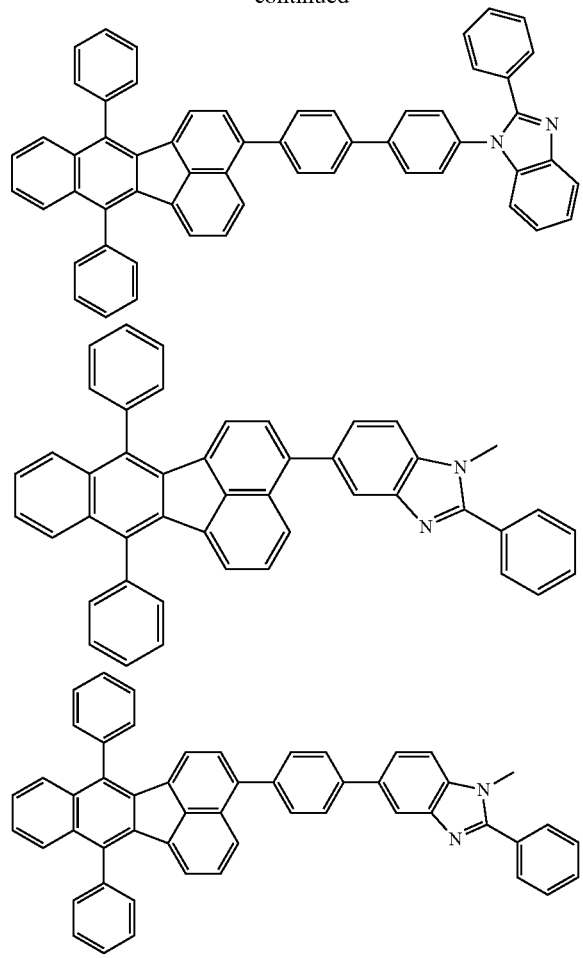

The mobility of the barrier material is preferably $10^{-6}$ cm$^2$/Vs or more. The mobility of the barrier material is more preferably $10^{-5}$ cm$^2$/Vs or more. The term "mobility" used herein refers to a value measured at a thickness of 200 nm and a bias DC voltage of 5 V. As the measurement of the electron mobility of an organic material, the Time of Flight method and the like have been known. However, the term "mobility" used herein refers to an electron mobility determined by impedance spectroscopy.

The electron mobility is measured by impedance spectroscopy as described below. The barrier material that preferably has a thickness of about 100 nm to about 200 nm is held between the anode and the cathode. An AC voltage of 100 mV or less is applied to the barrier material while applying a bias DC voltage. An alternating current (absolute value and phase) that flows through the barrier material is measured. The measurement is performed while changing the frequency of the AC voltage, and the complex impedance (Z) is calculated from the current value and the voltage value. The frequency dependence of the imaginary part (ImM) of the modulus M=iωZ (i: imaginary unit, ω: angular frequency) is determined, and the reciprocal of the frequency ω at which the imaginary part 1 mM becomes a maximum is defined as the response time of electrons that transfer within the barrier layer. The electron mobility is calculated by the following expression.

Electron mobility=(thickness of barrier material)$^2$/ (response time×bias DC voltage)

It is preferable that the barrier layer include a donor that reduces the barrier material in addition to the barrier material. The carrier concentration increases when the barrier layer includes the reducing donor.

Examples of the reducing donor include one substance or two or more substances selected from the group consisting of alkali metals, alkaline-earth metals, rare earth metals, alkali metal oxides, alkali metal halides, alkaline-earth metal oxides, alkaline-earth metal halides, rare earth metal oxides, rare earth metal halides, organic complexes of alkali metals, organic complexes of alkaline-earth metals, and organic complexes of rare earth metals.

The emitting layer may include two or more fluorescent dopant materials having a main peak wavelength of 550 nm or less.

A small-work-function metal-containing layer may be provided between the electron-transporting region and the cathode. The term "small-work-function metal-containing layer" used herein refers to a layer that includes a small-work-function metal or a small-work-function metal compound. The small-work-function metal-containing layer may be formed only of a small-work-function metal or a small-work-function metal compound, or may be formed by adding a small-work-function metal, a small-work-function metal compound, or a small-work-function metal complex (i.e., donor) to a material used to form the electron-transporting layer. The term "small-work-function metal" used herein refers to a metal that has a work function of 3.8 eV or less. Examples of the metal that has a work function of 3.8 eV or less include alkali metals, and alkaline-earth metals. Examples of the alkali metals include Li, Na, K, and Cs. Examples of the alkaline-earth metals include Mg, Ca, Sr, and Ba. Further examples of the metal that has a work function of 3.8 eV or less include Yb, Eu, and Ce. Examples of a preferable small-work-function metal compound include oxides, halides, carbonates, and borates of the small-work-function metals. Examples of the halides of the small-work-function metals include fluorides, chlorides, and bromides of the small-work-function metals. Among these, fluorides of the small-work-function metals are preferable. For example, LiF is preferably used. Examples of a preferable small-work-function metal complex include organic complexes of alkali metals, alkaline-earth metals, and rare earth metals.

<Measurement of TFT Ratio>

When the triplet energies of the host, the dopant and the material for the blocking layer satisfy the specified relationship, the ratio of the luminous intensity derived from TTF can be 30% or more of the total emission. As a result, a high efficiency which cannot be realized by conventional fluorescent devices can be attained.

The ratio of luminous intensity derived from TTF can be measured by the transient EL method. The transient EL method is a technique for measuring an attenuating behavior (transient properties) of EL emission after removal of a DC voltage applied to a device. EL luminous intensity is classified into luminous components from singlet excitons which are generated by the first recombination and luminous components from singlet excitons generated through the TTF phenomenon. The lifetime of a singlet exciton is very short, i.e. on the nanosecond order. Therefore, singlet excitons decay quickly after removal of a DC voltage.

On the other hand, the TTF phenomenon is emission from singlet excitons which are generated by triplet excitons having a relatively long lifetime. Therefore, this emission decays slowly. As apparent from the above, since emission from singlet excitons and emission from triplet excitons differ largely in respect of time, the luminous intensity derived from TTF can be obtained. Specifically, the luminous intensity can be determined by the following method.

Figure 4:
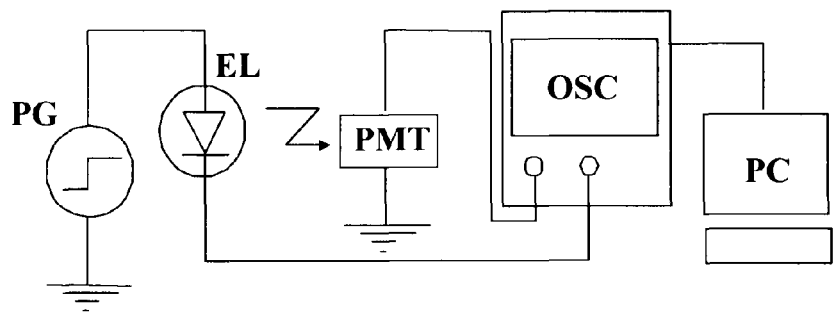
FIG. 4 is a view showing a transient EL waveform measurement method.

The transient EL waveform is measured as mentioned below (see FIG. 4). A pulse voltage waveform output from a voltage pulse generator (PG) is applied to an EL device. The voltage waveform of an applied voltage is captured by an oscilloscope (OSC). When a pulse voltage is applied to an EL device, the EL device gives pulse emission. This emission is captured by an oscilloscope (OSC) through a photomultiplier tube (PMT). The voltage waveform and the pulse emission are synchronized and the resultant is captured by a personal computer (PC).

Further, the ratio of the luminous intensity derived from TTF is determined as follows by the analysis of a transient EL waveform.

By solving the rate equation of the decay behavior of triplet excitons, the decay behavior of the luminous intensity based on the TTF phenomenon is modelized. The time decay of the density of triplet excitons $n_T$ within the emitting layer can be expressed by the following rate equation by using the decay rate $\alpha$ due to the life of triplet excitons and the decay rate $\gamma$ due to the collision of triplet excitons:

$$\frac{dn_T}{dt} = -\alpha \cdot n_T - \gamma \cdot n_T^2$$

By approximately solving this differential equation, the following formula can be obtained. Here, $I_{TTF}$ is a luminous intensity derived from TTF and A is a constant. If the transient EL emission is based on TTF, the inverse of the square root of the intensity is expressed as an approximately straight line. The measured transient EL waveform data is fit to the following approximation equation, thereby to obtain constant A. A luminous intensity $1/A^2$ when t=0 at which a DC voltage is removed is defined as a luminous intensity ratio derived from TTF.

$$\frac{1}{\sqrt{I_{TTF}}} \propto A + \gamma \cdot t$$

Figure 5:
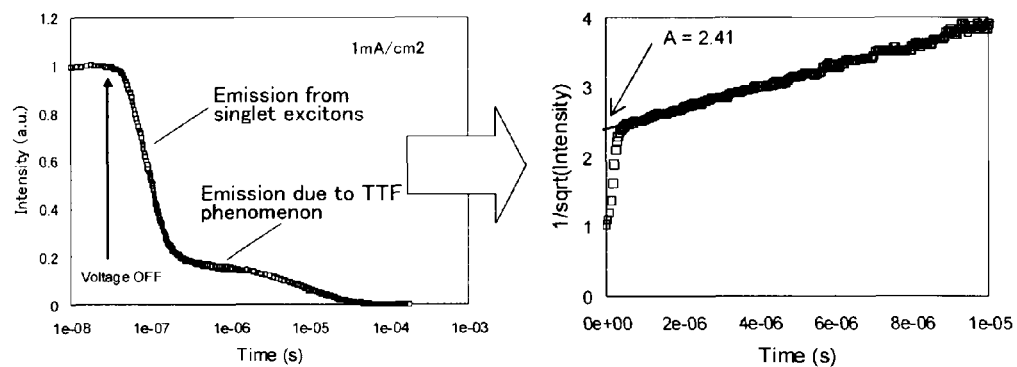
FIG. 5 is a view showing a method of measuring the ratio of the luminous intensity due to the TTF phenomenon.

The left graph in FIG. 5 is a measurement example in which a predetermined DC voltage was applied to an EL device and then removed, which shows changes with time in the luminous intensity of the EL device. In the left graph in FIG. 5, a DC voltage was removed after the lapse of about $3 \times 10^{-8}$ second. In the graph, the luminance when removing a voltage is shown as 1. After the rapid decay until about $2 \times 10^{-7}$ second, mild decay components appear. The right graph in FIG. 5 is obtained by setting the time of the removal of a voltage to zero and plotting the inverse of the root square of a luminous intensity until $10^{-5}$ second after the removal of a voltage. It is apparent that the graph can be very approximate to a straight line. When the straight line portion is extended to the time origin, the value of an intersection A of the straight line portion and the ordinate axis is 2.41. A luminous intensity ratio derived from TTF obtained from this transient EL waveform is $1/2.41^2=0.17$. This means that the luminous intensity derived from TTF accounts for 17% of the total emission intensity.

Second Embodiment

The device according to the invention may include at least two emitting layers (units including the emitting layer) (i.e.,
tandem device configuration). A carrier-generating layer (CGL) is provided between two emitting layers. The electron-transporting region may be provided corresponding to each unit. At least one of the emitting layers is a fluorescent emitting layer, and the unit including the fluorescent emitting layer satisfies the above requirements. Specific examples of the configuration are shown below. Each emitting layer may be formed by stacking a plurality of emitting layers.

Figure 6:
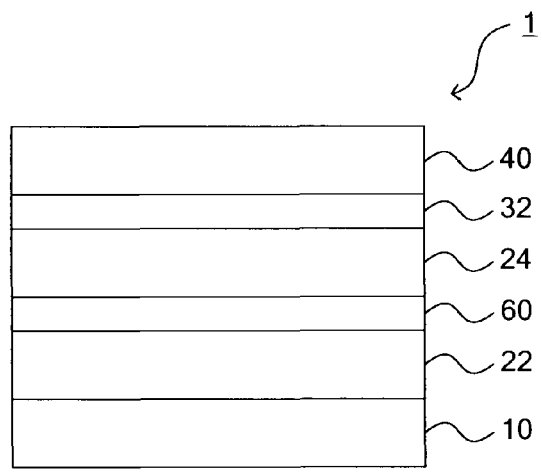
FIG. 6 is a view showing an example of an organic EL device according to a second embodiment.

Anode/fluorescent emitting layer/carrier-generating layer/fluorescent emitting layer/barrier layer/cathode Anode/fluorescent emitting layer/barrier layer/carrier-generating layer/fluorescent emitting layer/cathode Anode/fluorescent emitting layer/barrier layer/carrier-generating layer/fluorescent emitting layer/barrier layer/cathode Anode/phosphorescent emitting layer/carrier-generating layer/fluorescent emitting layer/barrier layer/cathode Anode/fluorescent emitting layer/barrier layer/carrier-generating layer/phosphorescent emitting layer/cathode FIG. 6 shows an example of an organic EL device according to a second embodiment of the invention. An organic EL device 1 includes an anode 10, emitting layers 22 and 24, and a cathode 40 that are stacked in this order. A carrier-generating layer 60 is provided between the emitting layers 22 and 24. A barrier layer 32 is provided adjacent to at least one of the emitting layer 22 or 24. At least one of the emitting layer 22 or 24 that is adjacent to the barrier layer 32 is a fluorescent emitting layer that satisfies the requirements of the invention. The emitting layer 22 or 24 that is not adjacent to the barrier layer 32 may be a fluorescent emitting layer, or may be a phosphorescent emitting layer.

An electron-transporting region and/or a hole-transporting region may be provided between the emitting layers 22 and 24. The organic EL device may include three or more emitting layers, and may include two or more carrier-generating layers. When the organic EL device includes three or more emitting layers, the carrier-generating layer may not be provided between some of the emitting layers.

The carrier-generating layer may be formed using the material disclosed in U.S. Pat. No. 7,358,661, U.S. patent application Ser. No. 10/562,124, or the like.

Third Embodiment

An organic EL device according to a third embodiment of the invention includes an anode, a plurality of emitting layers, an electron-transporting region, and a cathode that are stacked in this order, and includes a carrier barrier layer between two emitting layers among the plurality of emitting layers, the emitting layer that is adjacent to the electron-transporting region being a fluorescent emitting layer that satisfies the above requirements.

Examples of a preferable configuration of the organic EL device according to the third embodiment include a configuration in which an anode, a first emitting layer, a carrier barrier layer, a second emitting layer, and a cathode are stacked in this order (see Japanese Patent No. 4134280, US2007/0273270A1, and WO2008/023623A1), wherein an electron-transporting region that includes a barrier layer that prevents diffusion of triplet excitons is provided between the second emitting layer and the cathode. The term "carrier barrier layer" used herein refers to a layer that adjusts injection of carriers into the emitting layer, and adjusts the carrier balance between electrons and holes injected into the emitting layer by providing an HOMO level/LUMO level energy barrier between the adjacent emitting layers.

Specific examples of the configuration are shown below.

Anode/first emitting layer/carrier barrier layer/second emitting layer/electron-transporting region/cathode Anode/first emitting layer/carrier barrier layer/second emitting layer/third emitting layer/electron-transporting region/cathode It is preferable to provide a hole-transporting region between the anode and the first emitting layer in the same manner as in the above embodiments.

Figure 7:
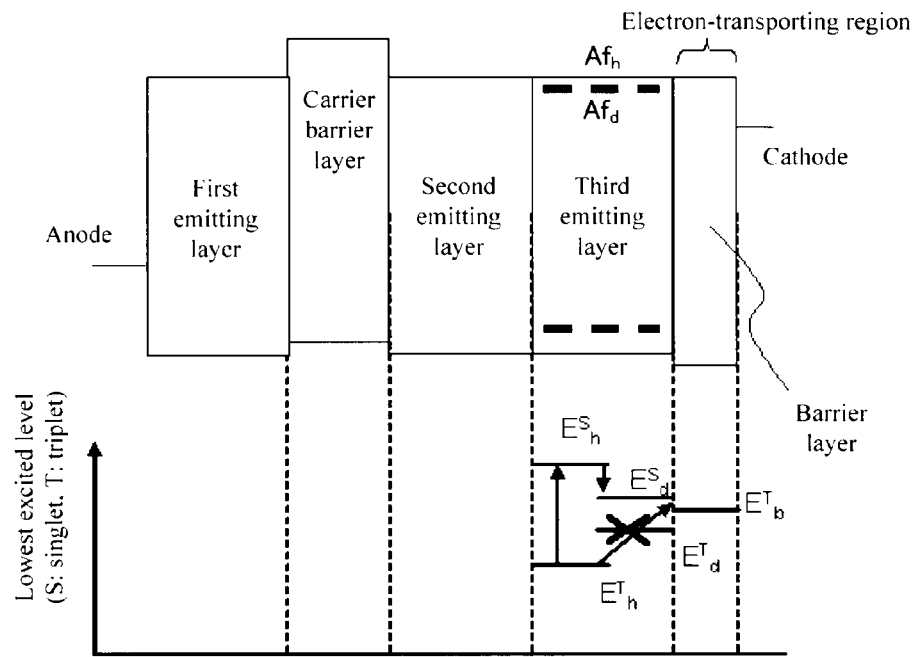
FIG. 7 is a view showing an example of an organic EL device according to a third embodiment.

FIG. 7 shows an example of the organic EL device according to the third embodiment. The upper part of FIG. 7 shows the device configuration, and the HOMO energy level and the LUMO energy level of each layer. The lower part of FIG. 7 shows the relationship between the energy gap of the third emitting layer and the energy gap of the barrier layer.

An organic EL device 2 shown in FIG. 7 includes an anode, a first emitting layer, a second emitting layer, a third emitting layer, an electron-transporting region, and a cathode that are stacked in this order, and further includes a carrier barrier layer between the first emitting layer and the second emitting layer. The electron-transporting region includes a barrier layer. The third emitting layer is a fluorescent emitting layer that satisfies the requirements of the invention. The first emitting layer and the second emitting layer may be a fluorescent emitting layer, or may be a phosphorescent emitting layer.

The device according to the third embodiment may be suitable as a white emitting device. White light may be emitted by adjusting the emission color of the first emitting layer, the second emitting layer, and the third emitting layer. The device may include only the first emitting layer and the second emitting layer as the emitting layers, and white light may be emitted by adjusting the emission color of the first emitting layer and the second emitting layer. In this case, the second emitting layer is a fluorescent emitting layer that satisfies the requirements of the invention.

In particular, a white emitting device that includes only a fluorescent material, but exhibits a high luminous efficiency as compared with a conventional white emitting device can be implemented by utilizing a hole-transporting material as a host material for the first emitting layer, adding a fluorescent dopant material having a main peak wavelength of greater than 550 nm to the host material, utilizing an electron-transporting material as a host material for the second emitting layer (and the third emitting layer), and adding a fluorescent dopant material having a main peak wavelength of 550 nm or less to the host material.

In particular, referring to the hole-transporting layer adjacent to the emitting layer, in order to effectively cause the TTF phenomenon to occur, it is preferable that the triplet energy of the hole-transporting material be larger than the triplet energy of the host material. However, since the triplet energy of a normal hole-transporting material is larger than that of the host material, it is considered that selection of the hole-transporting material is not a special matter of device design when achieving the effects and advantages of the invention.

Fourth Embodiment

In a fourth embodiment of the invention, a blue pixel, a green pixel, and a red pixel are arranged on a substrate. Among them, the blue pixel and/or the green pixel has the configuration according to the first embodiment.

Figure 8:
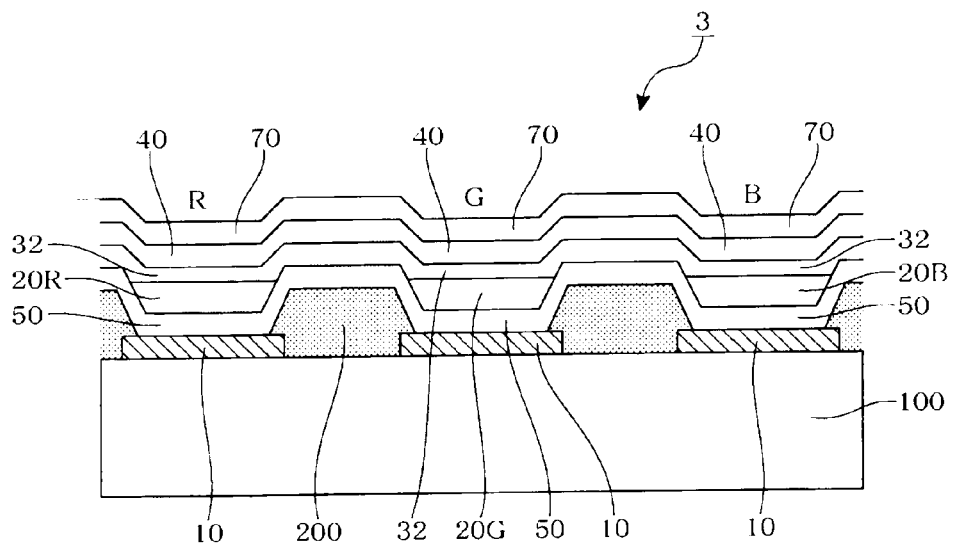
FIG. 8 is a view showing an example of an organic EL device according to a fourth embodiment.

FIG. 8 shows an example of an organic EL device according to the fourth embodiment.

In a top-emission organic EL device 3, a blue pixel B, a green pixel G, and a red pixel R are arranged in parallel on a common substrate 100.

The blue pixel B includes an anode 10, a hole-transporting region 50, a blue-emitting layer 20B, an electron-transporting region that includes a barrier layer 32, a cathode 40, and a protective layer 70, sequentially.

The green pixel G includes an anode 10, a hole-transporting region 50, a green-emitting layer 20G, an electron-transporting region that includes a barrier layer 32, a cathode 40, and a protective layer 70, sequentially.

The red pixel R includes an anode 10, a hole-transporting region 50, a red-emitting layer 20R, an electron-transporting region that includes a barrier layer 32, a cathode 40, and a protective layer 70, sequentially.

An insulating film 200 is formed between the anodes of the adjacent pixels so as to insulate the adjacent pixels.

In the organic EL device 3, the barrier layer is provided in common for the blue pixel B, the red pixel R, and the green pixel G.

The barrier layer included in a blue fluorescent device achieves a significant effect on luminous efficiency in compared with that has been attained. Note that the barrier layer can confine the energy of triplet excitons in the emitting layer when used for a green fluorescent device or a red fluorescent device. Therefore, the luminous efficiency is similarly expected to be improved.

It is also possible to confine the energy of triplet excitons in a phosphorescent emitting layer, and prevent diffusion of triplet excitons. This makes it possible to improve the luminous efficiency of the phosphorescent dopant material.

The hole-transporting region includes a hole-injecting layer and/or a hole-transporting layer, for example. The hole-transporting region may or may not be provided corresponding to each pixel in common. The hole-transporting region is normally configured to be suitable for each emission color.

The organic layer that includes the emitting layers 20B, 20G, and 20R and the barrier layer is not limited to the configuration shown in FIG. 8. The configuration of the organic layer may be appropriately changed.

It is preferable that the green-emitting layer include a host material and a dopant material described below. A fused aromatic ring derivative is preferable as the host material. An anthracene derivative, a pyrene derivative, or the like is preferable as the fused aromatic ring derivative from the viewpoint of the luminous efficiency and the lifetime.

A heteroring-containing compound may also be used as the host material. Examples of the heteroring-containing compound include carbazole derivatives, dibenzofuran derivatives, ladder-type furan compounds, and pyrimidine derivatives.

The dopant material is not limited as long as the dopant material functions as a dopant, but is preferably an aromatic amine derivative from the viewpoint of the luminous efficiency and the like. A fused aromatic ring derivative that includes a substituted or unsubstituted arylamino group is preferable as the aromatic amine derivative. Examples of such a compound include pyrene, anthracene, and chrysene that include an arylamino group.

A styrylamine compound is also preferable as the dopant material. Examples of the styrylamine compound include styrylamines, styryldiamines, styryltriamines, and styryltetramines. The term "styrylamine" used herein refers to a compound in which a substituted or unsubstituted arylamine is substituted with at least one arylvinyl group. The arylvinyl group may be substituted with a substituent. Examples of the substituent include an aryl group, a silyl group, an alkyl group, a cycloalkyl group, and an arylamino group. The substituent may be substituted with another substituent.

A boron complex or a fluoranthene compound is also preferable as the dopant material. A metal complex is also preferable as the dopant material. Examples of the metal complex include an iridium complex and a platinum complex.

It is preferable that the red-emitting layer include a host material and a dopant material described below. A fused aromatic ring derivative is preferable as the host material. A naphthacene derivative, a pentacene derivative, or the like is preferable as the fused aromatic ring derivative from the viewpoint of the luminous efficiency and the lifetime.

A fused polycyclic aromatic compound may also be used as the host material. Examples of the fused polycyclic aromatic compound include naphthalene compounds, phenanthrene compounds, and fluoranthene compounds.

An aromatic amine derivative is preferable as the dopant material. A fused aromatic ring derivative that includes a substituted or unsubstituted arylamino group is preferable as the aromatic amine derivative. Examples of such a compound include periflanthene that includes an arylamino group.

A metal complex is also preferable as the dopant material. Examples of the metal complex include an iridium complex and a platinum complex.

The device according to the fourth embodiment is fabricated as described below, for example.

An Ag—Pd—Cu (APC) layer (silver alloy layer) (reflective layer) and a transparent conductive layer (e.g., zinc oxide (IZO) film or a tin oxide film) are sequentially formed on a substrate. The conductive material layer is patterned using usual lithographic technology by etching the conductive material layer using a resist pattern as a mask to form an anode. An insulating film is formed on the anode by spin-coating a photosensitive resin (e.g., polyimide). The insulating film is then exposed, developed, and cured to expose the anode. A blue emitting region, a green emitting region, and a red emitting region are thus patterned.

A red pixel electrode, a green pixel electrode, and a blue pixel electrode are provided as the anode. The blue pixel electrode, the green pixel electrode, and the red pixel electrode respectively correspond to the blue emitting region, the green emitting region, and the red emitting region. The substrate is cleaned for 5 minutes using isopropyl alcohol, and then subjected to UV ozone cleaning for 30 minutes. A hole-injecting layer and a hole-transporting layer are then formed. Specifically, the hole-injecting layer is stacked over the entire surface of the substrate, and the hole-transporting layer is stacked on the hole-injecting layer. Emitting layers are formed corresponding to the positions of the red pixel anode, the green pixel anode, and the blue pixel anode. When using vacuum vapor deposition, the blue-emitting layer, the green-emitting layer, and the red-emitting layer are finely patterned using a shadow mask.

The barrier layer is then stacked over the entire surface of the substrate. If an electron-injecting layer is formed, then it is optionally stacked over the entire surface of the barrier layer. Mg and Ag are then deposited to form a semi-transparent cathode formed of an Mg—Ag alloy.

The substrate, the anode, the cathode, the hole-injecting layer, the hole-transporting layer, and the like used in the invention may be appropriately formed using the materials disclosed in PCT/JP2009/053247, PCT/JP2008/073180, U.S. patent application Ser. No. 12/376,236, U.S. patent application Ser. No. 11/766,281, U.S. patent application Ser. No. 12/280,364, and the like.

EXAMPLES

The following materials were used in the examples and comparative examples.

ETB1

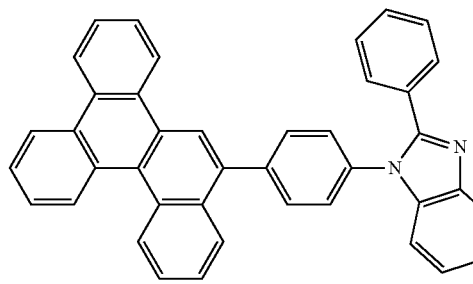

ETB2

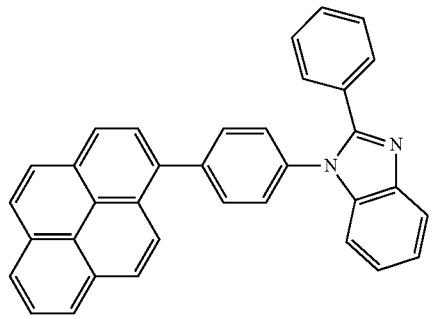

ETB3

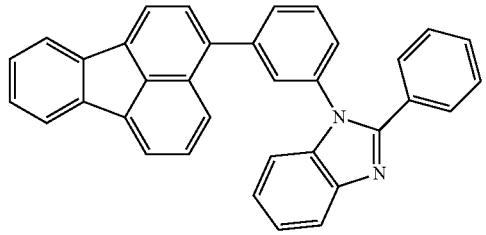

ETB4

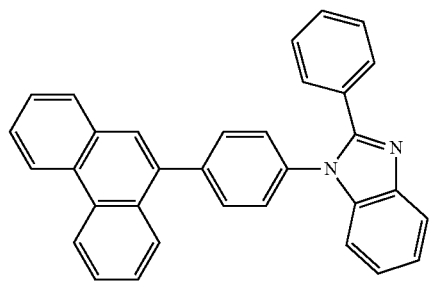

ETB5

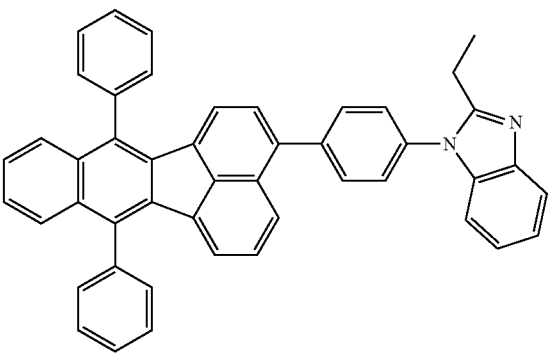

ETB6
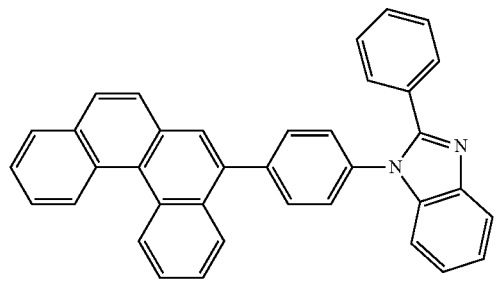
ETB7
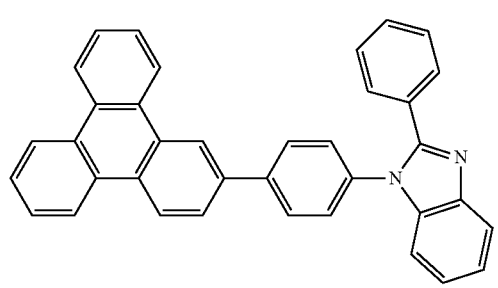
ETB8
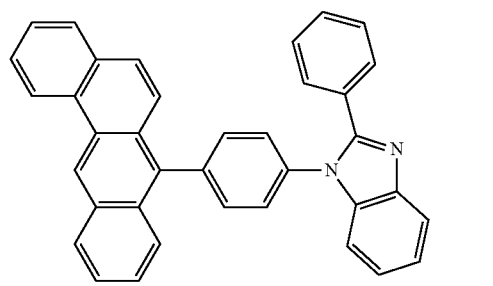
ETB9
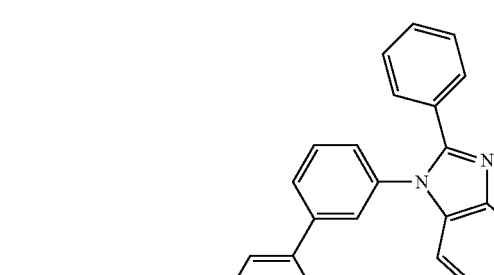
ETB10
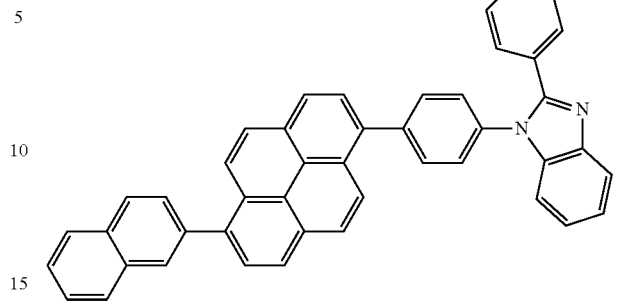
ETB11
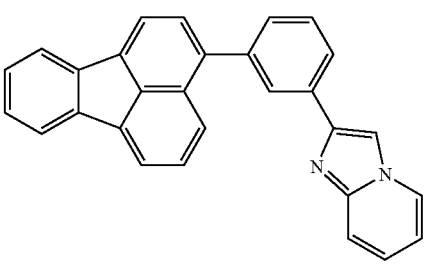
ETB12
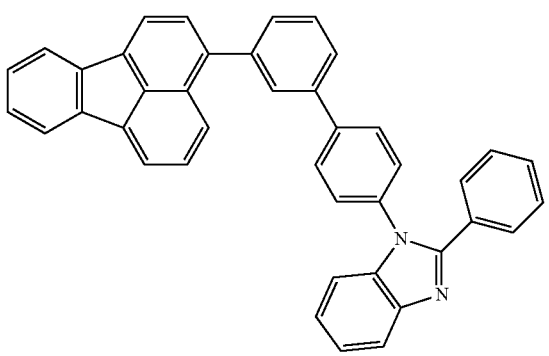
ETB13
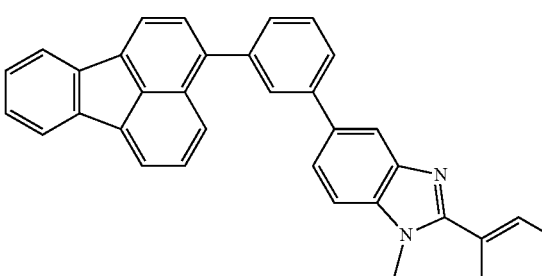
ETB14
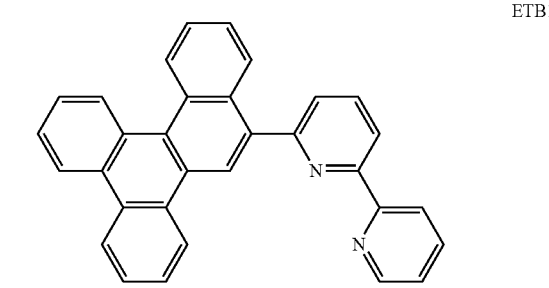

ET1
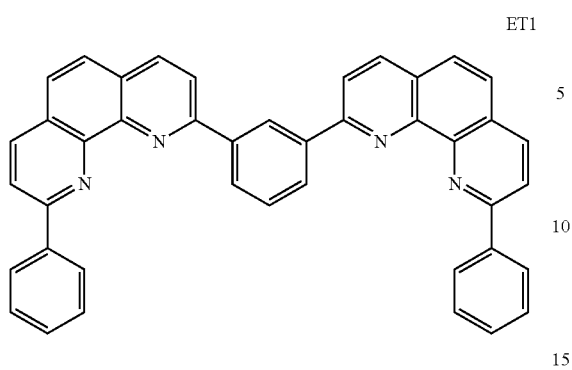
BH2
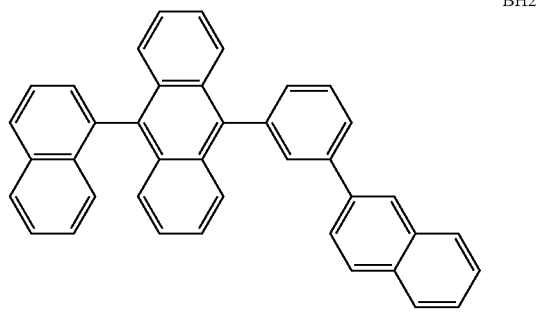
BD1
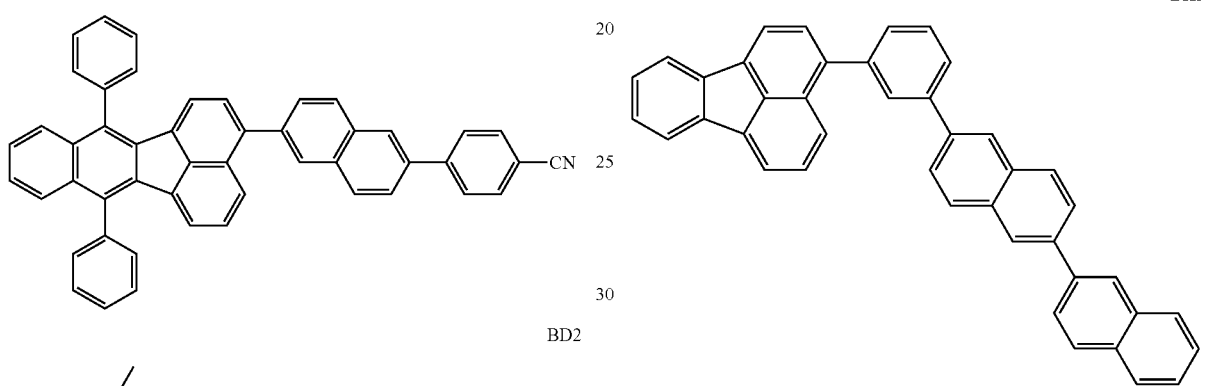
BH3
BD2
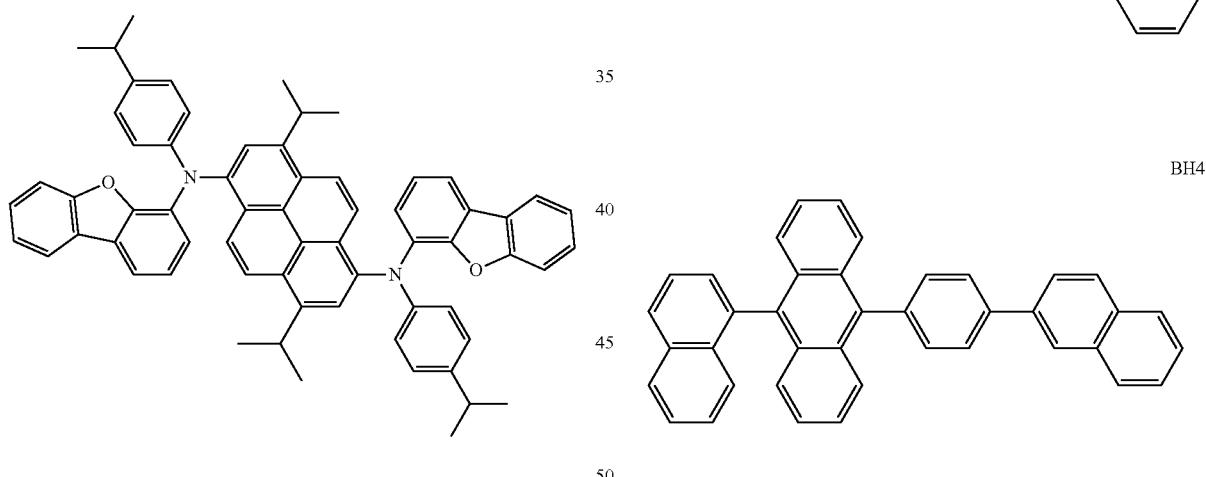
BH4
Main peak wavelength: 442 nm Main peak wavelength: 457 nm (fluorescence spectrum (toluene solution)) (fluorescence spectrum (toluene solution))
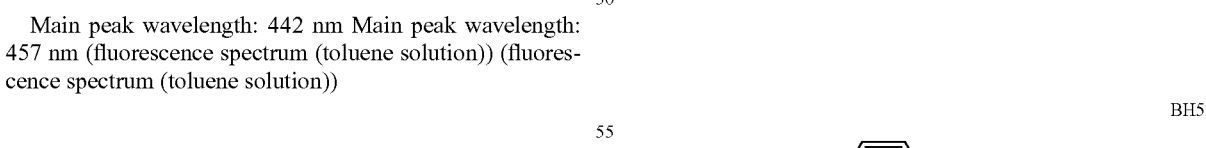
BH1
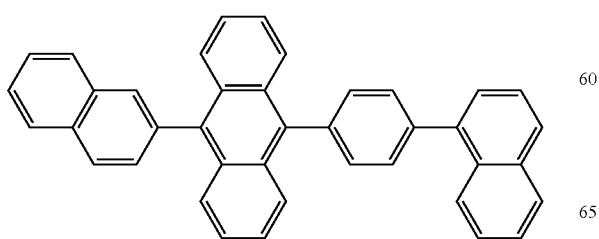
BH5
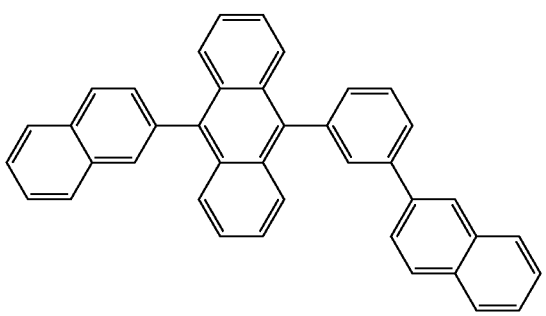

-continued

HT1

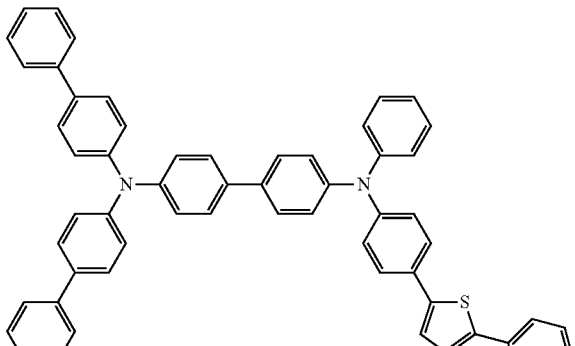

HT2

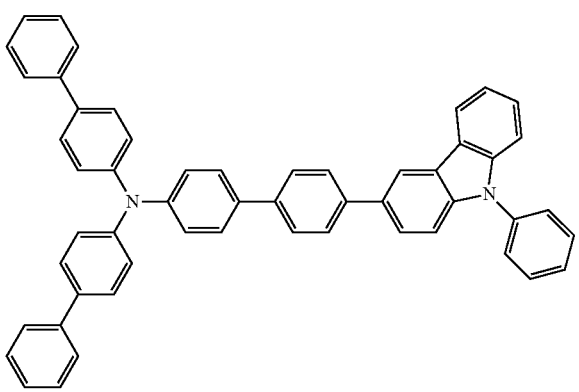

The property values of the materials are shown in Table 1. The property values were measured by the following methods.

(1) Triplet Energy ($E^T$)

The triplet energy ($E^T$) was measured using a fluorescence spectrophotometer "F-4500" (manufactured by Hitachi, Ltd.). The triplet energy ($E^T$) was converted by the following expression.

$E^T$ (eV)=1239.85/λedge

When a tangent to the shorter-wavelength-side edge of the phosphorescence spectrum (vertical axis: phosphorescence intensity, horizontal axis: wavelength) is drawn, "λedge" refers to the wavelength at the intersection of the tangent and the horizontal axis. The unit for "λedge" is nm.

Note that the triplet energy ($E^T$) may also be determined by the following quantum chemical calculations.

The quantum chemical calculations may be performed using a quantum chemical calculation program "Gaussian03" (manufactured by Gaussian (USA)). The program "Gaussian03" was developed by J. A. Pople (winner of the 1998 Nobel Prize in Chemistry) et al. The program "Gaussian03" can estimate the properties (e.g., energy, structure, and normal vibration) of molecules of various molecular systems by utilizing various quantum chemical calculation methods. The density functional theory (DFT) is used for the quantum chemical calculations. The structure is optimized using the B3LYP functional and the 6-31G* basis function, and the triplet energy is calculated by the time-dependent density functional theory (TD-DFT).

A phosphorescence spectrum may not be observed for a specific organic compound. In this case, the triplet energy ($E^T$) calculated using the above quantum chemical calculations is used for the assumption.

The triplet energy of each cyclic structure is shown below.

Benzene: 3.67 eV

Phenanthrene: 2.70 eV

Naphthalene: 2.63 eV

Benzo[g]chrysene: 2.43 eV

Fluoranthene: 2.30 eV

Pyrene: 2.11 eV

Anthracene: 1.85 eV

Benzimidazole: 3.31 eV 1,10-Phenanthroline: 2.75 eV (2) Ionization Potential

The ionization potential was measured using a device for performing photoelectron spectroscopy in air ("AC-3" manufactured by Riken Keiki Co., Ltd.). Specifically, light was applied to the material, and the amount of electrons generated due to charge separation was measured.

(3) Affinity (Af)

The affinity was calculated from the ionization potential measured and the energy gap measured. The energy gap was measured from the absorption edge of the absorption spectrum in benzene. Specifically, the absorption spectrum was measured using a commercially available ultraviolet-visible spectrophotometer, and the energy gap was calculated from the wavelength at the rising edge of the absorption spectrum.

TABLE 1

| Compound name | Ip (eV) | Af (eV) | $E^S$ (eV) | $E^T$ (eV) |
|---|---|---|---|---|
| ETB1 | 6.04 | 2.72 | 3.32 | 2.40 |
| ETB2 | 5.91 | 2.61 | 3.30 | 2.10 |
| ETB3 | 6.03 | 2.91 | 3.12 | 2.27 |
| ETB4 | 6.28 | 2.52 | 3.76 | 2.50 |
| ETB5 | 6.01 | 3.17 | 2.84 | 2.15 |
| ETB6 | 6.12 | 2.66 | 3.46 | 2.46 |
| ETB7 | 6.19 | 2.56 | 3.63 | 2.69 |
| ETB8 | 6.00 | 2.81 | 3.19 | 2.09 |
| ETB9 | 6.06 | 3.03 | 3.03 | 2.23 |
| ETB10 | 5.99 | 2.88 | 3.11 | 2.14 |
| ETB11 | 6.03 | 2.91 | 3.12 | 2.26 |
| ETB12 | 6.20 | 3.13 | 3.07 | 2.26 |
| ETB13 | 6.00 | 3.11 | 2.88 | 2.26 |
| ETB14 | 5.88 | 2.59 | 3.29 | 2.36 |
| ET1 | 6.13 | 2.84 | 3.29 | 2.60 |
| BD1 | 5.95 | 3.14 | 2.81 | 2.14 |
| BD2 | 5.48 | 2.72 | 2.80 | 2.10 |
| BH1 | 6.02 | 3.02 | 3.00 | 1.83 |
| BH2 | 6.02 | 2.98 | 3.04 | 1.83 |
| BH3 | 6.12 | 3.00 | 3.12 | 2.27 |
| BH4 | 5.98 | 2.97 | 3.01 | 1.83 |
| BH5 | 6.00 | 2.99 | 3.01 | 1.82 |
| HT1 | 5.50 | 2.47 | 3.03 | 2.64 |
| HT2 | 5.60 | 2.33 | 3.27 | 2.60 |

Synthesis Example 1

(A) Synthesis of benzo[g]chrysene-10-boronic acid

Benzo[g]chrysene-10-boronic acid was synthesized in accordance with the following synthesis scheme.

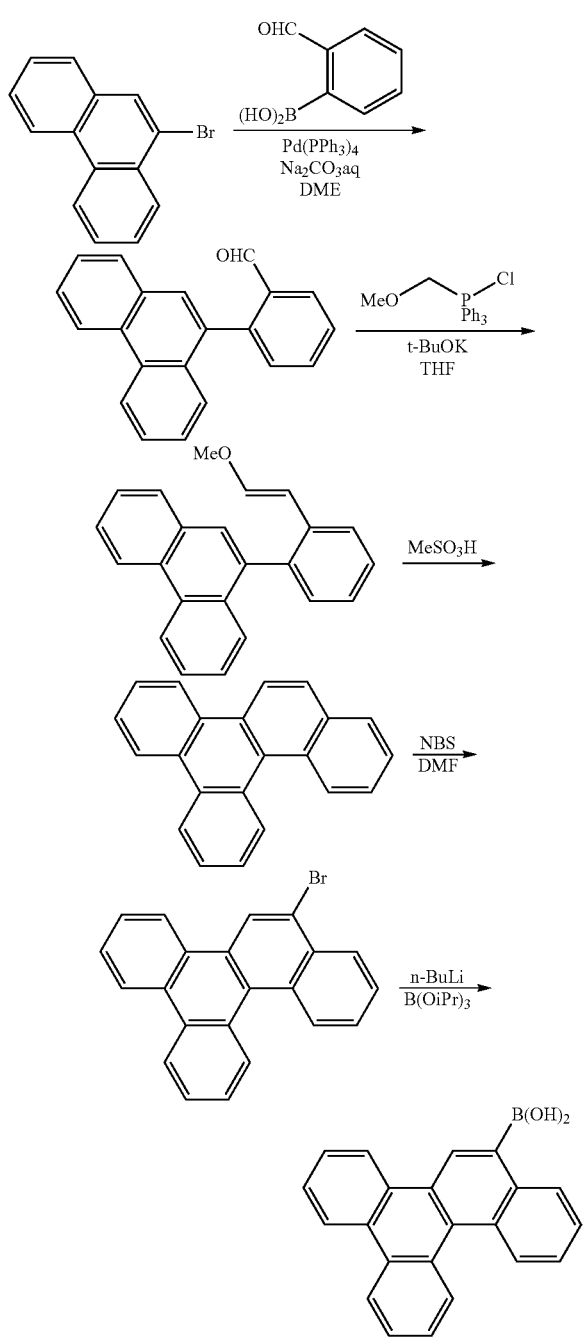

(A-1) Synthesis of 9-(2-formylphenyl)phenanthrene

A flask was charged with 25.7 g of 9-bromophenanthrene, 16.5 g of 2-formylphenylboronic acid, and 2.31 g of tetrakis(triphenylphosphine)palladium(0) in an argon atmosphere. After the addition of 340 mL of dimethyl ether (DME) and 170 mL of a 2 M sodium carbonate aqueous solution, the mixture was heat refluxed with stirring for 8 hours. After cooling the mixture to room temperature, the aqueous phase was removed. The organic phase was washed with water and a saturated sodium chloride solution, and dried over magnesium sulfate. After removing magnesium sulfate by filtration, the organic phase was concentrated. The residue was purified by silica gel column chromatography to obtain 25.0 g of the target 9-(2-formylphenyl)phenanthrene (yield: 89%).

(A-2) Synthesis of 9-[2-(2-methoxyvinyl)phenyl]phenanthrene

A reaction vessel was charged with 25.0 g of 9-(2-formylphenyl)phenanthrene, 33.4 g of methoxymethyltriphenylphosphonium chloride, and 300 mL of tetrahydrofuran (THF) in an argon atmosphere. 11.9 g of t-butoxypotassium was added to the mixture at room temperature with stirring. After stirring the reaction solution at room temperature for 2 hours, 200 mL of water was added to the reaction solution. The reaction solution was extracted with diethyl ether, and the aqueous phase was removed. The organic phase was washed with water and a saturated sodium chloride solution, and dried over magnesium sulfate. After removing magnesium sulfate by filtration, the organic phase was concentrated. The residue was purified by silica gel column chromatography to obtain 24.0 g of the target 9-[2-(2-methoxyvinyl)phenyl]phenanthrene (yield: 87%).

(A-3) Synthesis of benzo[g]chrysene

A reaction vessel was charged with 24.0 g of 9-[2-(2-methoxyvinyl)phenyl]phenanthrene and 100 mL of dichloromethane. 6 drops of methanesulfonic acid were added to the mixture using a Pasteur pipette at room temperature with stirring. The mixture was stirred at room temperature for 8 hours. After completion of the reaction, 100 mL of a 10% potassium carbonate aqueous solution was added to the mixture. After removing the aqueous phase, the organic phase was washed with water and a saturated sodium chloride solution, and dried over magnesium sulfate. After removing magnesium sulfate by filtration, the organic phase was concentrated. The residue was purified by silica gel column chromatography to obtain 5.21 g of the target benzo[g]chrysene (yield: 25%).

(A-4) Synthesis of 10-bromobenzo[g]chrysene

A flask was charged with 5.21 g of benzo[g]chrysene and 50 mL of N,N-dimethylformamide. An N,N-dimethylformamide (10 mL) solution of 4.00 g of N-bromosuccinimide was added to the mixture. The mixture was stirred at 80° C. for 8 hours. After cooling the mixture to room temperature, the reaction solution was poured into 200 mL of water. A solid that precipitated by this operation was collected by filtration, and washed with water and methanol. The resulting solid was purified by silica gel column chromatography to obtain 5.87 g of the target 10-bromobenzo[g]chrysene (yield: 88%).

(A-5) Synthesis of benzo[g]chrysene-10-boronic acid

A flask was charged with 5.87 g of 10-bromobenzo[g]chrysene in an argon atmosphere. 100 mL of dehydrated diethyl ether was then added to the flask. After cooling the reaction solution to −40° C., 11 mL of a 1.6 M hexane solution of n-butyllithium was added to the reaction solution. The mixture was heated to 0° C., and stirred for 1 hour. After cooling the reaction solution to −60° C., a dehydrated diethyl ether (10 mL) solution of 7.72 g of triisopropyl borate was added dropwise to the reaction solution. The reaction solution was stirred at room temperature for 5 hours. After the addition of 50 mL of a 10% hydrochloric acid aqueous solution, the mixture was stirred for 1 hour. After removing the aqueous phase, the organic phase was washed with water and a saturated sodium chloride solution, and dried over magnesium sulfate. After removing magnesium sulfate by filtration, the organic phase was concentrated. The resulting solid was washed with hexane to obtain 3.18 g of the target benzo[g]chrysene-10-boronic acid (yield: 60%).

Synthesis Example 2

(B) Synthesis of 1-(4-bromophenyl)-2-phenyl-1H-benzimidazole 1-(4-Bromophenyl)-2-phenyl-1H-benzimidazole was synthesized in accordance with the following synthesis scheme.

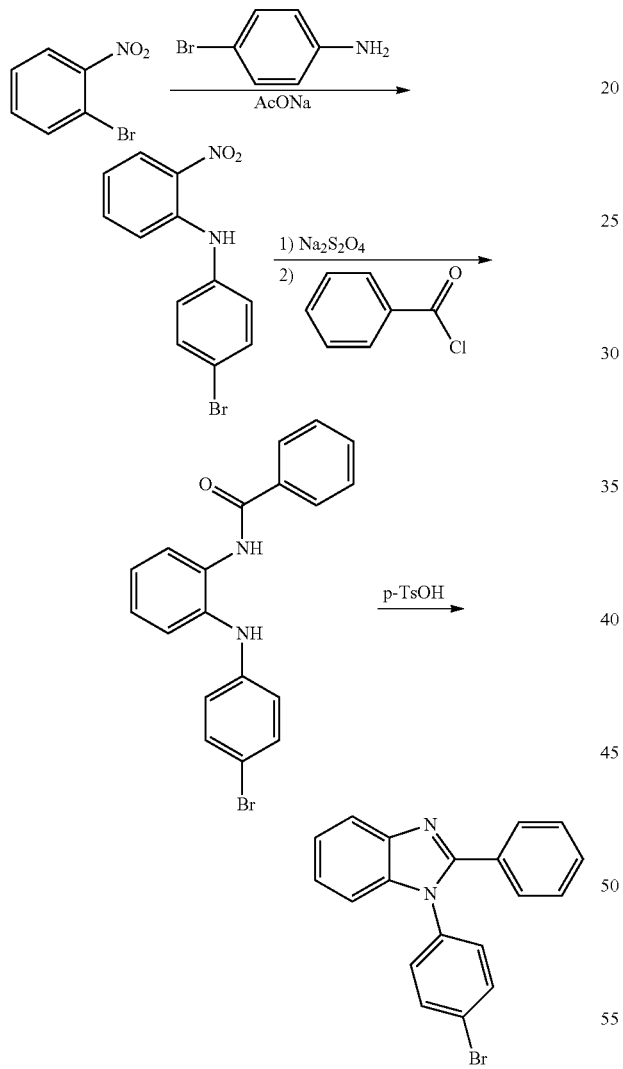

(B-1) Synthesis of (4-bromophenyl)-(2-nitrophenyl)amine 10 g (49.5 mmol) of 2-bromonitrobenzene, 13 g (163 mmol) of sodium acetate, and 10 g (59 mmol) of 4-bromoaniline were stirred at 180° C. for 8 hours in an argon atmosphere. After cooling the reaction solution to room temperature, the reaction solution was diluted with ethyl acetate, and filtered. After concentrating the filtrate, the residue was washed with methanol to obtain 3.8 g of (4-bromophenyl)-(2-nitrophenyl)amine as an orange crystal (yield: 22%).

(B-2) Synthesis of N-[2-(4-bromophenylamino)phenyl]benzamide 3.8 g (13 mmol) of (4-bromophenyl)-(2-nitrophenyl)amine was dissolved in 30 mL of tetrahydrofuran. A solution of 11 g (64 mmol) of sodium hydrosulfite in 30 mL of water was added dropwise to the solution while stirring the solution at room temperature in an argon atmosphere. After stirring the mixture for 5 hours, 20 mL of ethyl acetate was added to the mixture. A solution of 2.2 g (26 mmol) of sodium hydrogencarbonate in 20 mL of water was then added to the mixture. After the dropwise addition of a solution of 2.5 g (18 mmol) of benzoyl chloride in 10 mL of ethyl acetate, the mixture was stirred at room temperature for 1 hour. The mixture was then extracted with ethyl acetate, washed with water and a saturated sodium chloride solution sequentially, and dried over anhydrous sodium sulfate. The solvent was then evaporated under reduced pressure to obtain 2.1 g of N-[2-(4-bromophenylamino)phenyl]benzamide (yield: 45%).

(B-3) Synthesis of 1-(4-bromophenyl)-2-phenyl-1H-benzimidazole 2.1 g (5.7 mmol) of N-[2-(4-bromophenylamino)phenyl] benzamide was suspended in 30 mL of xylene. After the addition of 0.6 g (2.9 mmol) of p-toluenesulfonic acid monohydrate, the mixture was subjected to azeotropic dehydration under reflux for 3 hours. After allowing the reaction solution to cool, ethyl acetate, methylene chloride, and water were added to the reaction solution, and an insoluble component was removed by filtration. The organic phase was extracted from the mother filtrate, washed with water and a saturated sodium chloride solution, and dried over anhydrous sodium sulfate. The solvent was then evaporated under reduced pressure. The residue was purified by silica gel column chromatography to obtain 1.0 g of 1-(4-bromophenyl)-2-phenyl-1H-benzimidazole as a slightly pinkish white crystal (yield: 52%).

Synthesis Example 3

Synthesis of ETB1

A flask was charged with 3.0 g of benzo[g]chrysene-10-boronic acid, 3.5 g of 1-(4-bromophenyl)-2-phenyl-1H-benzimidazole, 0.231 g of tetrakis(triphenylphosphine)palladium(0), 40 mL of dimethoxyethane, and 20 mL of a 2 M sodium carbonate aqueous solution in an argon atmosphere. The mixture was heat refluxed with stirring for 8 hours. After cooling the reaction solution to room temperature, the reaction solution was extracted with toluene. After removing the aqueous phase, the organic phase was washed with water, and dried over magnesium sulfate. After filtering the organic phase, the solvent was evaporated under reduced pressure. The residue was purified by silica gel column chromatography to obtain 3.8 g of a light yellow solid. As a result of mass spectrum analysis, it was found that the resulting compound was the following compound (ETB1). The compound had a molecular weight of 546.21 (m/e=546).

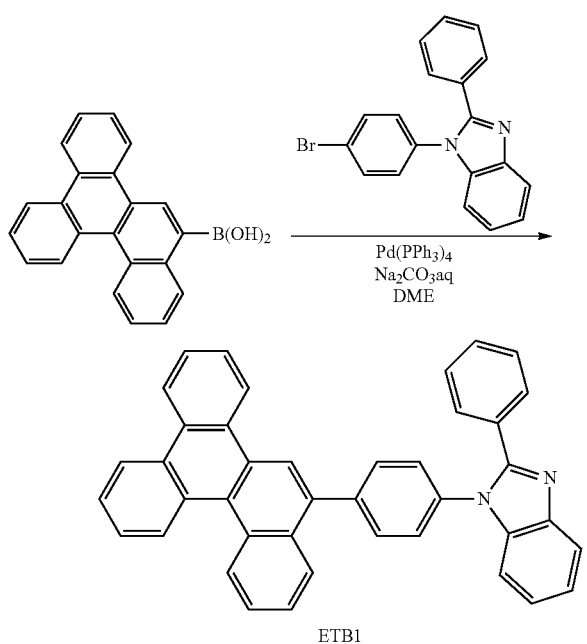

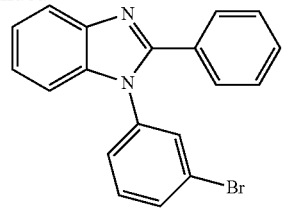

(C-1) Synthesis of (3-bromophenyl)-(2-nitrophenyl)amine 10 g (49.5 mmol) of 2-bromonitrobenzene, 13 g (163 mmol) of sodium acetate, and 10 g (59 mmol) of 3-bromoaniline were stirred at 180° C. for 8 hours in an argon atmosphere. After cooling the reaction solution to room temperature, the reaction solution was diluted with ethyl acetate, and filtered. After concentrating the filtrate, the residue was washed with methanol to obtain (3-bromophenyl)-(2-nitrophenyl)amine.

(C-2) Synthesis of N-[2-(3-bromophenylamino)phenyl]benzamide 3.8 g (13 mmol) of (3-bromophenyl)-(2-nitrophenyl)amine was dissolved in 30 mL of tetrahydrofuran. A solution of 11 g (64 mmol) of sodium hydrosulfite in 30 mL of water was added dropwise to the solution while stirring the solution at room temperature in an argon atmosphere. After stirring the mixture for 5 hours, 20 mL of ethyl acetate was added to the mixture. A solution of 2.2 g (26 mmol) of sodium hydrogencarbonate in 20 mL of water was then added to the mixture. After the dropwise addition of a solution of 2.5 g (18 mmol) of benzoyl chloride in 10 mL of ethyl acetate, the mixture was stirred at room temperature for 1 hour. The mixture was then extracted with ethyl acetate, washed with a 10% potassium carbonate aqueous solution, water, and a saturated sodium chloride solution sequentially, and dried over anhydrous sodium sulfate. The solvent was then evaporated under reduced pressure to obtain N-[2-(3-bromophenylamino)phenyl]benzamide.

(C-3) Synthesis of 1-(3-bromophenyl)-2-phenyl-1H-benzimidazole 2.1 g (5.7 mmol) of N-[2-(3-bromophenylamino)phenyl]benzamide was suspended in 30 mL of xylene. After the addition of 0.6 g (2.9 mmol) of p-toluenesulfonic acid monohydrate, the mixture was subjected to azeotropic dehydration under heat reflux for 3 hours. After allowing the reaction solution to cool, ethyl acetate, methylene chloride, and water were added to the reaction solution, and an insoluble component was removed by filtration. The organic phase was extracted from the mother filtrate, washed with water and a saturated sodium chloride solution, and dried over magnesium sulfate. The solvent was then evaporated under reduced pressure. The residue was purified by silica gel column chromatography to obtain 1-(3-bromophenyl)-2-phenyl-1H-benzimidazole.

Synthesis Example 5

Synthesis of ETB3

A flask was charged with 2.7 g of fluoranthene-3-boronic acid, 3.5 g of 1-(3-bromophenyl)-2-phenyl-1H-benzimida- Synthesis Example 4

(C) Synthesis of 1-(3-bromophenyl)-2-phenyl-1H-benzimidazole

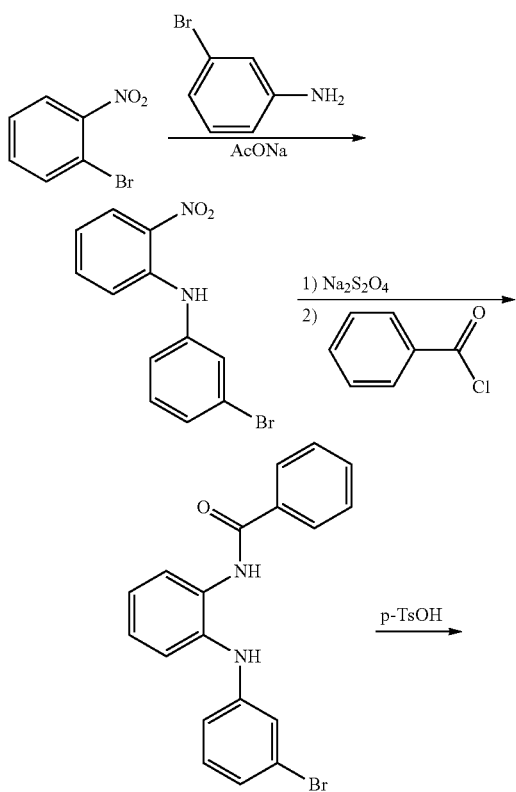

zole synthesized in Synthesis Example 4, 0.231 g of tetrakis (triphenylphosphine)palladium(0), 40 mL of dimethoxyethane, and 20 mL of a 2 M sodium carbonate aqueous solution in an argon atmosphere. The mixture was heat refluxed with stirring for 8 hours. After cooling the reaction solution to room temperature, the reaction solution was extracted with toluene. After removing the aqueous phase, the organic phase was washed with water, and dried over magnesium sulfate. After filtering the organic phase, the solvent was evaporated under reduced pressure. The residue was purified by silica gel column chromatography. As a result of mass spectrum analysis, it was found that the resulting purified product was the following compound (ETB3). The compound had a molecular weight of 470.18 (m/e=470).

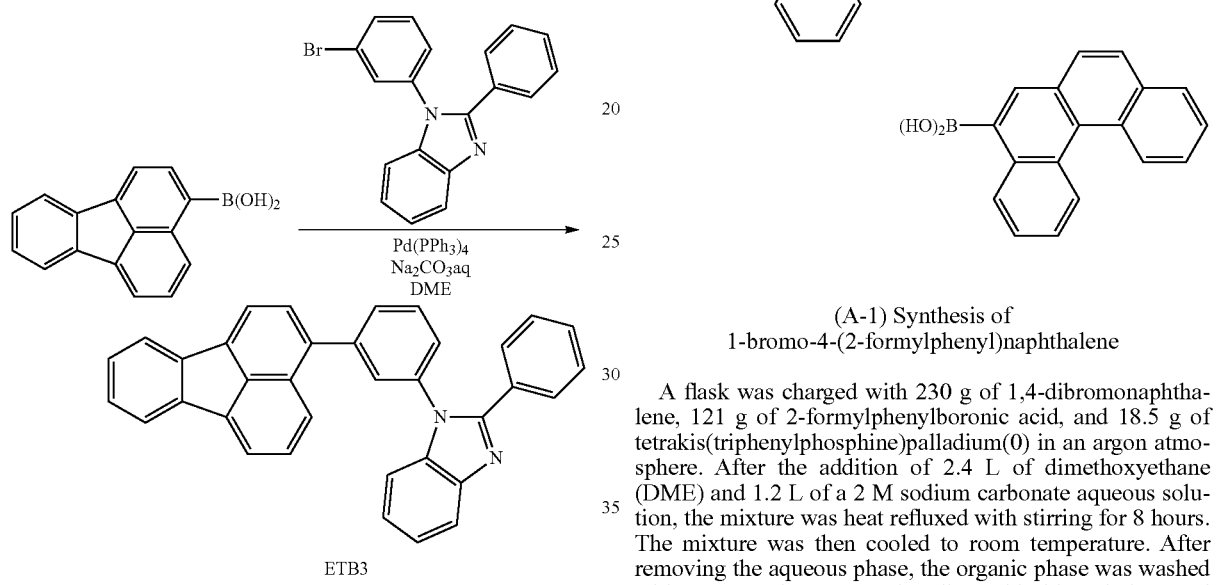

ETB3

Synthesis Example 6

(A) Synthesis of benzo[c]phenanthrene-5-boronic acid

Benzo[c]phenanthrene-5-boronic acid was synthesized in accordance with the following synthesis scheme.

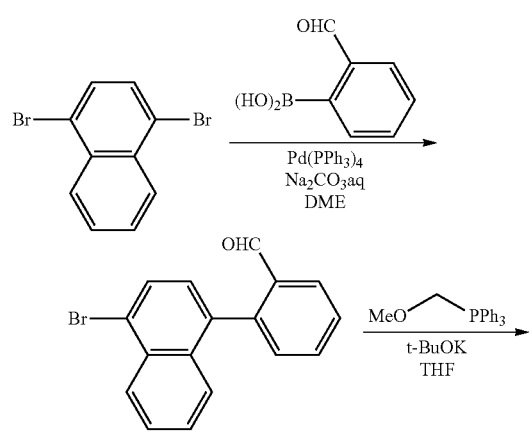

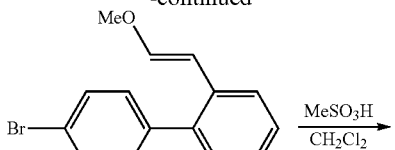

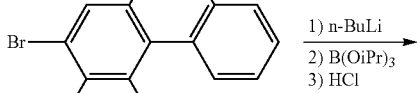

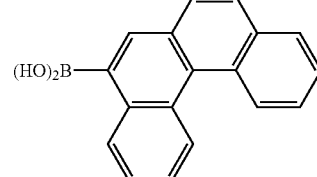

(A-1) Synthesis of 1-bromo-4-(2-formylphenyl)naphthalene

A flask was charged with 230 g of 1,4-dibromonaphthalene, 121 g of 2-formylphenylboronic acid, and 18.5 g of tetrakis(triphenylphosphine)palladium(0) in an argon atmosphere. After the addition of 2.4 L of dimethoxyethane (DME) and 1.2 L of a 2 M sodium carbonate aqueous solution, the mixture was heat refluxed with stirring for 8 hours. The mixture was then cooled to room temperature. After removing the aqueous phase, the organic phase was washed with water and a saturated sodium chloride solution, and dried over magnesium sulfate. After removing magnesium sulfate by filtration, the organic phase was concentrated. The residue was purified by silica gel column chromatography to obtain 170 g of the target 1-bromo-4-(2-formylphenyl)naphthalene (yield: 67%).

(A-2) Synthesis of 1-bromo-4-[2-(2-methoxyvinyl)phenyl]naphthalene

A reaction vessel was charged with 170 g of 1-bromo-4-(2-formylphenyl)naphthalene, 207 g of methoxymethyltriphenylphosphonium chloride, and 2.0 L of tetrahydrofuran (THF) in an argon atmosphere. 73.6 g of t-butoxypotassium was added to the mixture at room temperature with stirring. After stirring the reaction solution at room temperature for 2 hours, 1.5 L of water was added to the reaction solution. The reaction solution was extracted with diethyl ether, and the aqueous phase was removed. The organic phase was washed with water and a saturated sodium chloride solution, and dried over magnesium sulfate. After removing magnesium sulfate by filtration, the organic phase was concentrated. The residue was purified by silica gel column chromatography to obtain 180 g of the target 1-bromo-4-[2-(2-methoxyvinyl)phenyl]naphthalene (yield: 99%).

(A-3) Synthesis of 5-bromobenzo[c]phenanthrene

A reaction vessel was charged with 180 g of 1-bromo-4-[2-(2-methoxyvinyl)phenyl]naphthalene and 1.0 L of dichloromethane. 25 mL of methanesulfonic acid was added to the mixture at room temperature with stirring. The mixture was stirred at room temperature for 8 hours. After completion of the reaction, 1 L of a 10% potassium carbonate aqueous solution was added to the mixture. After removing the aqueous phase, the organic phase was washed with water and a saturated sodium chloride solution, and dried over magnesium sulfate. After removing magnesium sulfate by filtration, the organic phase was concentrated. The residue was purified by silica gel column chromatography to obtain 24.4 g of the target 5-bromobenzo[c]phenanthrene (yield: 15%).

(A-4) Synthesis of benzo[c]phenanthrene-5-boronic acid

A flask was charged with 10.1 g of 5-bromobenzo[c]phenanthrene in an argon atmosphere. 400 mL of dehydrated diethyl ether was then added to the flask. After cooling the reaction solution to −40° C., 22 mL of a 1.6 M hexane solution of n-butyllithium was added to the reaction solution. The mixture was heated to 0° C., and stirred for 1 hour. After cooling the reaction solution to −60° C., a dehydrated diethyl ether (10 mL) solution of 14.4 g of triisopropyl borate was added dropwise to the reaction solution. The reaction solution was stirred for 5 hours while warming the reaction solution up to room temperature. After the addition of 100 mL of a 10% hydrochloric acid aqueous solution, the mixture was stirred for 1 hour. After removing the aqueous phase, the organic phase was washed with water and a saturated sodium chloride solution, and dried over magnesium sulfate. After removing magnesium sulfate by filtration, the organic phase was concentrated. The resulting solid was washed with hexane to obtain 5.37 g of the target benzo[c]phenanthrene-5-boronic acid (yield: 60%).

Synthesis Example 7

(G) Synthesis of 2-(3-bromophenyl)-imidazo[1,2-a]pyridine 2-(3-Bromophenyl)-imidazo[1,2-a]pyridine was synthesized in the same manner as in Synthesis Example 6, except that 3-bromophenacyl bromide was used instead of 4-bromophenacyl bromide (see the following synthesis scheme).

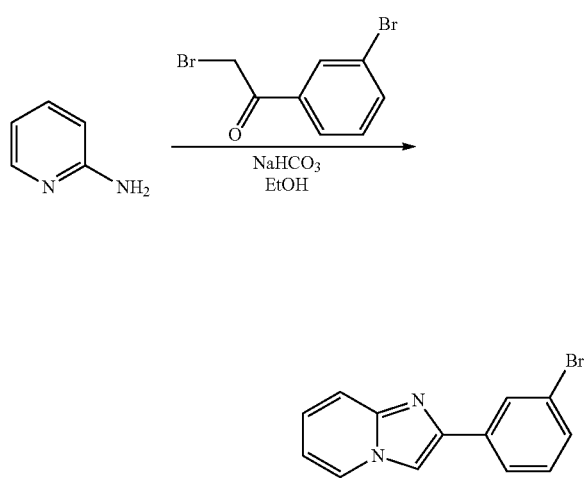

Synthesis Example 8

3-(Fluoranthen-3-yl)phenylboronic acid was synthesized in accordance with the following synthesis scheme.

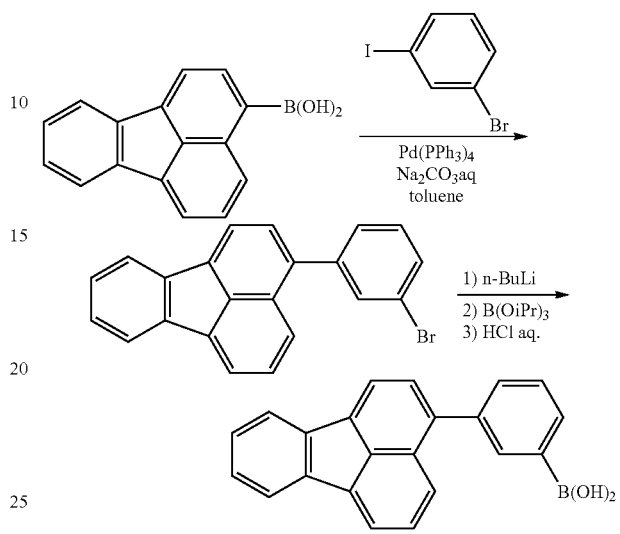

(H-1) Synthesis of 3-(3-bromophenyl)fluoranthene

A flask was charged with 9.1 g of fluoranthene-3-boronic acid, 10.5 g of 3-iodobromobenzene, 2.1 g of tetrakis(triphenylphosphine)palladium(0), 186 mL of toluene, and 74 mL of a 2 M sodium carbonate aqueous solution in an argon atmosphere. The mixture was stirred at 100° C. for 8 hours. After cooling the reaction solution to room temperature, the reaction solution was extracted with toluene. After removing the aqueous phase, the organic phase was washed with a saturated sodium chloride solution, and dried over anhydrous sodium sulfate. After filtering the organic phase, the solvent was evaporated under reduced pressure. The residue was purified by silica gel column chromatography to obtain 9.2 g of the target 3-(3-bromophenyl)fluoranthene (yield: 70%).

(H-2) Synthesis of 3-(fluoranthen-3-yl)phenylboronic acid

A flask was charged with 9.2 g of 3-(3-bromophenyl)fluoranthene and 129 mL of tetrahydrofuran. After cooling the reaction solution to −70° C., 17.2 mL of a 1.65 M hexane solution of n-butyllithium was added dropwise to the reaction solution. The mixture was stirred at −70° C. for 2 hours. After the dropwise addition of 17.7 mL of triisopropyl borate to the reaction solution, the reaction solution was stirred at −70° C. for 1 hour. The reaction solution was then stirred for 5 hours while heating the reaction solution to room temperature. After the addition of 2 M hydrochloric acid to the reaction solution so that the reaction solution had a pH in the acidic region, the reaction solution was extracted with ethyl acetate. After removing the aqueous phase, the organic phase was washed with a saturated sodium chloride solution, and dried over anhydrous sodium sulfate. After filtering the organic phase, the solvent was evaporated under reduced pressure. The residue was washed with a hexane-ethyl acetate mixture to obtain 7.9 g of the target 3-(fluoranthen-3-yl)phenylboronic acid (yield: 95%).

Synthesis Example 9

(J) Synthesis of 6-(fluoranthen-3-yl)naphthalen-2-ylboronic acid pinacol ester 6-(Fluoranthen-3-yl)naphthalen-2-ylboronic acid pinacol ester was synthesized in accordance with the following synthesis scheme.

addition of 0.5 mL of trifluoromethanesulfonic acid to the reaction solution, the reaction solution was stirred for 30 minutes. After quenching the reaction by carefully adding water dropwise to the reaction mixture, 200 mL of 0.5 M hydrochloric acid was added to the reaction solution. The solution was then extracted with dichloromethane. After removing the aqueous phase, the organic phase was dried over anhydrous sodium sulfate. After filtering the organic phase, the solvent was evaporated under reduced pressure. The residue was recrystallized from toluene to obtain 3.11 g of the target 6-(fluoranthen-3-yl)-2-trifluoromethanesulfoxynaphthalene (yield: 82%).

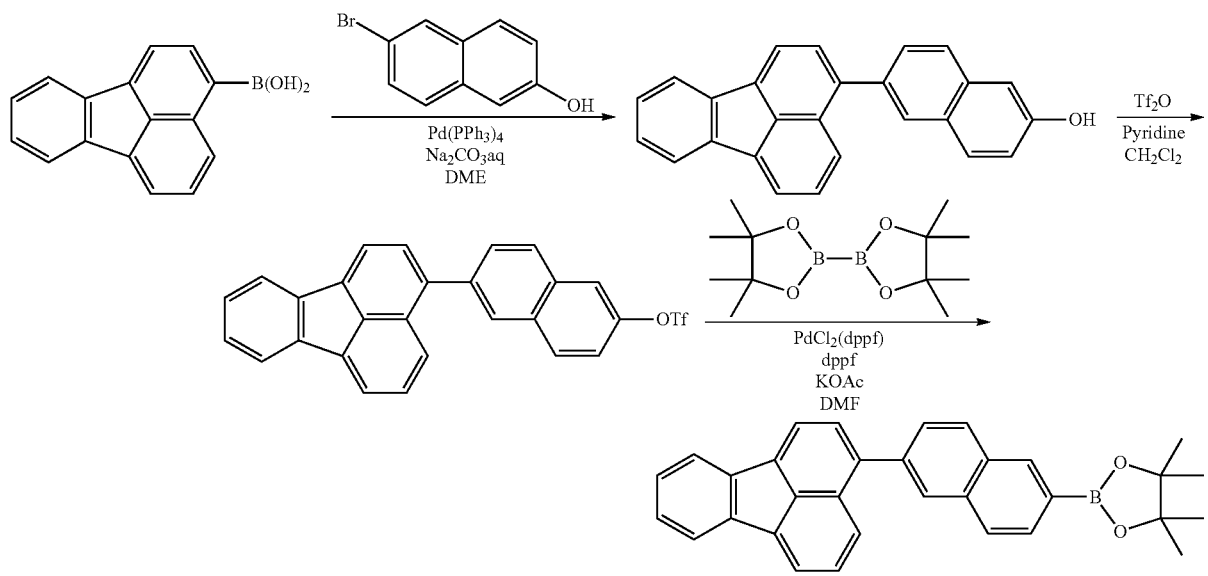

(J-1) Synthesis of 6-(fluoranthen-3-yl)-2-naphthol

A flask was charged with 2.7 g of fluoranthene-3-boronic acid, 2.0 g of 6-bromo-2-naphthol, 0.31 g of tetrakis(triphenylphosphine)palladium(0), 27 mL of 1,2-dimethoxyethane, and 13.5 mL of a 2 M sodium carbonate aqueous solution in an argon atmosphere. The mixture was heat refluxed with stirring for 4 hours. After cooling the reaction solution to room temperature, 2 M hydrochloric acid was added to the reaction solution so that the reaction solution had a pH in the acidic region. The reaction solution was then extracted with dichloromethane. After removing the aqueous phase, the organic phase was washed with a saturated sodium chloride solution, and dried over anhydrous sodium sulfate. After filtering the organic phase, the solvent was evaporated under reduced pressure. The residue was dispersed and washed in dichloromethane to obtain 2.75 g of the target 6-(fluoranthen-3-yl)-2-naphthol (yield: 89%).

(J-2) Synthesis of 6-(fluoranthen-3-yl)-2-trifluoromethanesulfoxynaphthalene

A flask was charged with 2.75 g of 6-(fluoranthen-3-yl)-2-naphthol, 2 mL of pyridine, and 80 mL of dichloromethane in an argon atmosphere. After the dropwise addition of 2 mL of trifluoromethanesulfonic anhydride to the reaction solution under cooling with ice, the reaction solution was stirred for 20 minutes, and then stirred for 3 hours while warming the reaction solution to room temperature. After the dropwise (J-3) Synthesis of 6-(fluoranthen-3-yl)naphthalen-2-ylboronic acid pinacol ester A flask was charged with 3.11 g of 6-(fluoranthen-3-yl)-2-trifluoromethanesulfoxynaphthalene, 1.83 g of bispinacolatediboron, 0.27 g of a [1,1'-bis(diphenylphosphino)ferrocene]palladium(II) dichloride dichloromethane adduct, 0.18 g of 1,1'-bis(diphenylphosphino)ferrocene, 1.93 g of potassium acetate, and 65 mL of dimethylformamide in an argon atmosphere. The mixture was stirred at 80° C. for 8 hours. After cooling the reaction solution to room temperature, water was added to the reaction solution. The mixture was then extracted with toluene. The resulting toluene solution was passed through a silica gel short column, and the solvent was evaporated from the eluate under reduced pressure. The residue was recrystallized from toluene to obtain 1.53 g of the target 6-(fluoranthen-3-yl)naphthalen-2-ylboronic acid pinacol ester (yield: 52%).

Synthesis Example 11

Synthesis of ETB6

A flask was charged with 3.0 g of benzo[c]phenanthrene-5-boronic acid, 3.5 g of 1-(4-bromophenyl)-2-phenyl-1H-benzimidazole, 0.231 g of tetrakis(triphenylphosphine)palladium(0), 40 mL of dimethoxyethane, and 20 mL of a 2 M sodium carbonate aqueous solution in an argon atmosphere.

The mixture was heat refluxed with stirring for 8 hours. After cooling the reaction solution to room temperature, the reaction solution was extracted with toluene. After removing the aqueous phase, the organic phase was washed with water, and dried over magnesium sulfate. After filtering the organic phase, the solvent was evaporated under reduced pressure. The residue was purified by silica gel column chromatography to obtain 3.8 g of a light yellow solid. As a result of mass spectrum analysis, it was found that the resulting compound was the following compound (ETB6). The compound had a molecular weight of 496.19 (m/e=496).

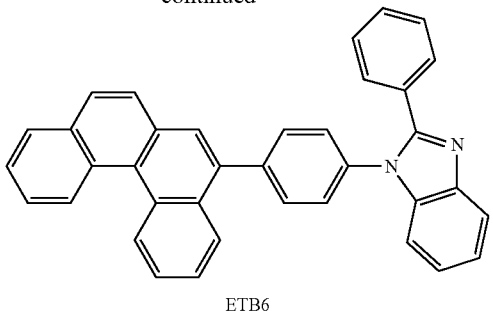

ETB6

Synthesis Example 12

Synthesis of ETB9

A flask was charged with 2.7 g of 6-(fluoranthen-3-yl)naphthalen-2-ylboronic acid pinacol ester synthesized in Synthesis Example 9, 3.5 g of 1-(3-bromophenyl)-2-phenyl-1H-benzimidazole synthesized in Synthesis Example 4, 0.231 g of tetrakis(triphenylphosphine)palladium(0), 40 mL of dimethoxyethane, and 20 mL of a 2 M sodium carbonate aqueous solution in an argon atmosphere. The mixture was heat refluxed with stirring for 8 hours. After cooling the reaction solution to room temperature, the reaction solution was extracted with toluene. After removing the aqueous phase, the organic phase was washed with water, and dried over magnesium sulfate. After filtering the organic phase, the solvent was evaporated under reduced pressure. The residue was purified by silica gel column chromatography to obtain 3.4 g of a light yellow solid. As a result of mass spectrum analysis, it was found that the resulting compound was the following compound (ETB9). The compound had a molecular weight of 596.23 (m/e=596).

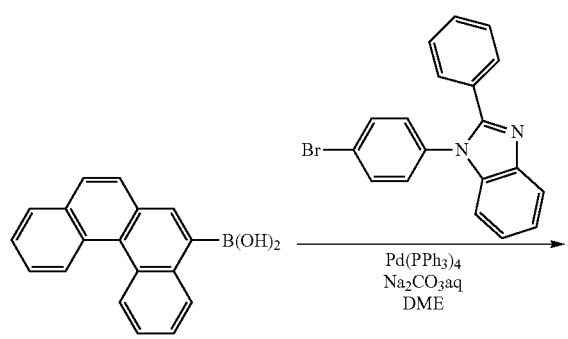

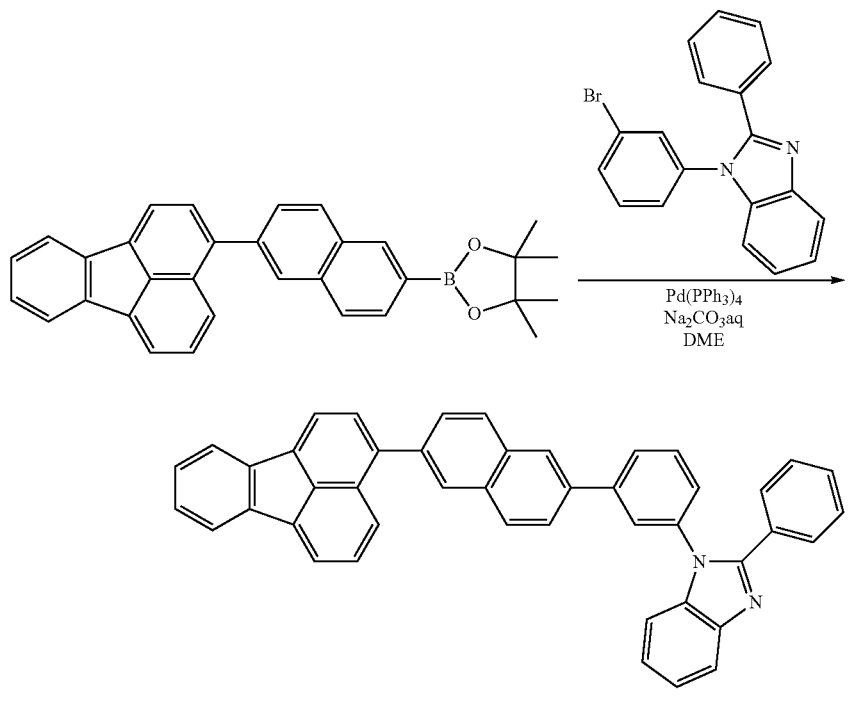

ETB9

Synthesis Example 13

Synthesis of ETB12

A compound was synthesized in the same manner as in Synthesis Example 12, except that 3-(fluoranthen-3-yl)phenylboronic acid synthesized in Synthesis Example 8 was used instead of 6-(fluoranthen-3-yl)naphthalen-2-ylboronic acid pinacol ester. As a result of mass spectrum analysis, it was found that the resulting compound was the following compound (ETB12). The compound had a molecular weight of 546.21 (m/e=546).

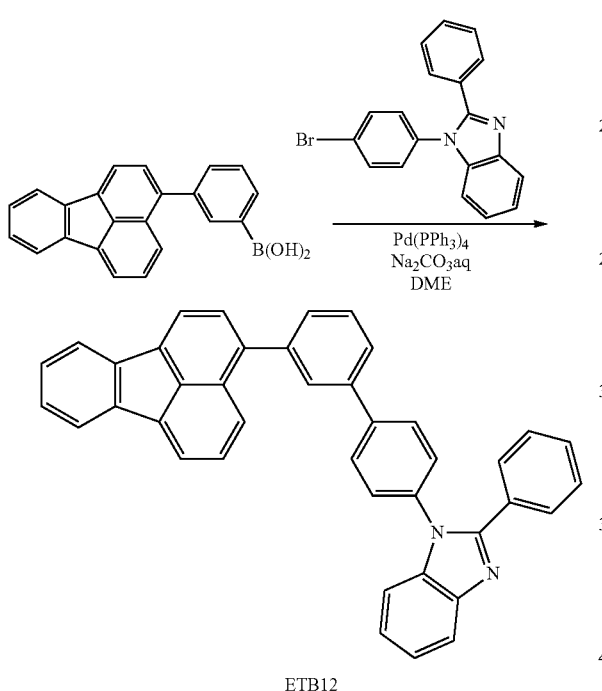

ETB12

Synthesis Example 14

(E) Synthesis of 5-bromo-1-methyl-2-phenyl-1H-benzimidazole

5-Bromo-1-methyl-2-phenyl-1H-benzimidazole was synthesized in accordance with the following synthesis scheme.

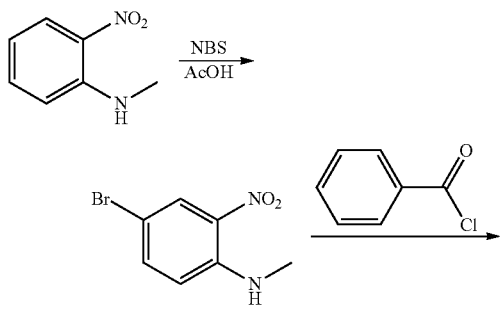

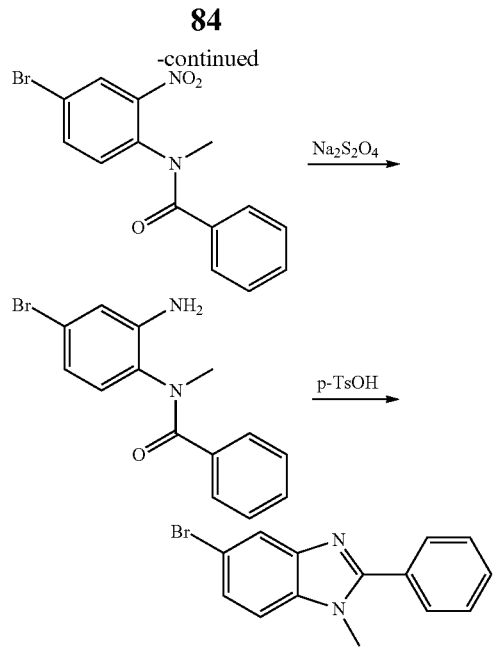

(E-1) Synthesis of 4-bromo-N-methyl-2-nitroaniline 60 mL of acetic acid was added to 5.0 g (33 mmol) of N-methyl-2-nitroaniline and 5.9 g (33 mmol) of N-bromosuccinimide. The mixture was heat refluxed for 7 hours. After completion of the reaction, the reaction solution was poured into 500 mL of water, and a solid that precipitated by this operation was collected by filtration. The solid was dissolved in ethyl acetate, and dried over magnesium sulfate. After filtering the solution, the solvent was evaporated under reduced pressure. The residue was dried at room temperature under reduced pressure to obtain 7.1 g of 4-bromo-N-methyl-2-nitroaniline as an orange solid (yield: 93%).

(E-2) Synthesis of 4'-bromo-N-methyl-2'-nitrobenzanilide 6.8 g (29 mmol) of 4-bromo-N-methyl-2-nitroaniline was dissolved in 20 mL of pyridine. After the addition of 5.0 g (35 mmol) of benzoyl chloride, the mixture was stirred at 90° C. for 7 hours in an argon atmosphere. After completion of the reaction, 200 mL of ethyl acetate was added to the reaction solution. The organic phase was washed with a 10% hydrochloric acid aqueous solution, a 10% potassium carbonate aqueous solution, and a saturated sodium chloride solution, and dried over magnesium sulfate. After filtering the organic phase, the solvent was evaporated under reduced pressure. The residue was purified by silica gel column chromatography to obtain 9.5 g of 4'-bromo-N-methyl-2'-nitrobenzanilide as a green-white solid (yield: 96%).

(E-3) Synthesis of 4'-bromo-N-methyl-2'-aminobenzanilide 9.5 g (28 mmol) of 4'-bromo-N-methyl-2'-nitrobenzanilide was dissolved in 100 mL of tetrahydrofuran. A solution of 25 g (142 mmol) of sodium hydrosulfite in 90 mL of water was added to the solution while stirring the solution at room temperature in an argon atmosphere. After the addition of 10 mL of methanol, the mixture was stirred for 3 hours. After the addition of 100 mL of ethyl acetate, a solution of 12 g (142 mmol) of sodium hydrogencarbonate in 125 mL of water was added to the mixture. After stirring the mixture at room temperature for 1 hour, the mixture was extracted with ethyl acetate. After removing the aqueous phase, the organic phase was washed with a 10% potassium carbonate aqueous solution and a saturated sodium chloride solution, and dried over magnesium sulfate. After filtering the organic phase, the solvent was evaporated under reduced pressure to obtain 7.8 g of 4'-bromo-N-methyl-2'-aminobenzanilide as a white solid (yield: 90%).

(E-4) Synthesis of 5-bromo-1-methyl-2-phenyl-1H-benzimidazole 7.8 g (26 mmol) of 4'-bromo-N-methyl-2'-aminobenzanilide was suspended in 50 mL of xylene. After the addition of 1.5 g (7.7 mmol) of p-toluenesulfonic acid monohydrate, the mixture was heat refluxed for 7 hours. After completion of the reaction, the mixture was filtered. The resulting solid was dissolved in methylene chloride, washed with a 10% potassium carbonate aqueous solution and a saturated sodium chloride solution, and dried over magnesium sulfate. The solvent was then evaporated under reduced pressure. An organic substance was also collected from the filtrate by the same washing method. The solid and the organic substance were purified by silica gel column chromatography to obtain 6.5 g of 5-bromo-1-methyl-2-phenyl-1H-benzimidazole as a white crystal (yield: 89%).

Synthesis Example 15

Synthesis of ETB13

A compound was synthesized in the same manner as in Synthesis Example 12, except that 3-(fluoranthen-3-yl)phenylboronic acid synthesized in Synthesis Example 8 was used instead of 6-(fluoranthen-3-yl)naphthalen-2-ylboronic acid pinacol ester, and 5-bromo-1-methyl-2-phenyl-1H-benzimidazole synthesized in Synthesis Example 14 was used instead of 1-(3-bromophenyl)-2-phenyl-1H-benzimidazole. As a result of mass spectrum analysis, it was found that the resulting compound was the following compound (ETB13). The compound had a molecular weight of 484.19 (m/e=484).

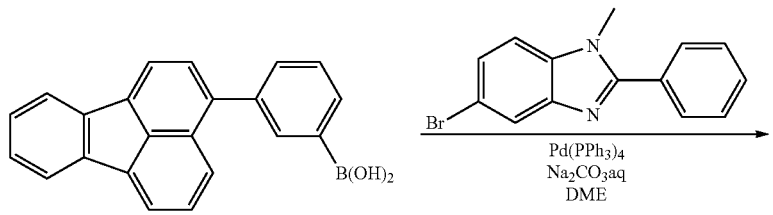

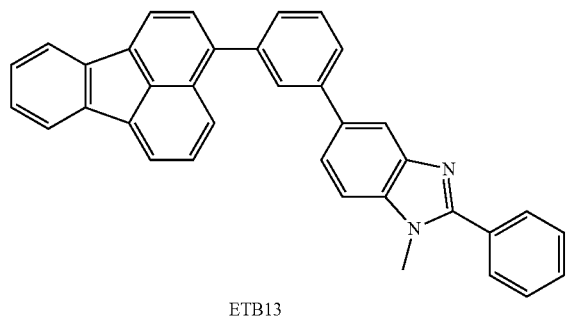

ETB13

Synthesis Example 16

Synthesis of ETB14

A compound was synthesized in the same manner as in Synthesis Example 11, except that benzo[g]chrysene-10-boronic acid was used instead of benzo[c]phenanthrene-5-boronic acid, and 6-bromo-2,2'-bipyridyl was used instead of 1-(4-bromophenyl)-2-phenyl-1H-benzimidazole.

As a result of mass spectrum analysis, it was found that the resulting compound was the following compound (ETB14). The compound had a molecular weight of 432.16 (m/e=432).

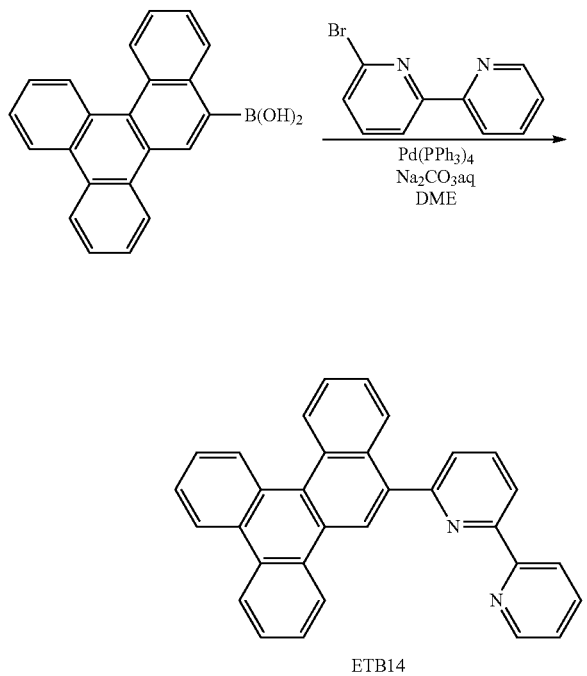

ETB14

Example 1

The following materials were sequentially deposited on a substrate on which an indium tin oxide (ITO) film (thickness: 130 nm) was formed. A device was thus obtained. The value in parentheses indicates the thickness (unit: nm).
Anode: ITO (130)
Hole-injecting layer: HT1 (50)
Hole-transporting layer: HT2 (45)
Emitting layer: BH1 and BD1 (BD1: 5% doped) (25)
Barrier layer: ETB1 (25)
Small-work-function metal-containing layer: LiF (1)
Cathode: Al (80)

Examples 2 to 8 and Comparative Examples 1 and 2

A device was obtained in the same manner as in Example 1, except that the host material for the emitting layer and the material for the barrier layer were changed as shown in Table 2.

Evaluation Example

The devices obtained in Examples 1 to 8 and Comparative Examples 1 and 2 were evaluated as described below. The results are shown in Table 2.

(1) Initial Performance (Voltage, Chromaticity, Current Efficiency, External Quantum Efficiency, and Main Peak Wavelength)

A voltage was applied to the device, and a voltage at which the current was 10 mA/cm² was measured. The EL emission spectrum was also measured using a spectroradiometer ("CS-1000" manufactured by Konica Minolta). The chromaticity, the current efficiency (L/J) (cd/A), the external quantum efficiency (EQE) (%), and the main peak wavelength (nm) were calculated from the resulting spectral radiance spectrum.

When measuring the external quantum efficiency, a current was caused to flow through the organic EL device at a current density of 10 mA/cm², and the emission spectrum was measured using a spectroradiometer ("CS-1000" manufactured by Konica Minolta). The external quantum efficiency was calculated by the following expression.

$$E.Q.E. = \frac{N_P}{N_E} \times 100$$

$$= \frac{\frac{(\pi/10^9)\int \phi(\lambda) \cdot d\lambda}{hc}}{\frac{J/10}{e}} \times 100$$

$$= \frac{\frac{(\pi/10^9)\Sigma(\phi(\lambda) \cdot (\lambda))}{hc}}{\frac{J/10}{e}} \times 100(\%)$$

$N_P$: Number of photons
$N_E$: Number of electrons
$\pi$: Circular ratio=3.1416
$\lambda$: Wavelength (nm)
$\phi$: Luminous intensity (W/sr·m²·nm)
h: Planck's constant=$6.63 \times 10^{-34}$ (J·s)
c: Speed of light=$3 \times 10^8$ (m/s)
J: Current density (mA/cm²)
e: Charge=$1.6 \times 10^{-19}$ (C)

(2) Luminescence Ratio Derived from TTF

A pulse voltage waveform output from a pulse generator (8114A, manufactured by AgilentTechnologies) which had a pulse width of 500 μs, and a frequency of 20 Hz was applied, and EL was input to a photoelectron multiplier (R928, manufactured by Hamamatsu Photonics K. K.). The pulse voltage waveform and the EL were synchronized and introduced to an oscilloscope (2440, manufactured by Tektronix Inc.) to obtain a transient EL waveform. The waveform was analyzed to determine the luminescence ratio derived from TTF (TTF ratio).

The transient EL waveform was obtained by determining a current density at which the current efficiency (L/J) was a maximum in the current density-current efficiency curve, and applying a voltage pulse waveform corresponding to the determined current density.

An increase of 62.5% in internal quantum efficiency derived from TTF is regarded as the theoretical limit. The luminescence ratio derived from TTF in this case is 60%.

TABLE 2

| | Host material | Barrier material | Voltage (V) | Chromaticity x | Chromaticity y | L/J (cd/A) | EQE (%) | TTF ratio (%) |
|---|---|---|---|---|---|---|---|---|
| Example 1 | BH1 | ETB1 | 3.6 | 0.144 | 0.117 | 9.6 | 9.3 | 33 |
| Example 2 | BH1 | ETB2 | 3.6 | 0.146 | 0.107 | 8.1 | 8.3 | 35 |
| Example 3 | BH1 | ETB3 | 3.7 | 0.145 | 0.110 | 8.0 | 8.1 | 28 |
| Example 4 | BH1 | ETB4 | 4.4 | 0.144 | 0.115 | 8.3 | 8.2 | 26 |
| Example 5 | BH2 | ETB1 | 3.7 | 0.143 | 0.116 | 9.9 | 9.7 | 34 |
| Example 6 | BH2 | ETB2 | 3.8 | 0.144 | 0.113 | 9.0 | 9.0 | 38 |
| Example 7 | BH2 | ETB3 | 3.8 | 0.144 | 0.110 | 8.5 | 8.6 | 28 |
| Example 8 | BH2 | ETB4 | 4.4 | 0.143 | 0.113 | 8.2 | 8.2 | 29 |
| Comparative Example1 | BH1 | ET1 | 3.2 | 0.144 | 0.124 | 7.2 | 6.7 | 22 |
| Comparative Example2 | BH1 | BH3 | 5.9 | 0.143 | 0.115 | 0.5 | 0.5 | 13 |

The devices obtained in Examples 1, 2 and 4, and Comparative Example 1 differed only in the barrier material for the barrier layer. The barrier material used in Comparative Example 1 did not include the triplet barrier structural part. Therefore, triplet excitons formed on the host material were easily diffused into the barrier layer (i.e., the TTF phenomenon did not efficiently occur). The devices obtained in Examples 1, 2 and 4, and Comparative Example 2 differed only in the barrier material for the barrier layer. The barrier material used in Comparative Example 2 did not include the electron-transporting structural part. Therefore, electrons were not sufficiently injected into the emitting layer from the barrier layer (i.e., recombination occurred to only a small extent in the emitting layer). As a result, the luminous efficiency deteriorated.

In Example 3, a fluoranthene compound was used as the barrier material. The device obtained in Example 3 exhibited a high luminous efficiency as compared with the device obtained in Comparative Example 2 in which a fluoranthene compound was used as the barrier material. This is because the barrier material used in Comparative Example 2 did not include the electron-transporting structural part.

Examples 5 to 8 were respectively the same as Examples 1 to 4, except that BH2 was used as the host material instead of BH1.

Examples 9 to 21

A device was obtained in the same manner as in Example 1, except that the host material and the dopant material for the emitting layer and the material for the barrier layer were changed as shown in Table 3.

Evaluation Example

The initial performance (voltage, chromaticity, current efficiency, external quantum efficiency, and main peak wavelength) and the ratio of the luminous intensity due to the TTF phenomenon were evaluated using the devices obtained in Examples 9 to 21. The results are shown in Table 3.

TABLE 3

| | Host material | Dopant material | Barrier material | Voltage (V) | Chromaticity x | Chromaticity y | L/J (cd/A) | EQE (%) | TTF ratio (%) |
|---|---|---|---|---|---|---|---|---|---|
| Example 9 | BH5 | BD1 | ETB5 | 3.7 | 0.142 | 0.125 | 9.0 | 8.4 | 29 |
| Example 10 | BH2 | BD1 | ETB7 | 3.8 | 0.141 | 0.131 | 10.0 | 9.1 | 30 |
| Example 11 | BH2 | BD1 | ETB8 | 3.6 | 0.141 | 0.130 | 10.5 | 9.6 | 32 |
| Example 12 | BH5 | BD1 | ETB9 | 3.9 | 0.142 | 0.123 | 8.6 | 8.1 | 28 |
| Example 13 | BH4 | BD1 | ETB10 | 3.5 | 0.145 | 0.121 | 10.1 | 9.5 | 24 |
| Example 14 | BH5 | BD1 | ETB12 | 3.9 | 0.143 | 0.118 | 9.0 | 8.8 | 32 |
| Example 15 | BH5 | BD1 | ETB13 | 3.8 | 0.142 | 0.124 | 10.0 | 9.4 | 31 |
| Example 16 | BH5 | BD1 | ETB14 | 4.8 | 0.143 | 0.121 | 7.6 | 7.2 | 34 |
| Example 17 | BH2 | BD2 | ETB2 | 4.0 | 0.131 | 0.136 | 10.4 | 9.5 | 31 |
| Example 18 | BH4 | BD2 | ETB2 | 3.8 | 0.133 | 0.130 | 9.8 | 9.2 | 31 |
| Example 19 | BH2 | BD2 | ETB4 | 4.4 | 0.131 | 0.134 | 9.7 | 9.0 | 28 |
| Example 20 | BH2 | BD2 | ETB6 | 4.3 | 0.128 | 0.147 | 10.6 | 9.3 | 26 |
| Example 21 | BH2 | BD2 | ETB11 | 3.9 | 0.131 | 0.129 | 9.7 | 9.3 | 26 |

As is clear from the results shown in Table 3, a high TTF ratio was obtained in Examples 9 to 11 in which ETB including benzofluoranthene, triphenylene, or benzanthracene as the triplet barrier structural part was used.

As is clear from the results for Examples 12 to 16, a high TTF ratio was also obtained when the substituent for ETB was changed.

As is clear from the results for Examples 17 to 21, a high TTF ratio was also obtained when BD2 was used as the dopant material instead of BD1.

INDUSTRIAL APPLICABILITY

The organic EL device according to the invention may be used for a large television display panel, an illumination panel, and the like for which a reduction in power consumption is desired.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in their entirety.

The invention claimed is:

1. An organic electroluminescence device comprising:
an anode, an emitting layer, an electron-transporting region, and a cathode, sequentially; wherein
the emitting layer comprises a host material and a dopant material that emits fluorescence having a main peak wavelength of 550 nm or less,
the electron-transporting region comprises a barrier layer that is adjacent to the emitting layer,
the barrier layer comprises a barrier material that comprises an electron-transporting structural portion and a triplet barrier structural portion that comprises a fused polycyclic aromatic hydrocarbon moiety,
$E^T_h$ is the triplet energy level of the host material, $E^T_b$ is the triplet energy level of the barrier material, and
$E^T_b$ and $E^T_h$ satisfy the following formula (1), $$E^T_b > E^T_h \quad (1)$$

wherein the electron-transporting structural portion comprises one or more partial structures shown by the following formula,

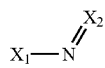

and $X_1$ and $X_2$ independently represent a carbon atom or a nitrogen atom.

2. The organic electroluminescence device of claim 1, wherein $E^T_d$ is the triplet energy level of the dopant material, and $E^T_d$ and $E^T_h$ satisfy the following formula (2), $$E^T_d > E^T_h \quad (2).$$

3. The organic electroluminescence device of claim 1, wherein an affinity of the host material is $Af_h$, an affinity of the barrier material is $Af_b$, and $Af_h$ and $Af_b$ satisfy the following formula (3), $$Af_h - Af_b > 0 \text{ eV} \quad (3).$$

4. The organic electroluminescence device of claim 1, wherein an ionization potential of the host material is $Ip_h$, an ionization potential of the dopant material is $Ip_d$, and $Ip_d$ and $Ip_h$ satisfy the following formula (4), $$Ip_d - Ip_h < 0.2 \text{ eV} \quad (4).$$

5. The organic electroluminescence device of claim 1, wherein the barrier material has an electron mobility of $10^{-6}$ cm$^2$/Vs or more.

6. The organic electroluminescence device of claim 1, wherein the barrier layer comprises a donor that reduces the barrier material.

7. The organic electroluminescence device of claim 1, wherein luminous intensity due to singlet excitons that are formed by collision between triplet excitons within the emitting layer accounts for 30% or more of total luminous intensity.

8. The organic electroluminescence device of claim 1, wherein the electron-transporting structural portion comprises one or more rings selected from rings shown by the following formulas,

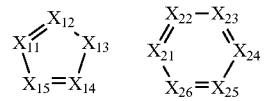

$X_{11}$ to $X_{15}$ and $X_{21}$ to $X_{26}$ independently represent a carbon atom or a nitrogen atom, at least one of $X_{11}$ to $X_{15}$ represent a nitrogen atom, and at least one of $X_{21}$ to $X_{26}$ represent a nitrogen atom.

9. The organic electroluminescence device of claim 1, wherein the electron-transporting structural portion comprises one or more rings selected from rings shown by the following formulas,

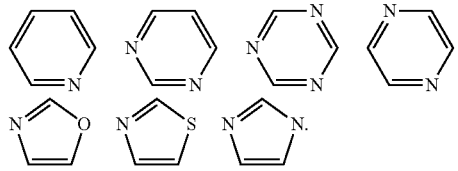

10. The organic electroluminescence device of claim 1, wherein the electron-transporting structural portion comprises one or more rings selected from rings shown by the following formulas,

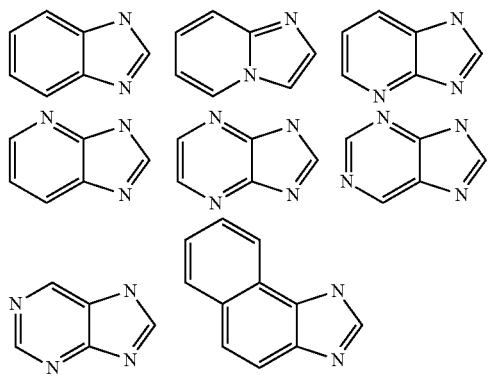

-continued

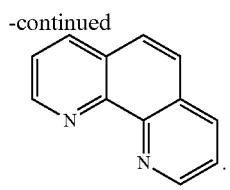

11. The organic electroluminescence device of claim 1, wherein the triplet barrier structural portion is selected from rings shown by the following formulas, (5)

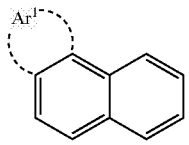

(6)

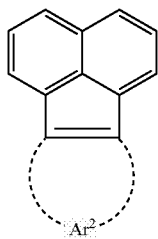

(7)

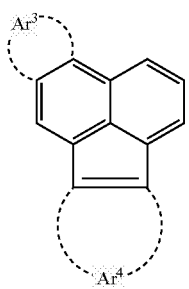

(8)

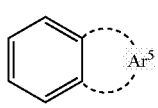

(9)

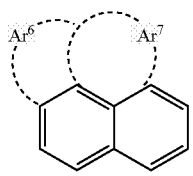

(10)

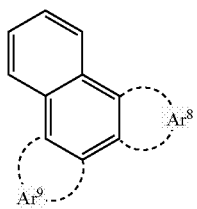

and $Ar^1$ to $Ar^9$ independently represent a hydrocarbon structure having 4 to 16 ring carbon atoms, which forms a ring fused to the adjacent ring.

12. The organic electroluminescence device of claim 1, comprising at least two emitting layers between the anode and the cathode, and further comprising a carrier-generating layer between the two emitting layers.

13. An organic electroluminescence device comprising:
an anode, a plurality of emitting layers, an electron-transporting region, and a cathode, sequentially; wherein
the organic electroluminescence device further comprises a carrier barrier layer between at least two emitting layers among the plurality of emitting layers,
an emitting layer among the plurality of emitting layers that is adjacent to the electron-transporting region comprises a host material and a dopant material that emits fluorescence having a main peak wavelength of 550 nm or less,
the electron-transporting region comprises a barrier layer that is adjacent to the emitting layer,
the barrier layer comprises a barrier material that comprises an electron-transporting structural portion and a triplet barrier structural portion that comprises a fused polycyclic aromatic hydrocarbon moiety, $E^T_h$ is the triplet energy level of the host material, $E^T_b$ is the triplet energy level of the barrier material, and $E^T_b$ and $E^T_h$ satisfy the following formula (1), $$E^T_b > E^T_h \tag{1}$$

14. The organic electroluminescence device of claim 13, wherein $E^T_d$ is the triplet energy level of the dopant material, and $E^T_d$ and $E^T_h$ satisfy the following expression (2), $$E^T_d > E^T_h \tag{2}$$

15. An organic electroluminescence device comprising:
an anode, an emitting layer, an electron-transporting region, and a cathode, sequentially; wherein
the emitting layer comprises a host material and a dopant material that emits fluorescence having a main peak wavelength of 550 nm or less,
the electron-transporting region comprises a barrier layer that is adjacent to the emitting layer,
the barrier layer comprises a barrier material that comprises an electron-transporting structural portion and a triplet barrier structural portion that comprises a fused polycyclic aromatic hydrocarbon moiety,
$E^T_h$ is the triplet energy level of the host material, $E^T_b$ is the triplet energy level of the barrier material, and $E^T_b$ and $E^T_h$ satisfy the following formula (1), $$E^T_b > E^T_h \tag{1}$$

wherein an affinity of the host material is $Af_h$, an affinity of the barrier material is $Af_b$, and $Af_h$ and $Af_b$ satisfy the following formula (3), $$Af_h - Af_b > 0 \ eV \tag{3}$$

16. An organic electroluminescence device comprising:
an anode, an emitting layer, an electron-transporting region, and a cathode, sequentially; wherein
the emitting layer comprises a host material and a dopant material that emits fluorescence having a main peak wavelength of 550 nm or less,
the electron-transporting region comprises a barrier layer that is adjacent to the emitting layer,
the barrier layer comprises a barrier material that comprises an electron-transporting structural portion and a triplet barrier structural portion that comprises a fused polycyclic aromatic hydrocarbon moiety,
$E^T_h$ is the triplet energy level of the host material, $E^T_b$ is the triplet energy level of the barrier material, and
$E^T_b$ and $E^T_h$ satisfy the following formula (1), $$E^T_b > E^T_h \tag{1}$$

wherein an ionization potential of the host material is $Ip_h$, an ionization potential of the dopant material is $Ip_d$, and $Ip_d$ and $Ip_h$ satisfy the following formula (4), $$Ip_d - Ip_h < 0.2 \ eV \tag{4}$$

* * * * *